US011098229B2

(12) United States Patent
Ueda et al.

(10) Patent No.: US 11,098,229 B2
(45) Date of Patent: *Aug. 24, 2021

(54) RESIN COMPOSITION AND USE THEREOF

(71) Applicant: Sumitomo Chemical Company, Limited, Tokyo (JP)

(72) Inventors: Kohei Ueda, Ichihara (JP); Koji Ishiwata, Osaka (JP); Yasutoyo Kawashima, Osaka (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/320,265

(22) PCT Filed: Jul. 27, 2017

(86) PCT No.: PCT/JP2017/027223
§ 371 (c)(1),
(2) Date: Jan. 24, 2019

(87) PCT Pub. No.: WO2018/021467
PCT Pub. Date: Feb. 1, 2018

(65) Prior Publication Data
US 2019/0270923 A1  Sep. 5, 2019

(30) Foreign Application Priority Data

Jul. 29, 2016  (JP) .................. JP2016-150490

(51) Int. Cl.
*C09K 5/06* (2006.01)
*C08L 23/08* (2006.01)
*C08L 101/12* (2006.01)
*C08K 5/00* (2006.01)

(52) U.S. Cl.
CPC .......... *C09K 5/063* (2013.01); *C08K 5/00* (2013.01); *C08L 23/0869* (2013.01); *C08L 101/12* (2013.01); *C08L 2203/14* (2013.01); *C08L 2207/32* (2013.01)

(58) Field of Classification Search
CPC .. C09K 5/06; C09K 5/063; C08K 5/00; C08L 23/08; C08L 23/0815; C08L 23/083
USPC ......................................................... 252/79
See application file for complete search history.

(56) References Cited

U.S. PATENT DOCUMENTS

| | | | | | |
|---|---|---|---|---|---|
| 4,711,813 A | * | 12/1987 | Salyer | ............ | C08K 5/01 252/70 |
| 4,964,402 A | * | 10/1990 | Grim | ............ | A61F 5/0111 602/2 |
| 5,053,446 A | * | 10/1991 | Salyer | ............ | C08L 23/06 524/8 |
| 8,587,945 B1 | | 11/2013 | Hartmann et al. | | |
| 2005/0038160 A1 | * | 2/2005 | Hall | ............ | C08K 7/22 524/300 |
| 2006/0155088 A1 | * | 7/2006 | Konishi | ............ | H01C 7/028 526/335 |
| 2006/0199872 A1 | * | 9/2006 | Prieto | ............ | C08J 9/00 521/142 |
| 2008/0319126 A1 | * | 12/2008 | Fell | ............ | C09K 5/063 524/584 |
| 2010/0036024 A1 | * | 2/2010 | Menning | ............ | C08J 9/28 524/43 |
| 2012/0261607 A1 | | 10/2012 | Shimakage et al. | | |
| 2014/0043754 A1 | | 2/2014 | Hartmann et al. | | |
| 2017/0121516 A1 | | 5/2017 | Kawashima et al. | | |
| 2018/0030175 A1 | | 2/2018 | Miura et al. | | |

FOREIGN PATENT DOCUMENTS

| | | |
|---|---|---|
| CN | 105050805 A | 11/2015 |
| JP | 2004137301 A | 5/2004 |
| JP | 2014122320 A | 7/2014 |
| JP | 2014152239 A | 8/2014 |
| JP | 2015091903 A | 5/2015 |
| JP | 2016102139 A | 6/2016 |
| JP | 2017095529 A | 6/2017 |
| WO | 2011078340 A1 | 6/2011 |
| WO | 2015/156416 A1 | 10/2015 |
| WO | 2016098674 A1 | 6/2016 |

OTHER PUBLICATIONS

Int'l Preliminary Report on Patentability dated Feb. 7, 2019 in Int'l Application No. PCT/JP2017/027223.
Extended European Search Report dated Jan. 28, 2020 in EP Application No. 17834469.3.
Office Action dated Oct. 20, 2020 in CN Application No. 201780046101.4.
Office Action dated Jul. 28, 2020 in IN Application No. 201947003334.
Office Action dated Mar. 9, 2021 in IN Application No. 201947003334.
Office Action dated Apr. 20, 2021 in JP Application No. 2018530384.
Office Action dated Jun. 10, 2021 in Chinese Application No. 201780046101.4.

* cited by examiner

*Primary Examiner* — Jane L Stanley
(74) *Attorney, Agent, or Firm* — Panitch Schwarze Belisario & Nadel LLP

(57) ABSTRACT

A resin composition contains a polymer whose enthalpy of fusion (ΔH) observed within a temperature range of 10° C. or higher and lower than 60° C. in differential scanning calorimetry is 30 J/g or more; and a low-molecular-weight compound whose enthalpy of fusion (ΔH) observed within a temperature range of 0° C. or higher and lower than 100° C. in differential scanning calorimetry is 30 J/g or more and whose molecular weight is 2000 or lower. A content of the low-molecular-weight compound is 3 parts by weight to 1000 parts by weight with respect to 100 parts by weight of the total amount of polymer components contained in the resin composition except the low-molecular-weight compound.

11 Claims, No Drawings

RESIN COMPOSITION AND USE THEREOF

CROSS-REFERENCE TO RELATED APPLICATION

This application is a Section 371 of International Application No. PCT/JP2017/027223, filed Jul. 27, 2017, which was published in the Japanese language on Feb. 1, 2018 under International Publication No. WO 2018/021467 A1, and claims priority under 35 U.S.C. § 119(b) to Japanese Application No. 2016-150490, filed Jul. 29, 2016, the disclosures of which are incorporated herein by reference in their entirety.

TECHNICAL FIELD

The present invention relates to a resin composition and a use thereof.

BACKGROUND ART

While paraffins and fatty acid esters are used as low-molecular-weight heat storage materials utilizing latent heat due to phase change, such compounds suffer from difficulty in shape retention at temperatures equal to or higher than the melting point.

As a heat storage material containing a paraffin and an elastomer to overcome the difficulty, Patent Literature 1 describes a heat storage material composition containing a hydrogenated conjugated diene copolymer and a paraffin compound.

CITATION LIST

Patent Literature

Patent Literature 1: International Publication No. WO 2011/078340

SUMMARY OF INVENTION

Technical Problem

Although the heat storage material composition containing a hydrogenated conjugated diene copolymer and a paraffin compound allows shape retention at temperatures equal to or higher than the melting point of the low-molecular-weight heat storage material, however, the heat storage material composition suffers from a disadvantage that the heat storage by the paraffin compound as the low-molecular-weight heat storage material, is smaller and in addition the crystallization rate is lower because of mixing with the hydrogenated conjugated diene copolymer. Further, the fact that low-molecular-weight heat storage materials undergo phase transition in a narrow temperature range restricts the temperature range allowing development of an effect to suppress the temperature change of the composition and as a result increase the heat storage. Furthermore, the viscosity is high in a low-shear region, and thus the formability is insufficient. The present invention was made in view of the problem, and provides: a resin composition having high heat storage, a broad temperature range allowing development of heat storage effect, and superior formability; and use thereof.

Solution to Problem

To solve the above problem, the present invention provides the followings.

[1] A resin composition comprising:
a polymer (1) whose enthalpy of fusion (ΔH) observed within a temperature range of 10° C. or higher and lower than 60° C. in differential scanning calorimetry is 30 J/g or more; and
a low-molecular-weight compound (3) whose enthalpy of fusion (ΔH) observed within a temperature range of 0° C. or higher and lower than 100° C. in differential scanning calorimetry is 30 J/g or more and whose molecular weight is 2000 or lower, wherein
a content of the low-molecular-weight compound (3) is 3 parts by weight or more and 1000 parts by weight or less, with respect to 100 parts by weight of the total amount of polymer components contained in the resin composition except the low-molecular-weight compound (3) which is a polymer.

[2] The resin composition according to [1], further comprising a polymer (2) whose melting peak temperature or glass transition temperature observed in differential scanning calorimetry is 50° C. or higher and 180° C. or lower, provided that the polymer (2) is different from the polymer (1), wherein
a content of the polymer (1) is 30 wt % or more and 99 wt % or less and a content of the polymer (2) is 1 wt % or more and 70 wt % or less, with respect to 100 wt % of the total amount of the polymer (1) and the polymer (2).

[3] The resin composition according to [1] or [2], wherein the polymer (1) is a polymer comprising a constitutional unit (B) represented by the following formula (1):

formula (1)

wherein
R represents a hydrogen atom or a methyl group;
$L^1$ represents a single bond, —CO—O—, —O—CO—, or —O—;
$L^2$ represents a single bond, —CH$_2$—, —CH$_2$—CH$_2$—, —CH$_2$—CH$_2$—CH$_2$—, —CH$_2$—CH(OH)—CH$_2$—, or —CH$_2$—CH(CH$_2$OH)—;
$L^3$ represents a single bond, —CO—O—, —O—CO—, —O—, —CO—NH—, —NH—CO—, —CO—NH—CO—, —NH—CO—NH—, —NH—, or —N(CH$_3$)—;
$L^6$ represents an alkyl group having 14 or more and 30 or less carbons; and
a left side and a right side of each of the horizontal chemical formulas for describing chemical structures of $L^1$, $L^2$, and $L^3$ correspond to an upper side of the formula (1) and a lower side of the formula (1), respectively.

[4] The resin composition according to any one of [1] to [3], wherein
the polymer (1) comprises a constitutional unit (A) derived from ethylene and a constitutional unit (B) represented by the following formula (1), and optionally comprises at least one constitutional unit (C) selected from the group consisting of a constitutional unit represented by the following formula (2) and a constitutional unit represented by the following formula (3);

a proportion of the number of the constitutional unit (A) is 70% or more and 99% or less and a proportion of the number of the constitutional unit (B) and the constitutional unit (C) in total is 1% or more and 30% or less, with respect to 100% of the total number of the constitutional unit (A), the constitutional unit (B) and the constitutional unit (C); and a proportion of the number of the constitutional unit (B) is 1% or more and 100% or less and a proportion of the number of the constitutional unit (C) is 0% or more and 99% or less, with respect to 100% of the total number of the constitutional unit (B) and the constitutional unit (C):

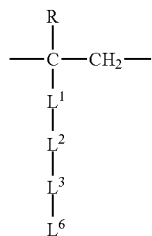

formula (1)

wherein

R represents a hydrogen atom or a methyl group;

$L^1$ represents a single bond, —CO—O—, —O—CO—, or —O—;

$L^2$ represents a single bond, —$CH_2$—, —$CH_2$—$CH_2$—, —$CH_2$—$CH_2$—$CH_2$—, —$CH_2$—CH(OH)—$CH_2$—, or —$CH_2$—CH($CH_2$OH)—;

$L^3$ represents a single bond, —CO—O—, —O—CO—, —O—, —CO—NH—, —NH—CO—, —CO—NH—CO—, —NH—CO—NH—, —NH—, or —N($CH_3$)—;

$L^6$ represents an alkyl group having 14 or more and 30 or less carbon atoms; and a left side and a right side of each of the horizontal chemical formulas for describing chemical structures of $L^1$, $L^2$, and $L^3$ correspond to an upper side of the formula (1) and a lower side of the formula (1), respectively,

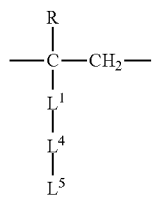

formula (2)

wherein

R represents a hydrogen atom or a methyl group;

$L^1$ represents a single bond, —CO—O—, —O—CO—, or —O—;

$L^4$ represents an alkylene group having one or more and eight or less carbon atoms;

$L^5$ represents a hydrogen atom, an epoxy group, —CH(OH)—$CH_2$OH, a carboxy group, a hydroxy group, an amino group, or an alkylamino group having one or more and four or less carbon atoms; and a left side and a right side of each of the horizontal chemical formulas for describing a chemical structure of $L^1$ correspond to an upper side of the formula (2) and a lower side of the formula (2), respectively,

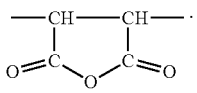

formula (3)

[5] The resin composition according to any one of [1] to [4], wherein the polymer (1) is a polymer comprising the constitutional unit (A) and the constitutional unit (B), and optionally comprising the constitutional unit (C), and a proportion of the number of the constitutional unit (A), the constitutional unit (B) and the constitutional unit (C) in total is 90% or more, with respect to 100% of the total number of all constitutional units contained in the polymer.

[6] The resin composition according to any one of [1] to [5], wherein a ratio defined for the polymer (1) as the following formula (I), A, is 0.95 or lower:

$$A = \alpha_1/\alpha_0 \qquad (I)$$

wherein $\alpha_1$ represents a value obtained by using a method comprising: measuring an absolute molecular weight and an intrinsic viscosity of a polymer by using gel permeation chromatography with an apparatus equipped with a light scattering detector and a viscosity detector, plotting measurements in such a manner that logarithms of the absolute molecular weight are plotted on an abscissa and logarithms of the intrinsic viscosity are plotted on an ordinate; and performing least squares approximation for the logarithms of the absolute molecular weight and the logarithms of the intrinsic viscosity by using the formula (I-I) within a range of not less than a logarithm of a weight-average molecular weight of the polymer and not more than a logarithm of a z-average molecular weight of the polymer along the abscissa to derive a slope of a line representing the formula (I-I) as $\alpha_1$:

$$\log[\eta_1] = \alpha_1 \log M_1 + \log K_1 \qquad (I\text{-}I)$$

wherein $[\eta_1]$ represents an intrinsic viscosity (unit: dl/g) of the polymer, $M_1$ represents an absolute molecular weight of the polymer, and $K_1$ represents a constant; and $\alpha_0$ represents a value obtained by using a method comprising: measuring an absolute molecular weight and an intrinsic viscosity of Polyethylene Standard Reference Material 1475a produced by National Institute of Standards and Technology by using gel permeation chromatography with an apparatus equipped with a light scattering detector and a viscosity detector, plotting measurements in such a manner that logarithms of the absolute molecular weight are plotted on an abscissa and logarithms of the intrinsic viscosity are plotted on an ordinate; and performing least squares approximation for the logarithms of the absolute molecular weight and the logarithms of the intrinsic viscosity by using the formula (I-II) within a range of not less than a logarithm of a weight-average molecular weight of the Polyethylene Standard Reference Material 1475a and not more than a logarithm of a z-average molecular weight of the Polyethylene Standard Reference Material 1475a along the abscissa to derive a slope of a line representing the formula (I-II) as $\alpha_0$:

$$\log[\eta_0] = \alpha_0 \log M_0 + \log K_0 \qquad (I\text{-}II)$$

wherein $[\eta_0]$ represents an intrinsic viscosity (unit: dl/g) of the Polyethylene Standard Reference Material 1475a, $M_0$ represents an absolute molecular weight of the Polyethylene Standard Reference Material 1475a, and $K_0$ represents a constant, provided that in the measurement of the absolute molecular weight and the intrinsic viscosity of each of the polymer and the Polyethylene Standard Reference Material 1475a by using gel permeation chromatography analysis, a mobile phase is ortho-dichlorobenzene and the measurement temperature is 155° C.

[7] The resin composition according to any one of [1] to [6], wherein the polymer (1) is a crosslinked polymer.

[8] The resin composition according to [7], wherein a gel fraction of the crosslinked polymer is 20 wt % or more.

[9] The resin composition according to any one of [1] to [8], wherein the low-molecular-weight compound (3) contains an alkyl group having 14 or more and 30 or less carbon atoms.

[10] A molded article comprising the resin composition according to any one of [1] to [9].

[11] A foam comprising the resin composition according to any one of [1] to [9].

Advantageous Effects of Invention

The present invention can provide a resin composition having high heat storage, a broad temperature range allowing development of heat storage effect, and superior formability.

DESCRIPTION OF EMBODIMENTS

[Resin Composition]

The resin composition according to the present invention is a resin composition comprising: a polymer (1) having enthalpy of fusion (ΔH) of 30 J/g or more observed in a temperature range of 10° C. or higher and lower than 60° C. in differential scanning calorimetry; and a low-molecular-weight compound (3) having enthalpy of fusion (ΔH) of 30 J/g or more observed in a temperature range of 0° C. or higher and lower than 100° C. in differential scanning calorimetry and having a molecular weight of 2000 or lower, wherein the content of the low-molecular-weight compound (3) is 3 parts by weight or more and 1000 parts by weight or less with respect to 100 parts by weight of the total amount of polymer components contained in the resin composition except the low-molecular-weight compound (3) as a polymer.

<Polymer (1)>

The polymer (1) is a polymer having enthalpy of fusion (ΔH) of 30 J/g or more observed in a temperature range of 10° C. or higher and lower than 60° C. in differential scanning calorimetry. The ΔH observed in a temperature range of 10° C. or higher and lower than 60° C. is preferably 50 J/g or more, more preferably 60 J/g or more, and even more preferably 70 J/g or more. The ΔH is typically 200 J/g or less.

The term "enthalpy of fusion" as used herein refers to heat of fusion obtained through analysis of a part in a temperature range of 10° C. or higher and lower than 60° C. in a melting curve acquired in differential scanning calorimetry as in the following by using a method in accordance with JIS K7122-1987. The ΔH can be controlled in the above range, for example, through adjustment of the proportion of the number of a constitutional unit (B) described later in the polymer (1) and the number of carbon atoms of $L^6$ in a formula (1) described later for a constitutional unit (B) described later.

[Method of Differential Scanning Calorimetry]

In a differential scanning calorimeter under nitrogen atmosphere, an aluminum pan encapsulating approximately 5 mg of a sample therein is (1) retained at 150° C. for 5 minutes, and then (2) cooled from 150° C. to −50° C. at a rate of 5° C./min, and then (3) retained at −50° C. for 5 minutes, and then (4) warmed from −50° C. to 150° C. at a rate of 5° C./min. A differential scanning calorimetry curve acquired in the calorimetry of the process (4) is defined as a melting curve.

The melting peak temperature of the polymer (1) is preferably in the range of 10° C. or higher and lower than 60° C., more preferably in the range of 10° C. or higher and lower than 40° C., and even more preferably in the range of 10° C. or higher and lower than 30° C.

Herein, "melting peak temperature" is a temperature at a melting peak top determined through analysis of a melting curve acquired in the above method of differential scanning calorimetry by using a method in accordance with JIS K7121-1987, and a temperature at which heat of fusion absorbed is maximized. In the case that a plurality of melting peaks as defined in JIS K7121-1987 is present in the melting curve, a temperature at a melting peak top with the maximum heat of fusion absorbed is defined as melting peak temperature.

The melting peak temperature of the polymer (1) can be adjusted through adjustment of the proportion of the number of a constitutional unit (B) described later in the polymer (1) and the number of carbon atoms of $L^6$ in a formula (1) described later for a constitutional unit (B) described later. Thereby, the heat storage performance and so forth of the resin composition containing the polymer (1) can be adjusted.

Examples of the polymer (1) include, as one mode, a polymer including a constitutional unit including an alkyl group having 14 or more and 30 or less carbon atoms.

It is preferable that the polymer (1) be a polymer including a constitutional unit (B) represented by the following formula (1).

formula (1)

In the formula (1),

R represents a hydrogen atom or a methyl group;

$L^1$ represents a single bond, —CO—O—, —O—CO—, or —O—;

$L^2$ represents a single bond, —CH$_2$—, —CH$_2$—CH$_2$—, —CH$_2$—CH$_2$—CH$_2$—, —CH$_2$—CH(OH)—CH$_2$—, or —CH$_2$—CH(CH$_2$OH)—;

$L^3$ represents a single bond, —CO—O—, —O—CO—, —O—, —CO—NH—, —NH—CO—, —CO—NH—CO—, —NH—CO—NH—, —NH—, or —N(CH$_3$)—;

$L^6$ represents an alkyl group having 14 or more and 30 or less carbon atoms; and the left side and right side of each of the horizontal chemical formulas of $L^1$, $L^2$, and $L^3$ correspond to the upper side of the formula (1) and the lower side of the formula (1), respectively.

R is preferably a hydrogen atom.

$L^1$ is preferably —CO—O—, —O—CO—, or —O—, more preferably —CO—O— or —O—CO—, and even more preferably —CO—O—.

$L^2$ is preferably a single bond, —CH$_2$—, —CH$_2$—CH$_2$—, or —CH$_2$—CH$_2$—CH$_2$—, and more preferably a single bond.

$L^3$ is preferably a single bond, —O—CO—, —O—, —NH—, or —N(CH$_3$)—, and more preferably a single bond.

$L^6$ in the formula (1) is an alkyl group having 14 or more and 30 or less carbon atoms for imparting good formability to the polymer (1) and the resin composition containing the polymer (1). Examples of the alkyl group having 14 or more and 30 or less carbon atoms include linear alkyl groups having 14 or more and 30 or less carbon atoms and branched alkyl groups having 14 or more and 30 or less carbon atoms. $L^6$ is preferably a linear alkyl group having 14 or more and 30 or less carbon atoms, more preferably a linear alkyl group having 14 or more and 24 or less carbon atoms, and even more preferably a linear alkyl group having 16 or more and 22 or less carbon atoms.

Examples of the linear alkyl group having 14 or more and 30 or less carbon atoms include an n-tetradecyl group, an n-pentadecyl group, an n-hexadecyl group, an n-heptadecyl group, an n-octadecyl group, an n-nonadecyl group, an n-eicosyl group, an n-heneicosyl group, an n-docosyl group, an n-tricosyl group, an n-tetracosyl group, an n-pentacosyl group, an n-hexacosyl group, an n-heptacosyl group, an n-octacosyl group, an n-nonacosyl group, and an n-triacontyl group.

Examples of the branched alkyl group having 14 or more and 30 or less carbon atoms include an isotetradecyl group, an isopentadecyl group, an isohexadecyl group, an isoheptadecyl group, an isooctadecyl group, an isononadecyl group, an isoeicosyl group, an isoheneicosyl group, an isodocosyl group, an isotricosyl group, an isotetracosyl group, an isopentacosyl group, an isohexacosyl group, an isoheptacosyl group, an isooctacosyl group, an isononacosyl group, and an isotriacontyl group.

Examples of combination of R, $L^1$, $L^2$, and $L^3$ in the formula (1) include the followings.

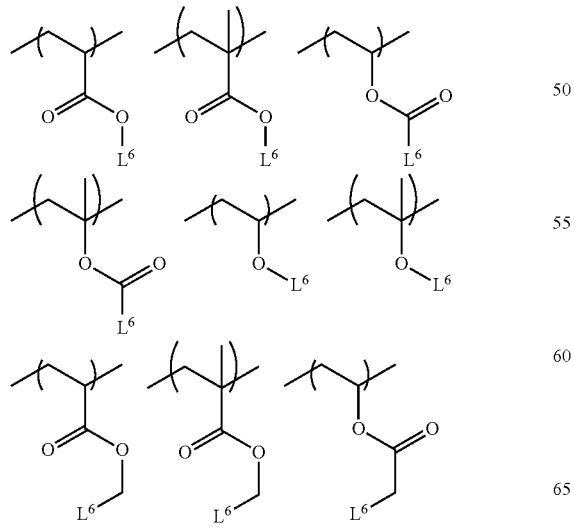

-continued

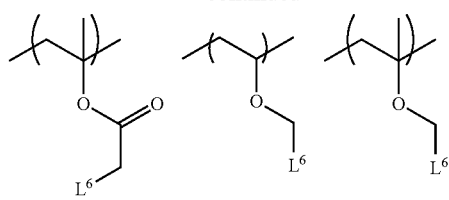

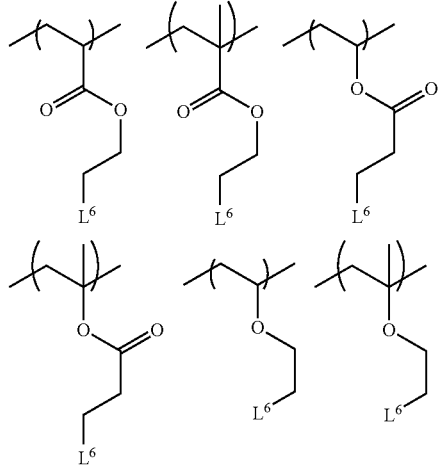

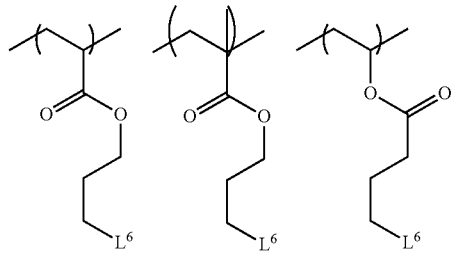

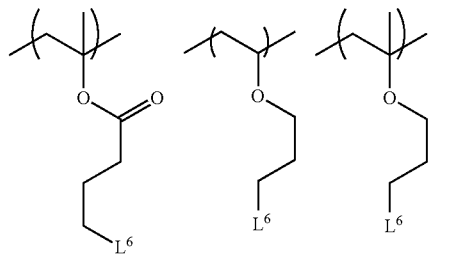

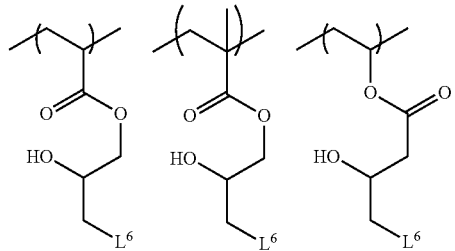

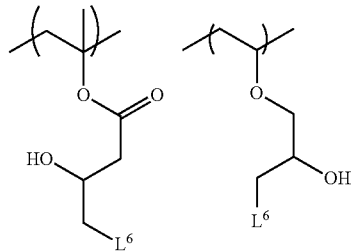

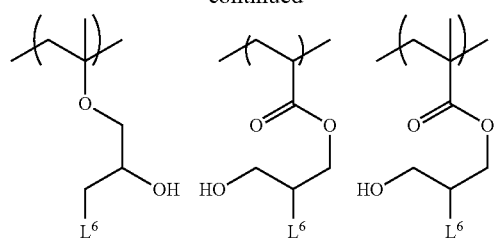
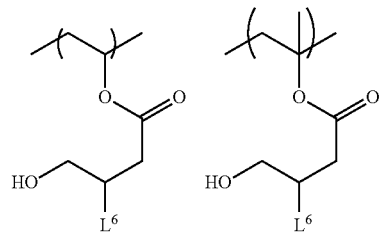
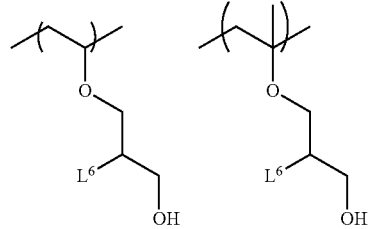
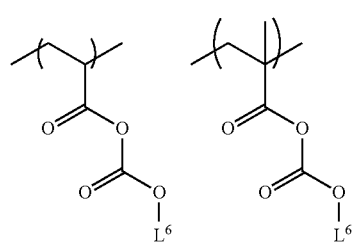
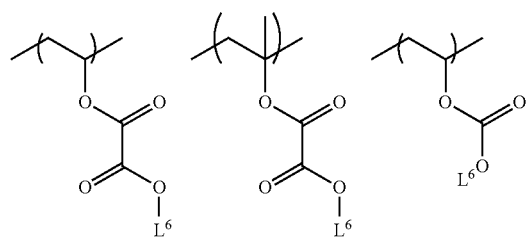
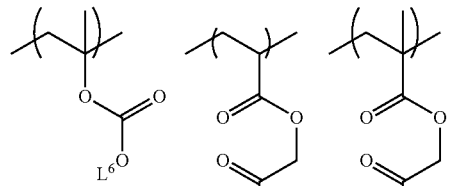
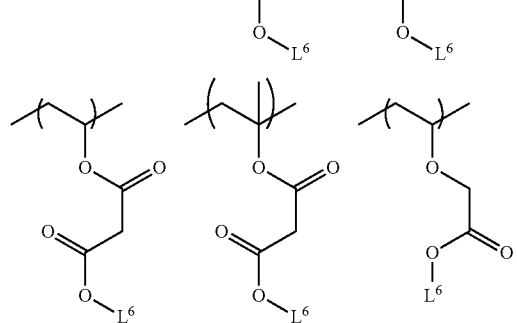
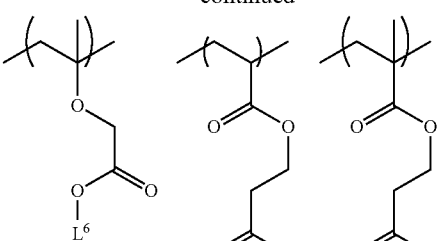
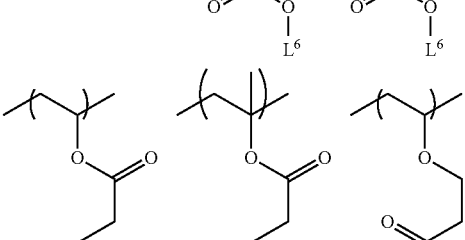
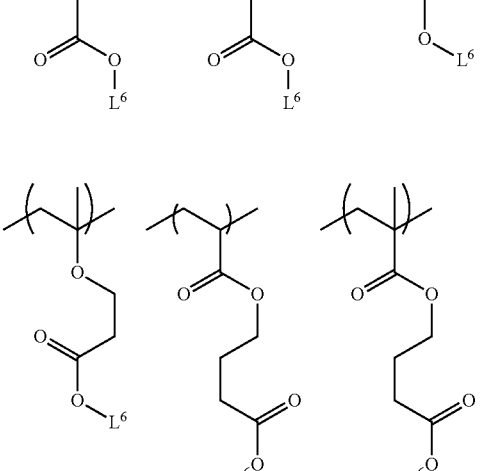
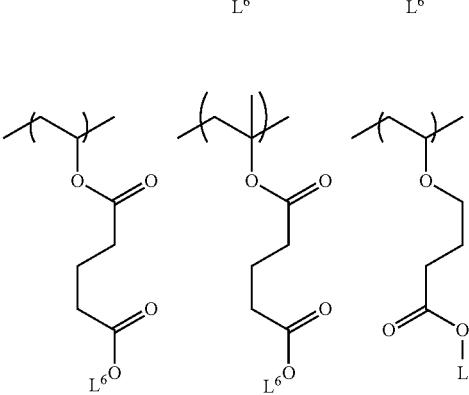
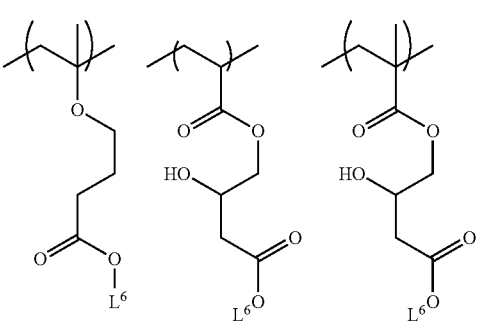

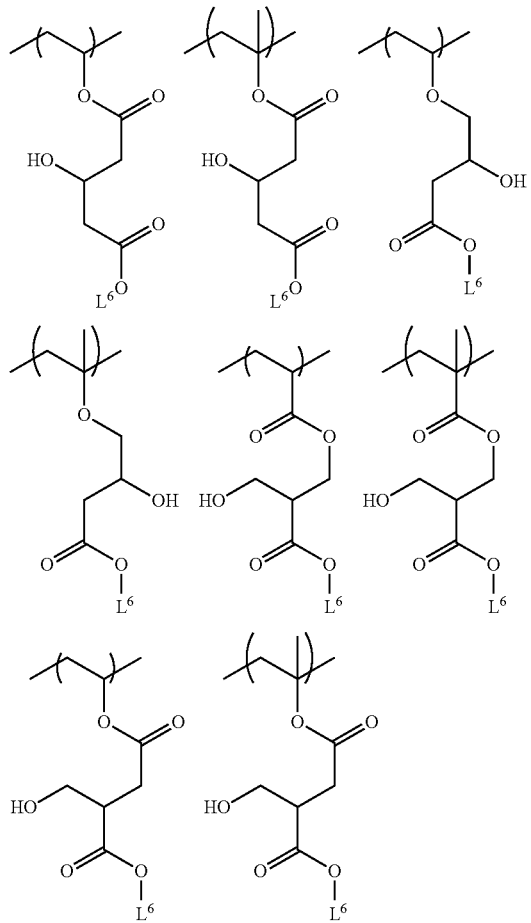
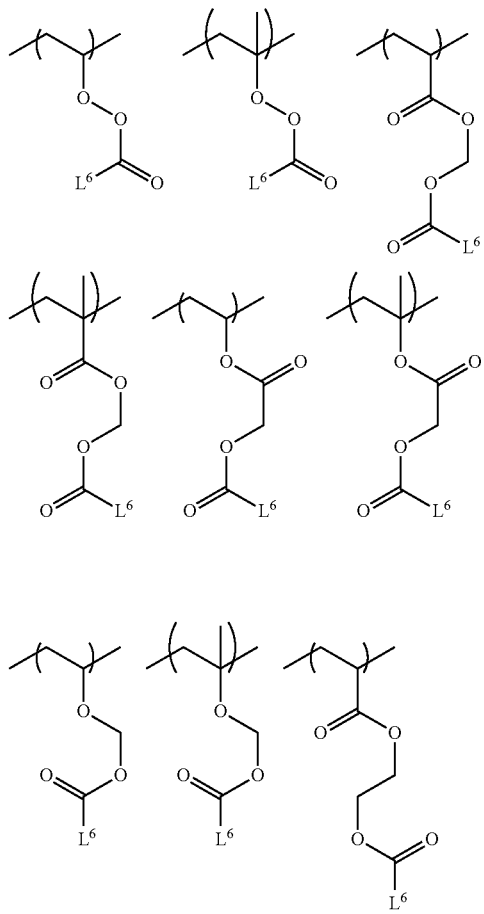
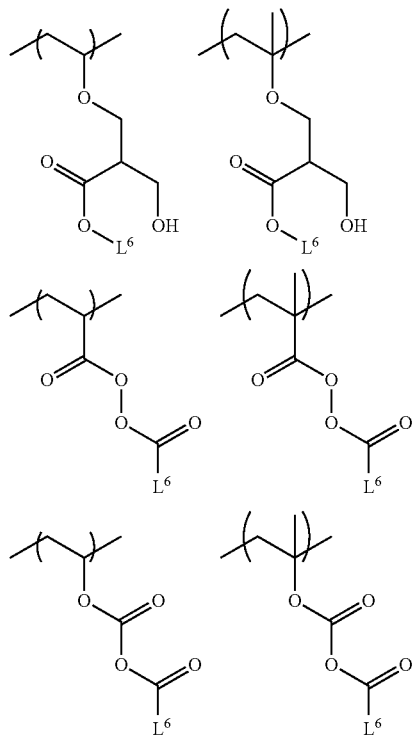
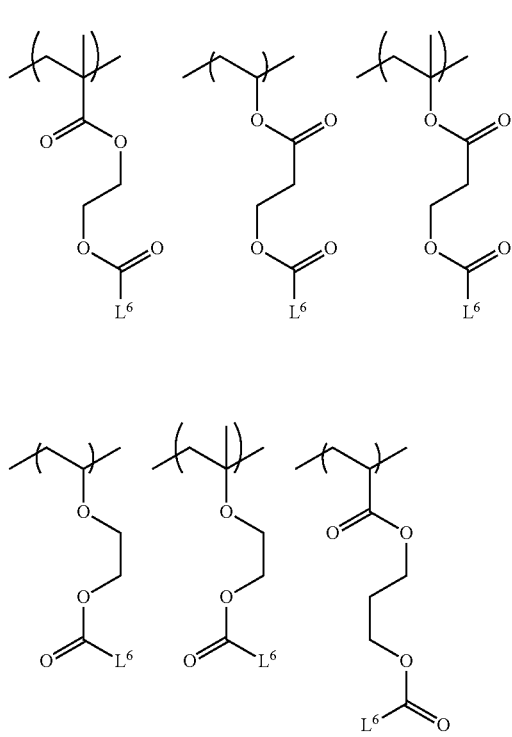

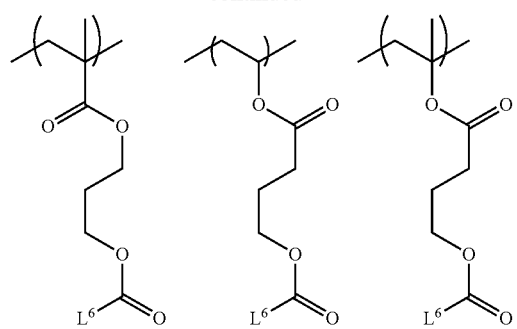
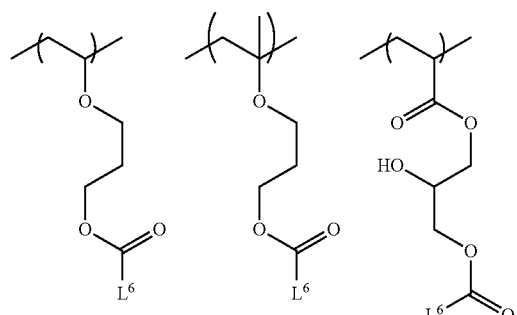
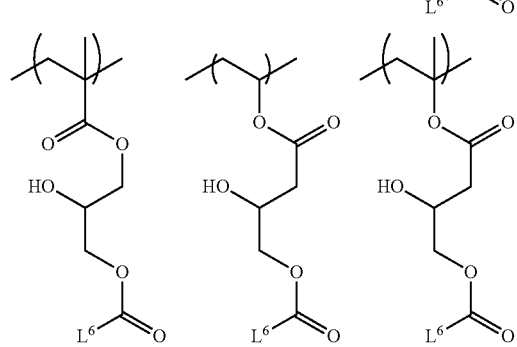
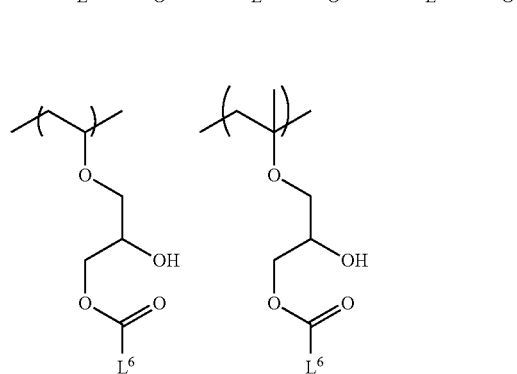
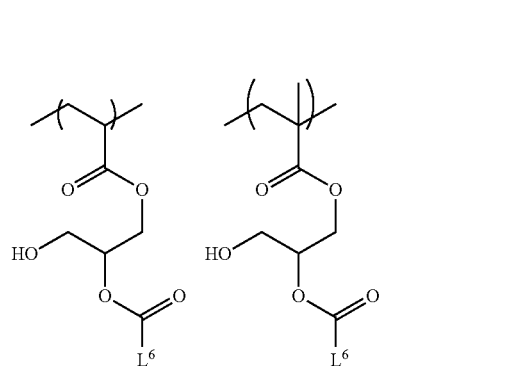
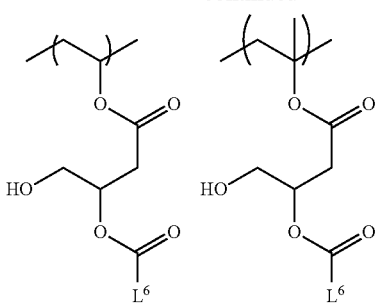
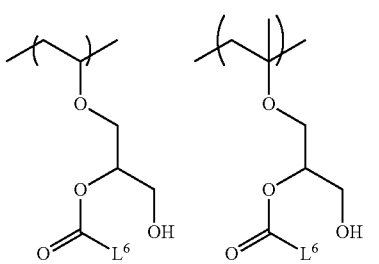
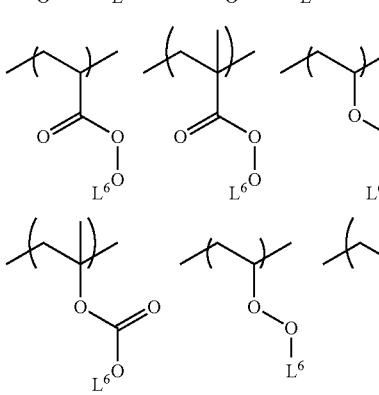
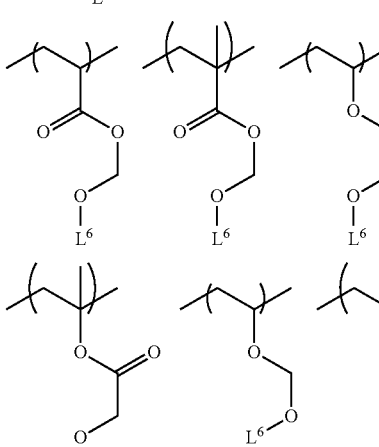
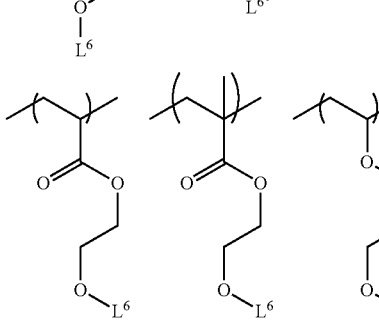

15
-continued
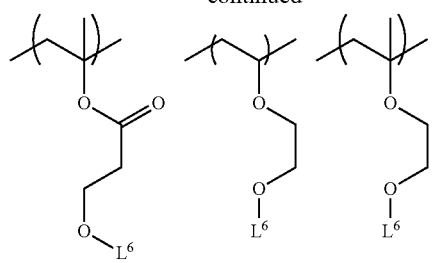
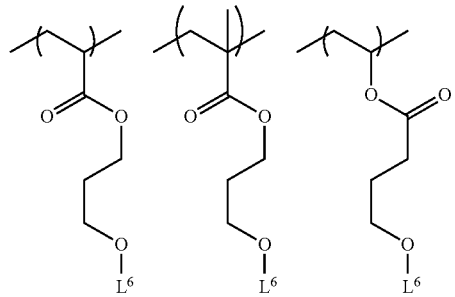
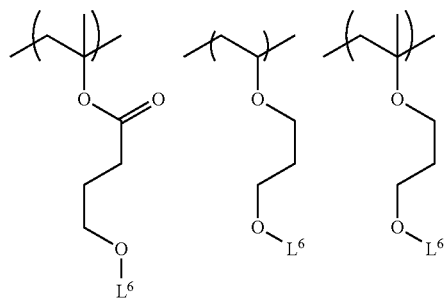
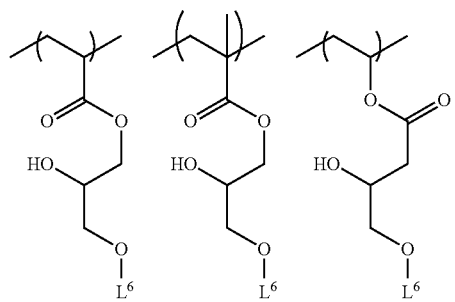
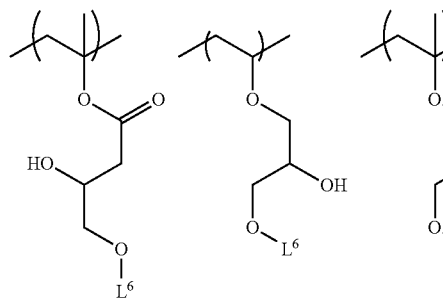
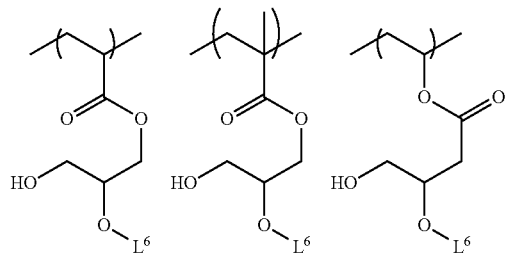
16
-continued
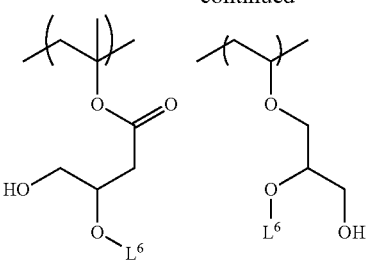
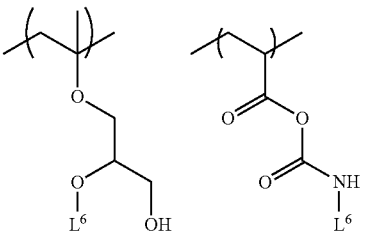
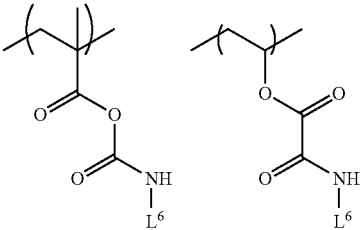
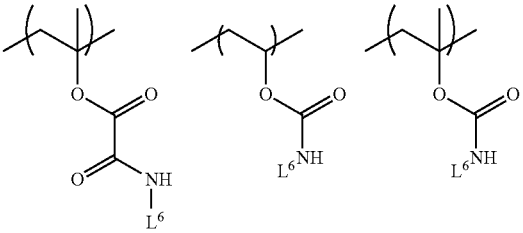
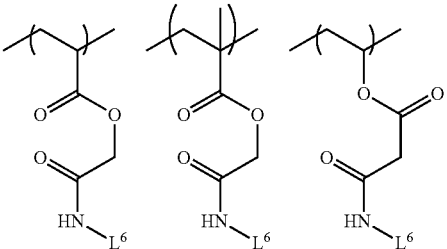
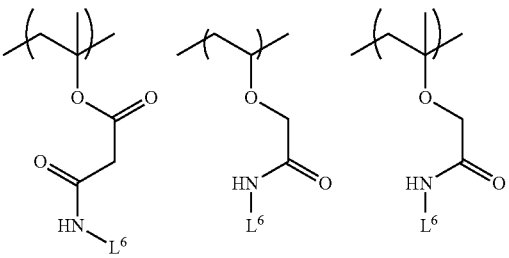

-continued
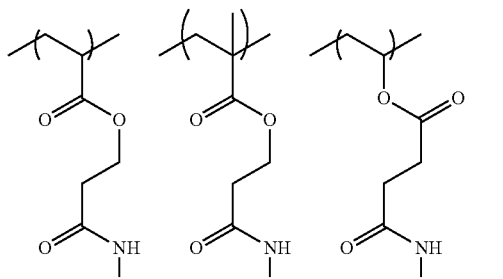
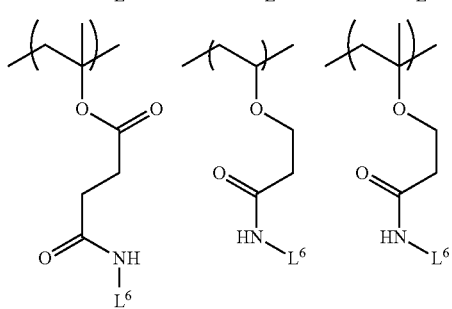
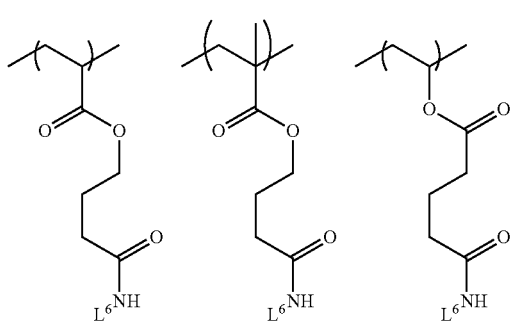
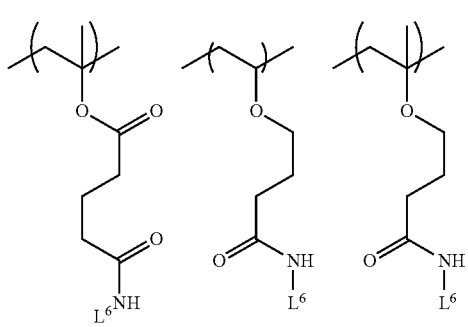
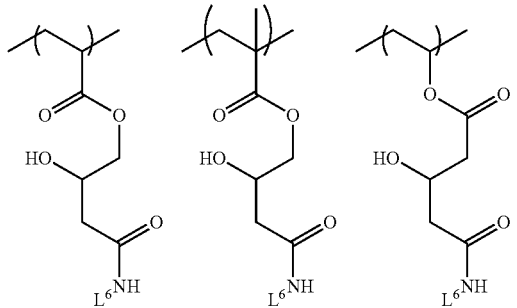
-continued
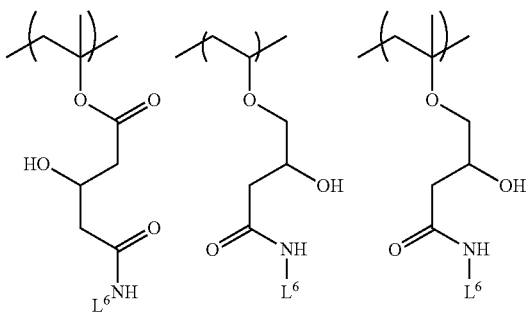
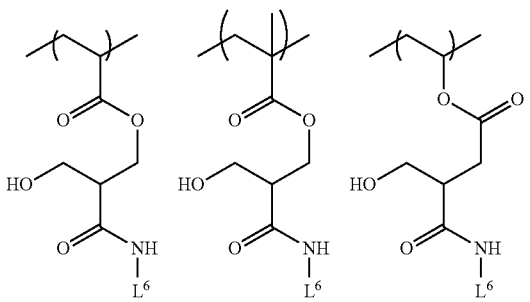
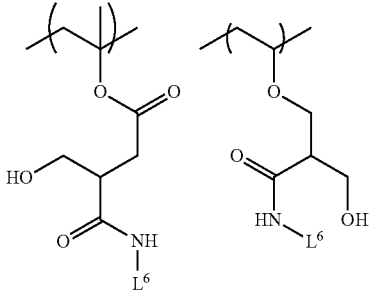
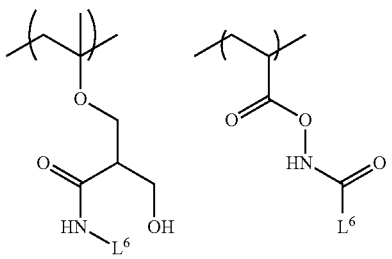
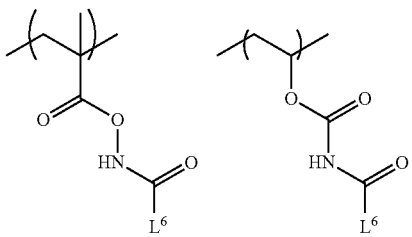
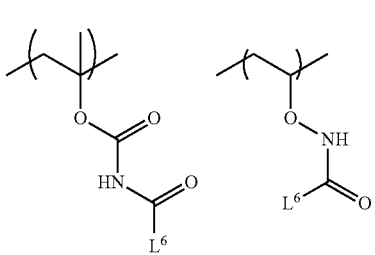

-continued
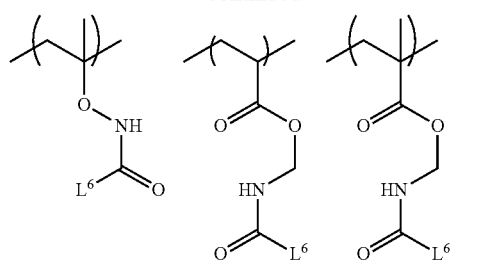
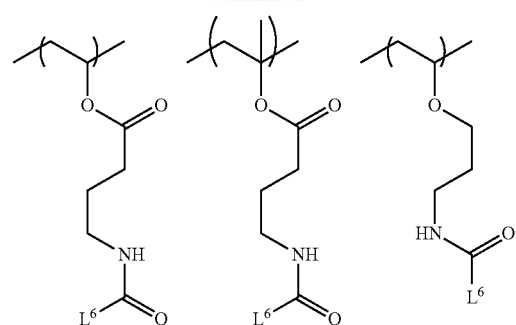
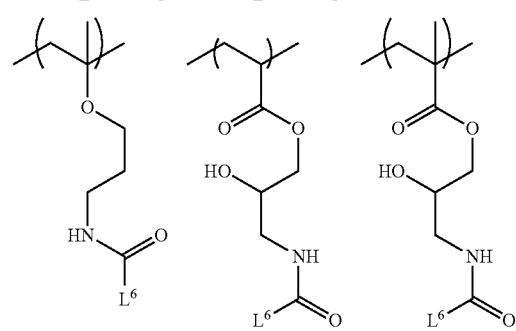
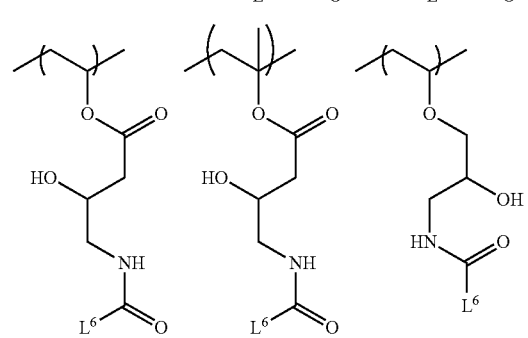
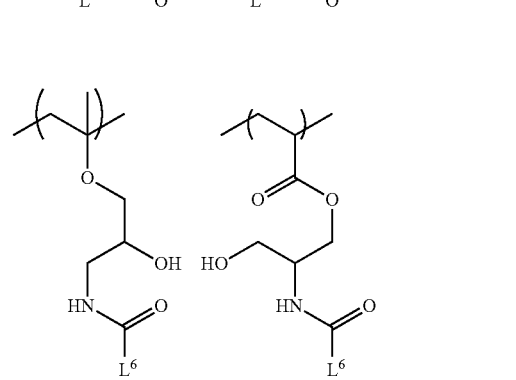
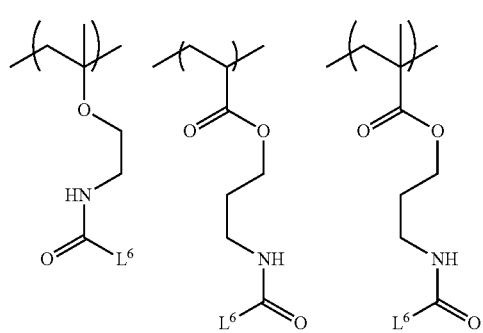

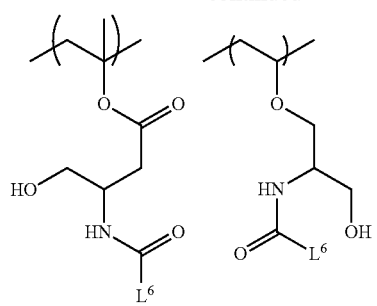
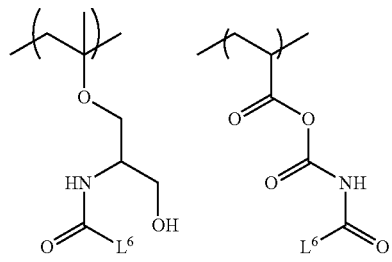
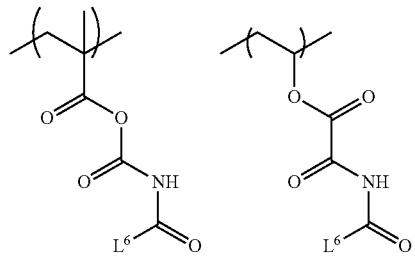
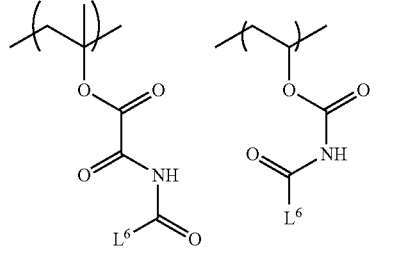
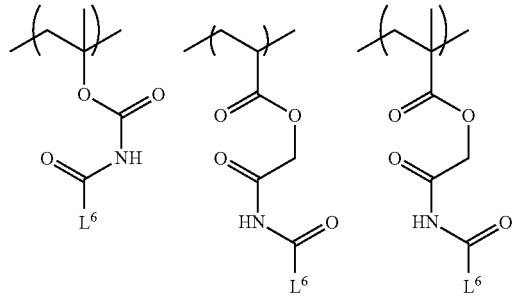
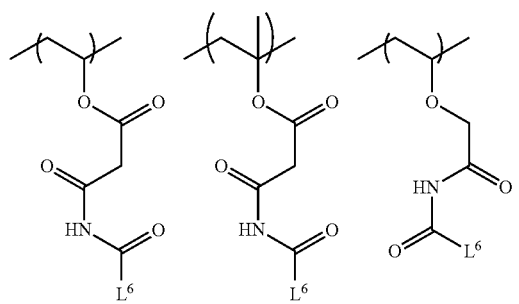
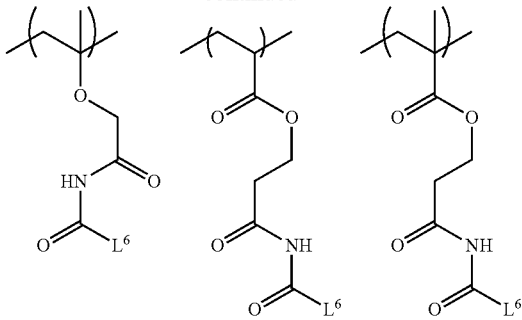
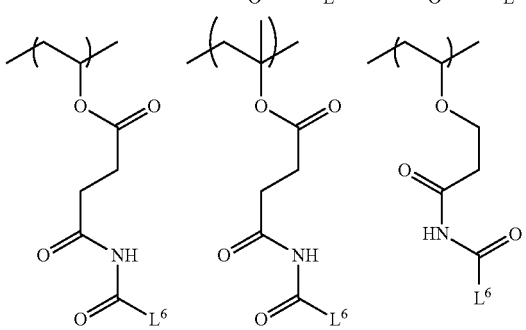
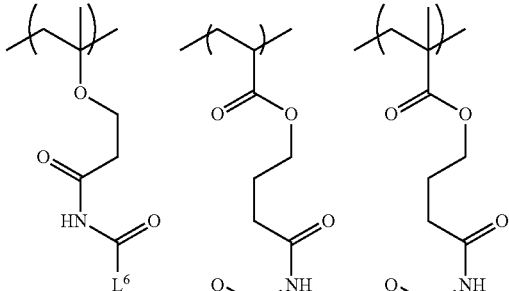
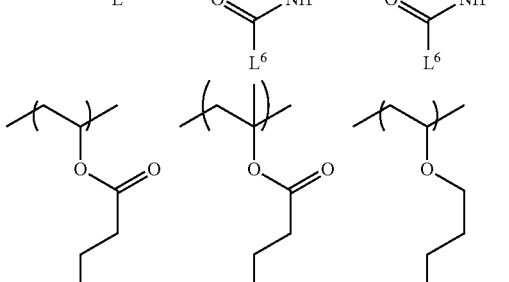
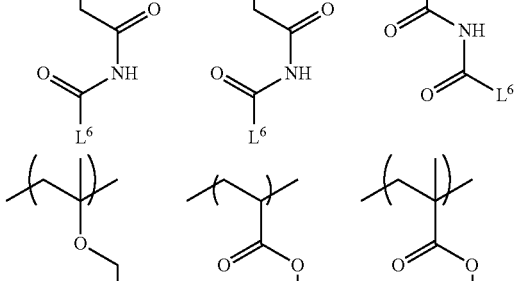
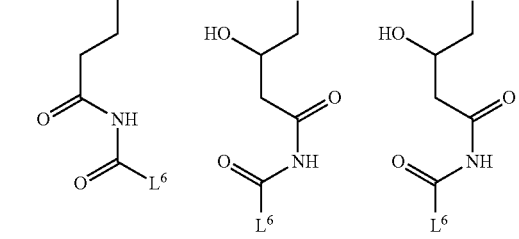

-continued
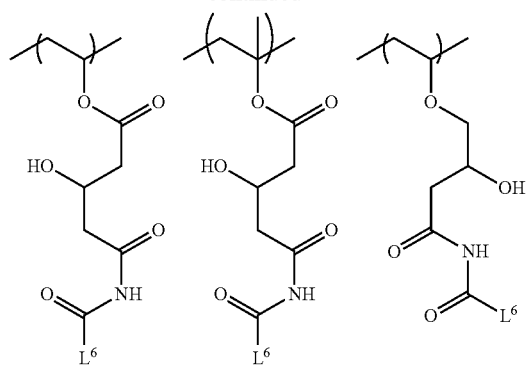
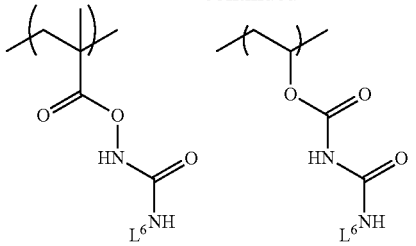
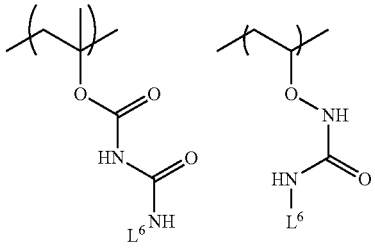
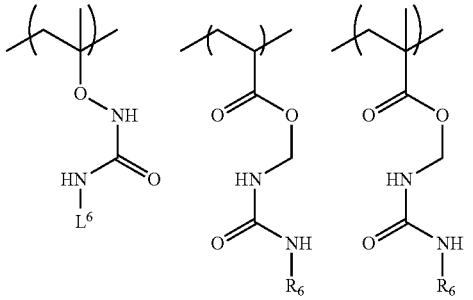
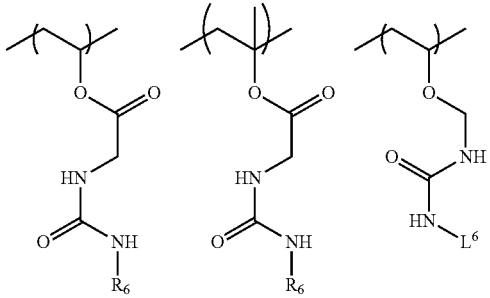
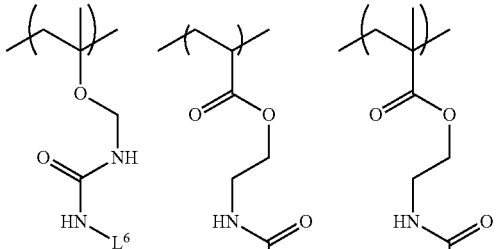
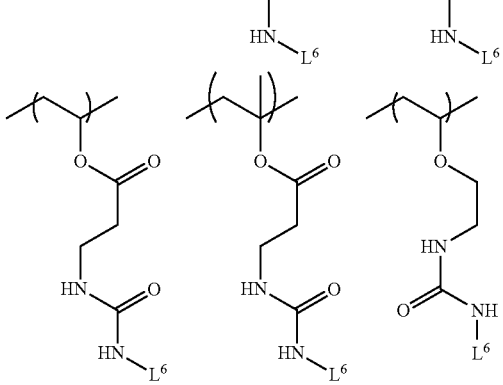

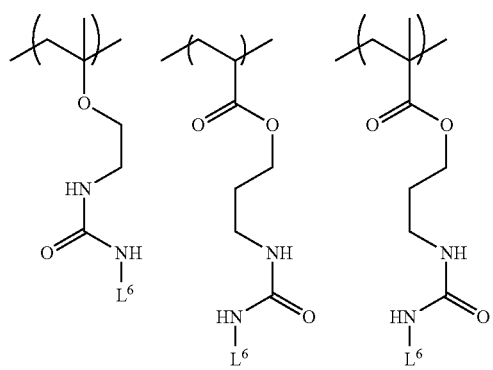
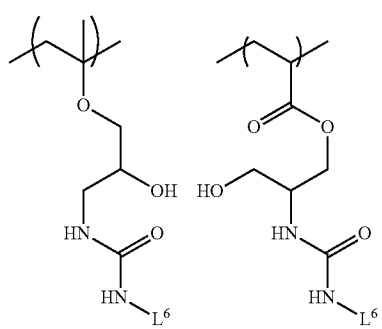
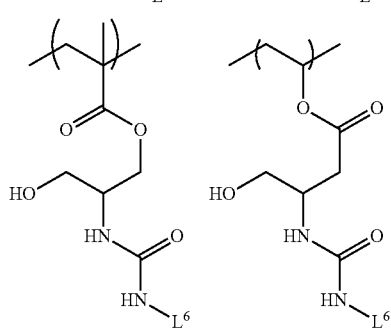
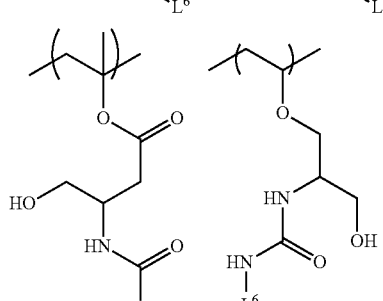
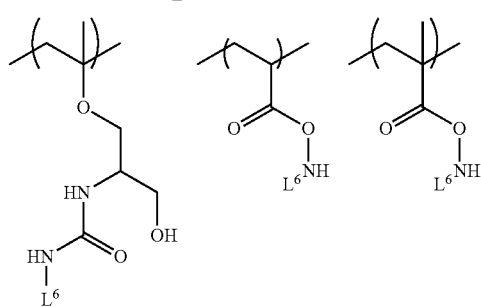
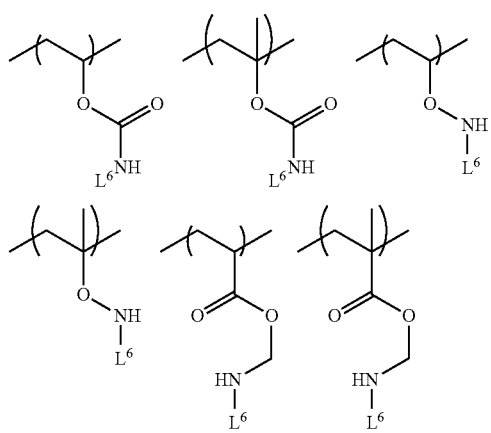

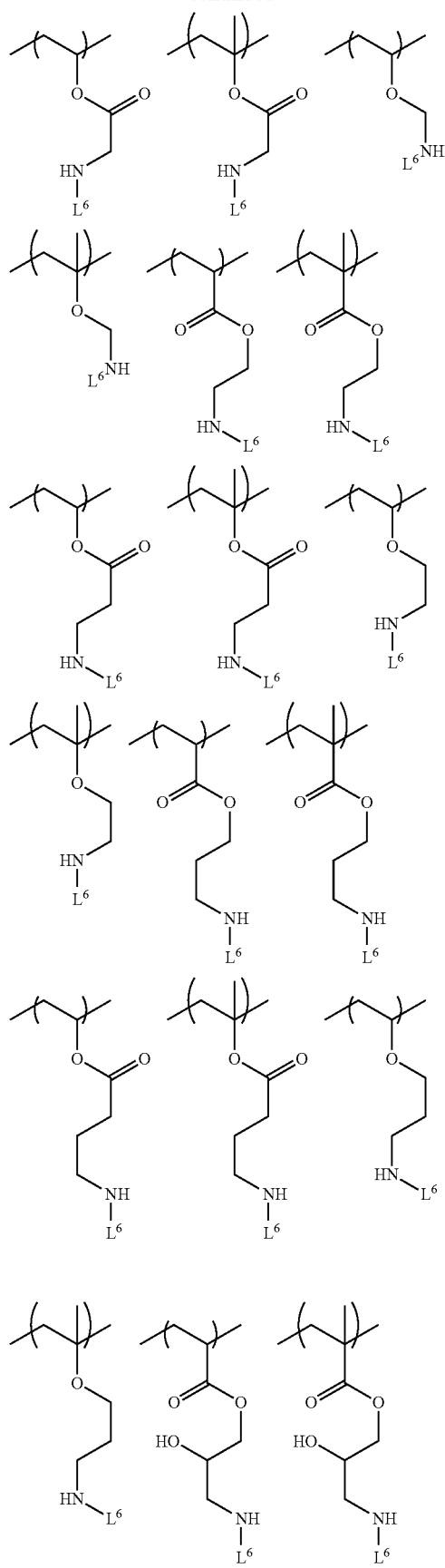
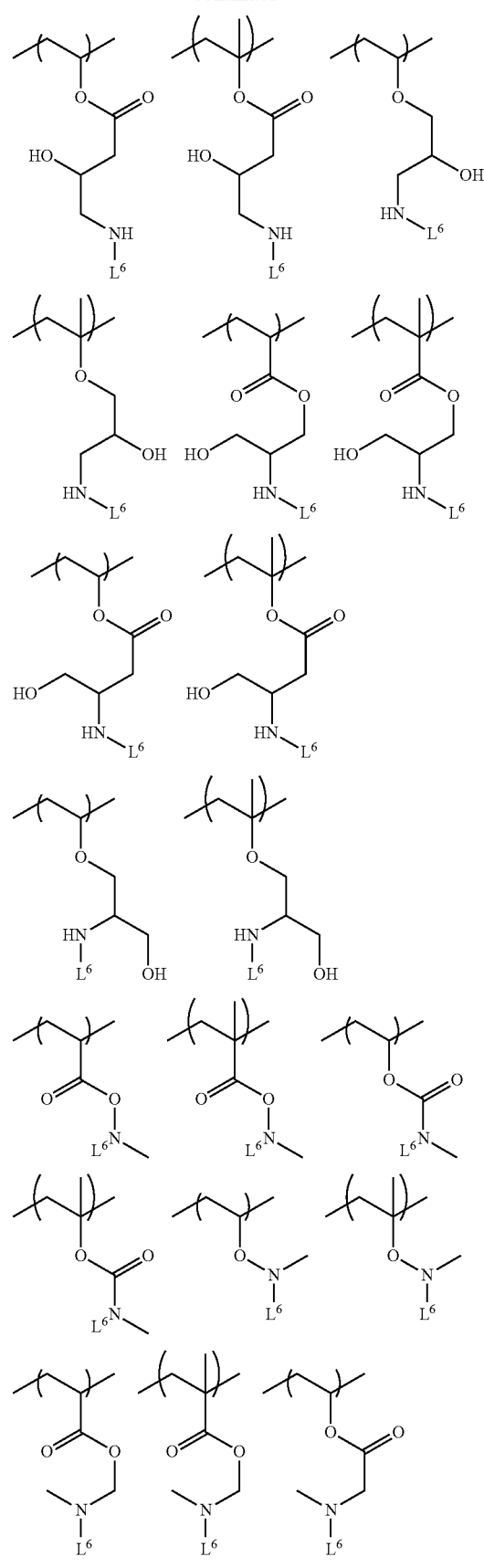

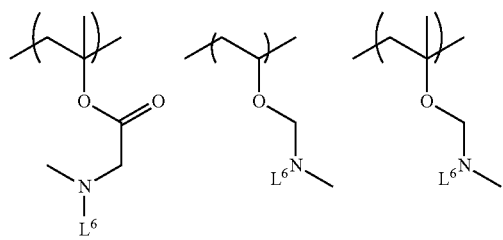
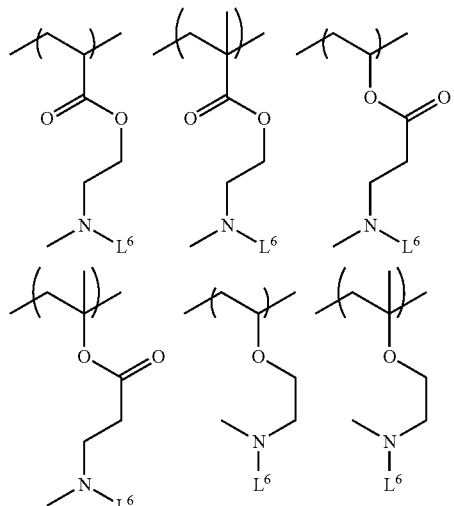
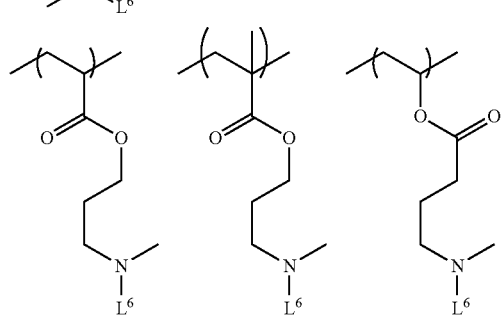
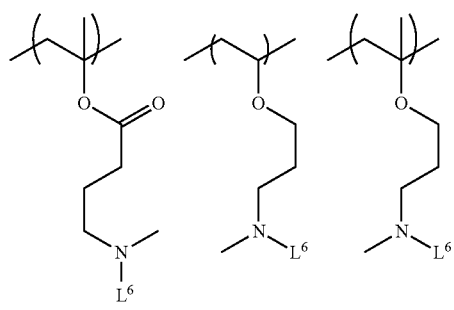
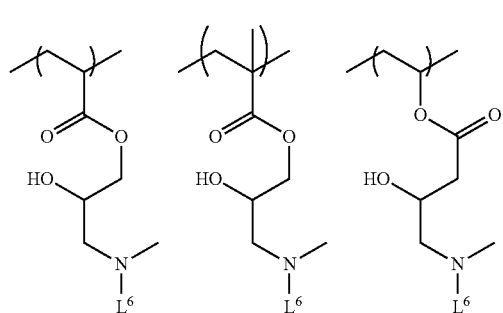
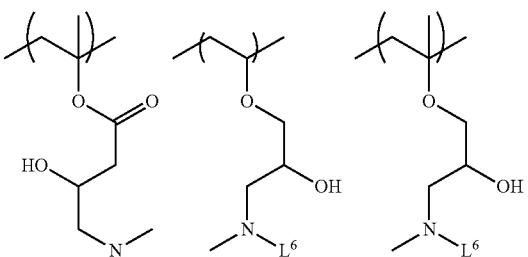
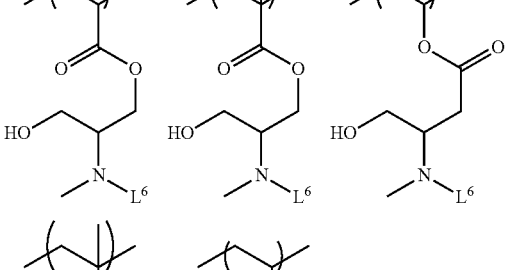
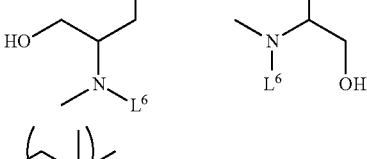
Combination of R, $L^1$, $L^2$, and $L^3$ in the formula (1) is preferably as follows.
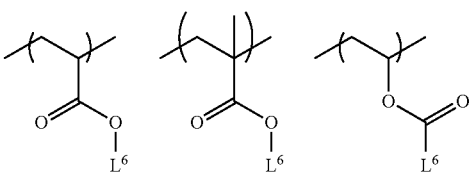
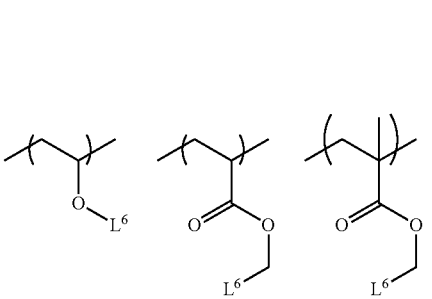

-continued
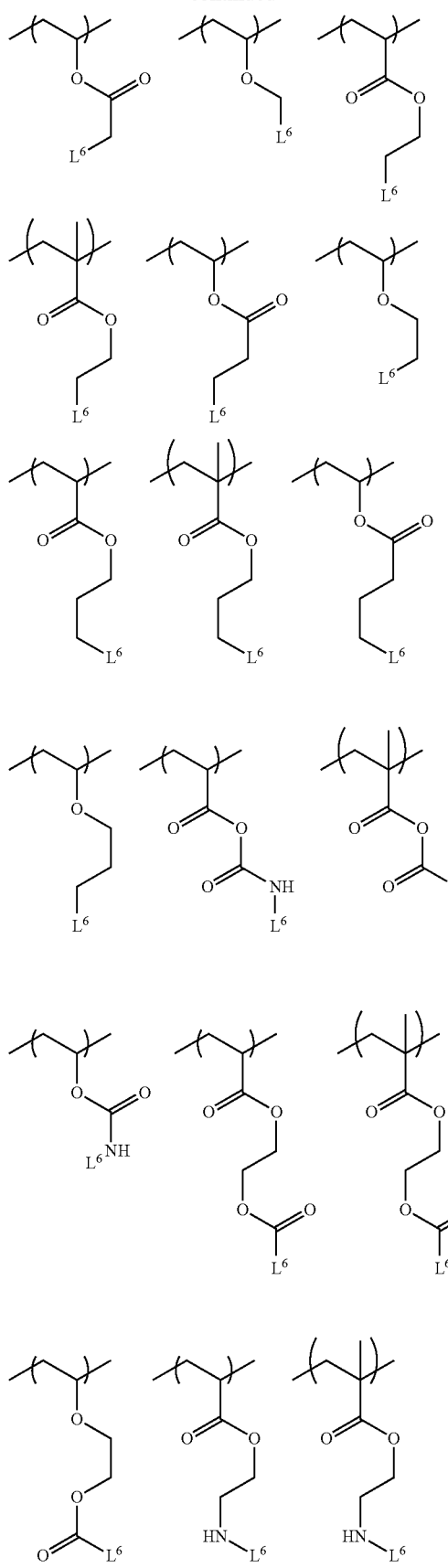
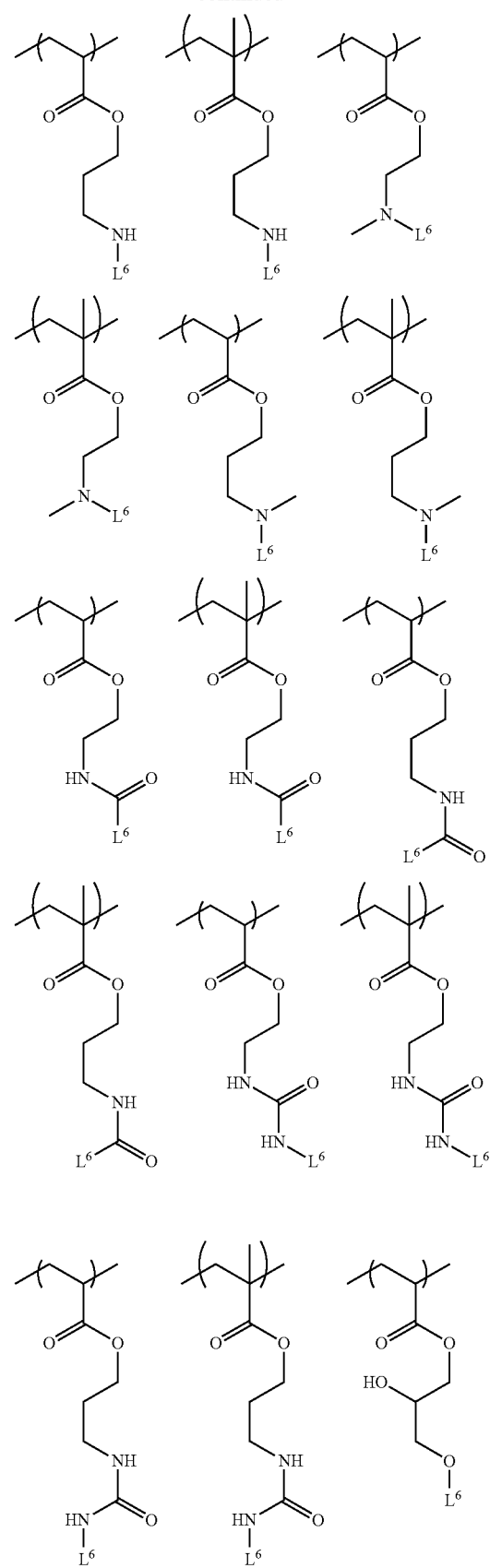

-continued
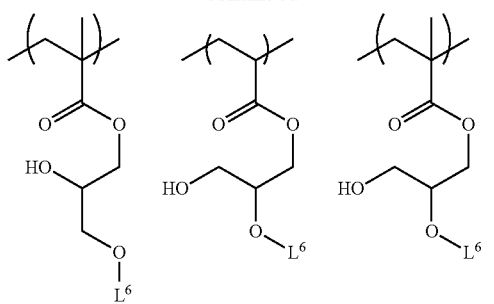
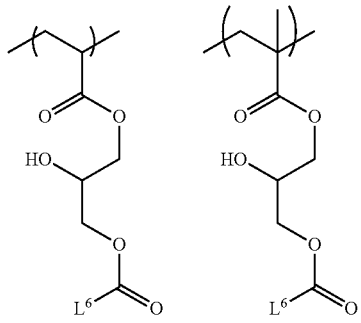
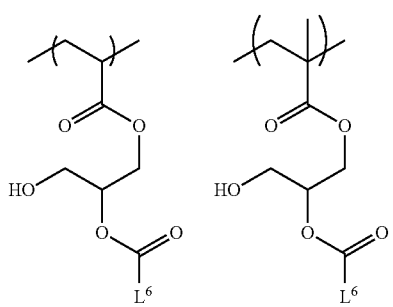
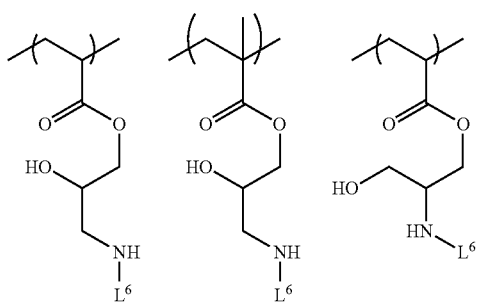
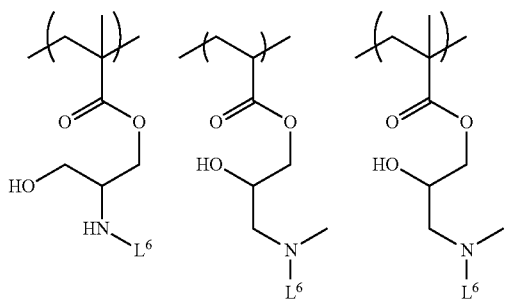
-continued
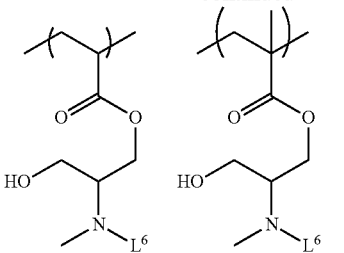
The following is also preferred as combination of R, $L^1$, $L^2$, and $L^3$ in the formula (1):
combination that R is a hydrogen atom, $L^1$, $L^2$, and $L^3$ are each a single bond, and $L^6$ is an alkyl group having 14 or more and 30 or less carbon atoms; and combination that R is a hydrogen atom or a methyl group, $L^1$ is —CO—O—, $L^2$ and $L^3$ are each a single bond, and $L^6$ is an alkyl group having 14 or more and 30 or less carbon atoms.

Combination of R, $L^1$, $L^2$, and $L^3$ in the formula (1) is more preferably as follows.

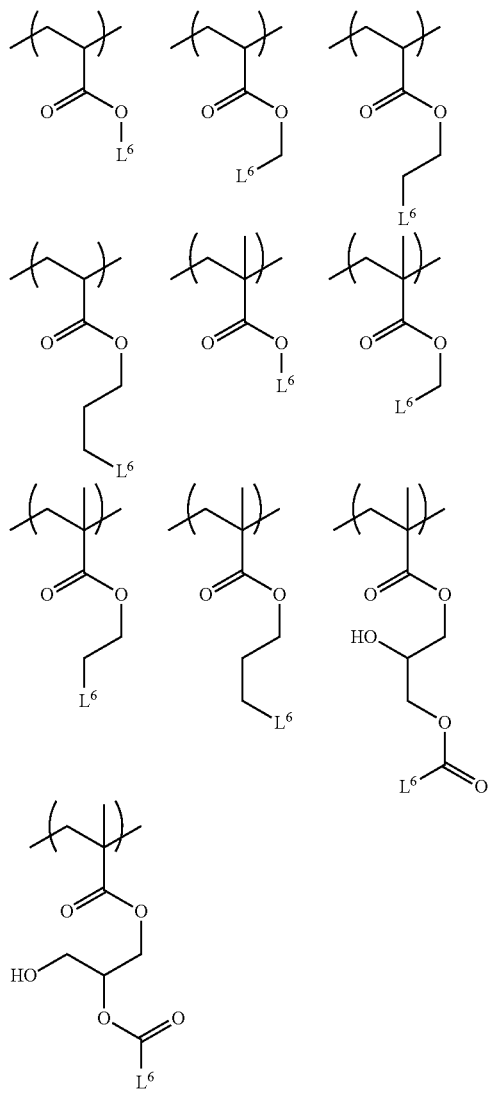

Combination of R, $L^1$, $L^2$, and $L^3$ in the formula (1) is even more preferably as follows.

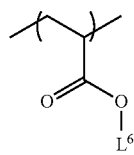

The constitutional unit (B) is preferably a constitutional unit derived from n-hexadecene, a constitutional unit derived from n-octadecene, a constitutional unit derived from n-eicosene, a constitutional unit derived from n-docosene, a constitutional unit derived from n-tetracosene, a constitutional unit derived from n-hexacosene, a constitu- tional unit derived from n-octacosene, a constitutional unit derived from n-triacontene, a constitutional unit derived from n-dotriacontene, a constitutional unit derived from n-tetradecyl acrylate, a constitutional unit derived from n-pentadecyl acrylate, a constitutional unit derived from n-hexadecyl acrylate, a constitutional unit derived from n-heptadecyl acrylate, a constitutional unit derived from n-octadecyl acrylate, a constitutional unit derived from n-nonadecyl acrylate, a constitutional unit derived from n-eicosyl acrylate, a constitutional unit derived from n-heneicosyl acrylate, a constitutional unit derived from n-docosyl acrylate, a constitutional unit derived from n-tricosyl acrylate, a constitutional unit derived from n-tetracosyl acrylate, a constitutional unit derived from n-pentacosyl acrylate, a constitutional unit derived from n-hexacosyl acrylate, a constitutional unit derived from n-heptacosyl acrylate, a constitutional unit derived from n-octacosyl acrylate, a constitutional unit derived from n-nonacosyl acrylate, a constitutional unit derived from n-triacontyl acrylate, a constitutional unit derived from n-tetradecyl methacrylate, a constitutional unit derived from n-pentadecyl methacrylate, a constitutional unit derived from n-hexadecyl methacrylate, a constitutional unit derived from n-heptadecyl methacrylate, a constitutional unit derived from n-octadecyl methacrylate, a constitutional unit derived from n-nonadecyl methacrylate, a constitutional unit derived from n-eicosyl methacrylate, a constitutional unit derived from n-heneicosyl methacrylate, a constitutional unit derived from n-docosyl methacrylate, a constitutional unit derived from n-tricosyl methacrylate, a constitutional unit derived from n-tetracosyl methacrylate, a constitutional unit derived from n-pentacosyl methacrylate, a constitutional unit derived from n-hexacosyl methacrylate, a constitutional unit derived from n-heptacosyl methacrylate, a constitutional unit derived from n-octacosyl methacrylate, a constitutional unit derived from n-nonacosyl methacrylate, a constitutional unit derived from n-triacontyl methacrylate, a constitutional unit derived from n-vinyl tetradecylate, a constitutional unit derived from n-vinyl hexadecylate, a constitutional unit derived from n-vinyl octadecylate, a constitutional unit derived from n-vinyl eicosylate, a constitutional unit derived from n-vinyl docosylate, a constitutional unit derived from n-tetradecyl vinyl ether, a constitutional unit derived from n-hexadecyl vinyl ether, a constitutional unit derived from n-octadecyl vinyl ether, a constitutional unit derived from n-eicosyl vinyl ether, or a constitutional unit derived from n-docosyl vinyl ether.

The polymer (1) may include two or more types of the constitutional unit (B), and, for example, may be a polymer including a constitutional unit derived from n-eicosyl acrylate and a constitutional unit derived from n-octadecyl acrylate.

It is preferable that the polymer (1) be a polymer including a constitutional unit (A) derived from ethylene for imparting good shape retention to a molded article comprising the resin composition containing the polymer (1) and good formability to the resin composition containing the polymer (1) at temperatures equal to or higher than the melting peak temperature of the polymer (1). The constitutional unit (A) is a constitutional unit obtained by polymerization of ethylene, and the constitutional unit (A) may be forming a branched structure in the polymer.

The polymer (1) is preferably a polymer including the constitutional unit (B) represented by the formula (1) and the constitutional unit (A) derived from ethylene.

The polymer (1) may include at least one constitutional unit (C) selected from the group consisting of a constitutional unit represented by the following formula (2) and a constitutional unit represented by the following formula (3).

formula (2)

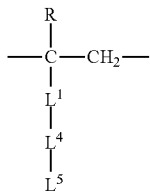

In the formula (2),
R represents a hydrogen atom or a methyl group;
$L^1$ represents a single bond, —CO—O—, —O—CO—, or —O—;
$L^4$ represents an alkylene group having one or more and eight or less carbon atoms;
$L^5$ represents a hydrogen atom, an epoxy group, —CH(OH)—CH$_2$OH, a carboxy group, a hydroxy group, an amino group, or an alkylamino group having one or more and four or less carbon atoms; and the left side and right side of each of the horizontal chemical formulas for $L^1$ correspond to the upper side of the formula (2) and the lower side of the formula (2), respectively.

formula (3)

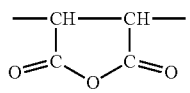

In the formula (2), R is preferably a hydrogen atom.
In the formula (2), $L^1$ is preferably —CO—O—, —O—CO—, or —O—, more preferably —CO—O— or —O—CO—, and even more preferably —CO—O—.
Examples of the alkylene group having one or more and eight or less carbon atoms as $L^4$ in the formula (2) include a methylene group, an ethylene group, an n-propylene group, a 1-methylethylene group, an n-butylene group, a 1,2-dimethylethylene group, a 1,1-dimethylethylene group, a 2,2-dimethylethylene group, an n-pentylene group, an n-hexylene group, an n-heptalene group, an n-octylene group, and a 2-ethyl-n-hexylene group.
$L^4$ is preferably a methylene group, an ethylene group, or an n-propylene group, and more preferably a methylene group.
Examples of the alkylamino group having one or more and four or less carbon atoms as $L^5$ in the formula (2) include a methylamino group, an ethylamino group, a propylamino group, a butylamino group, a dimethylamino group, and a diethylamino group.
In the formula (2), $L^5$ is preferably a hydrogen atom, an epoxy group, or —CH(OH)—CH$_2$OH, and more preferably a hydrogen atom.
Examples of combination of R, $L^1$, $L^4$, and $L^5$ in the formula (2) include the followings.

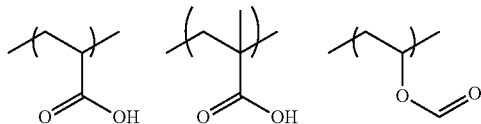

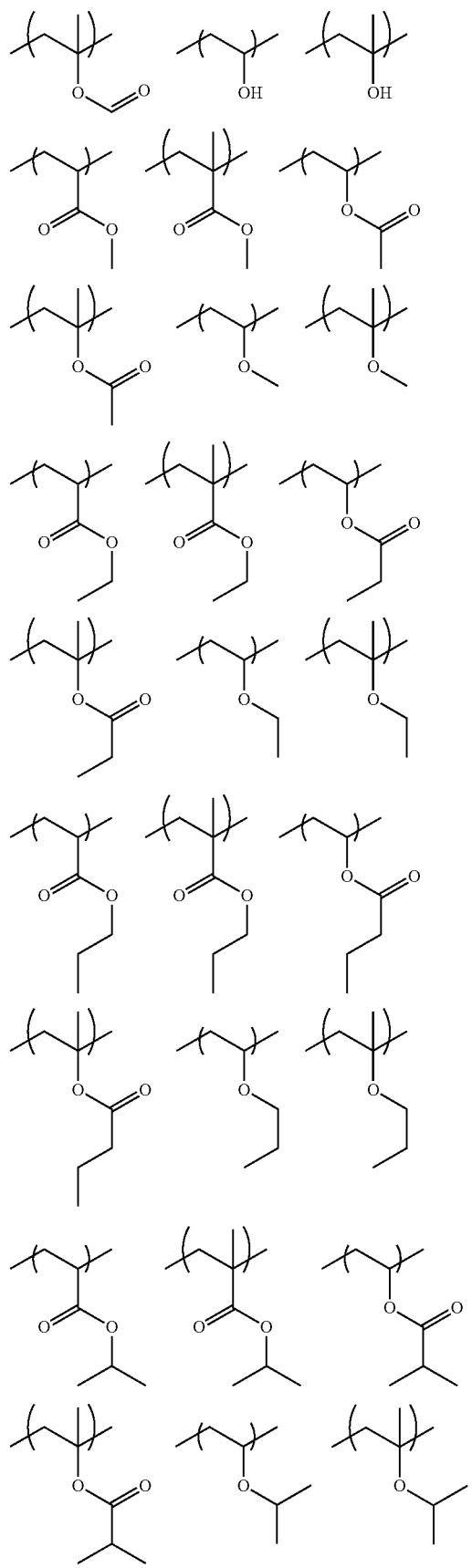

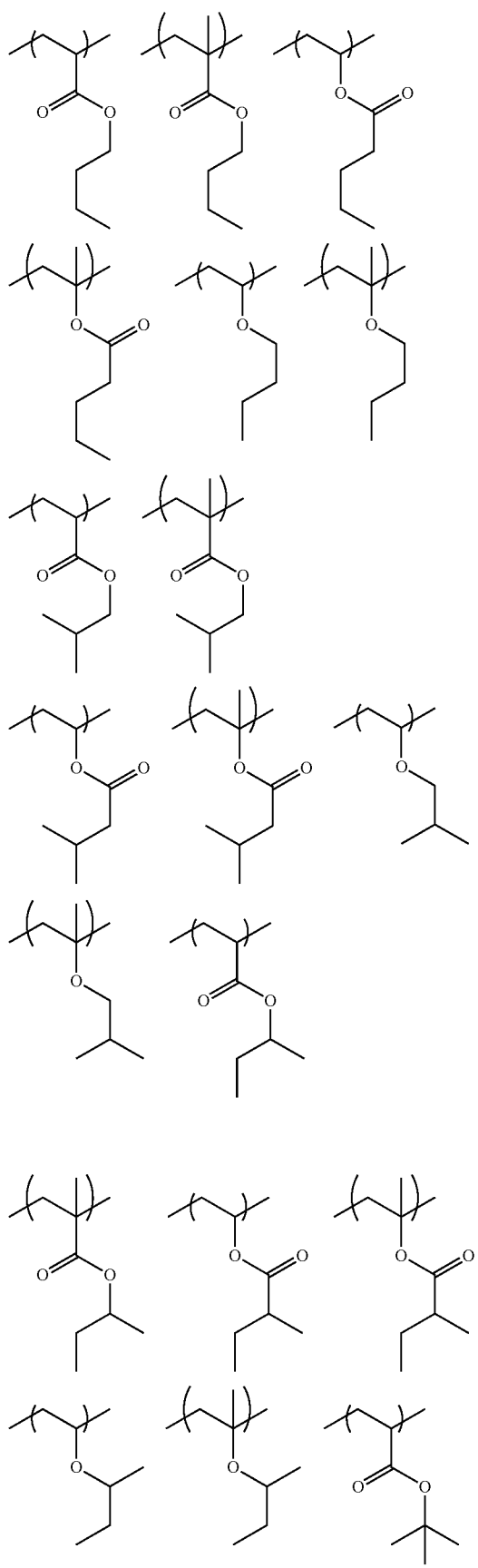
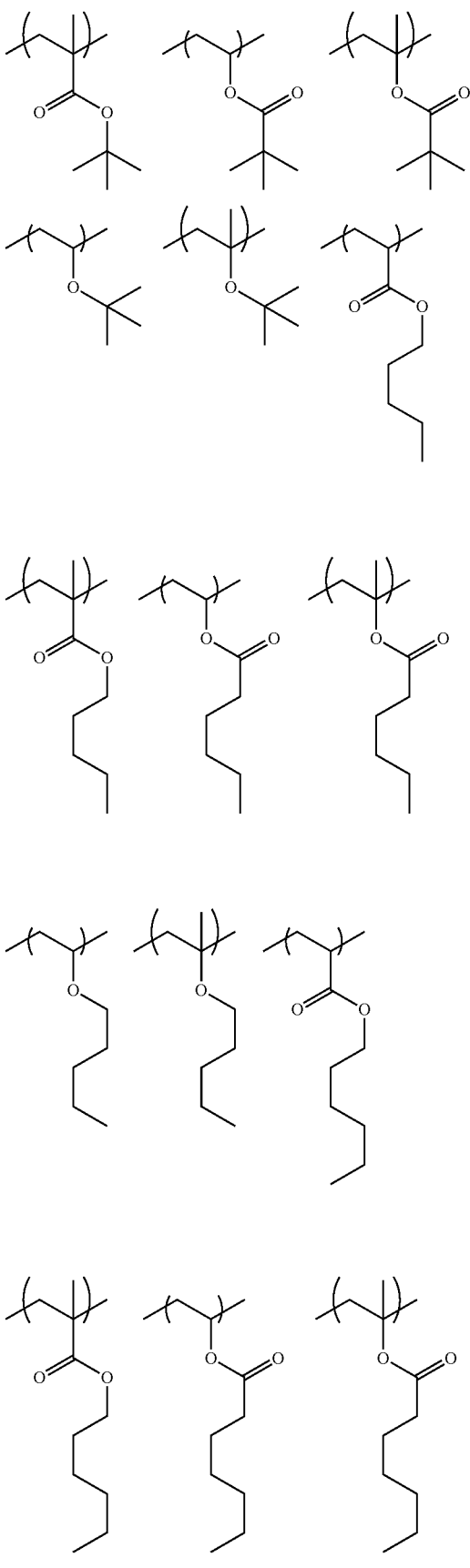

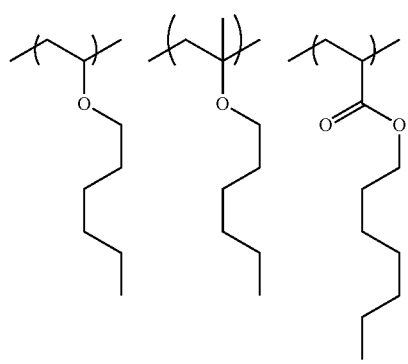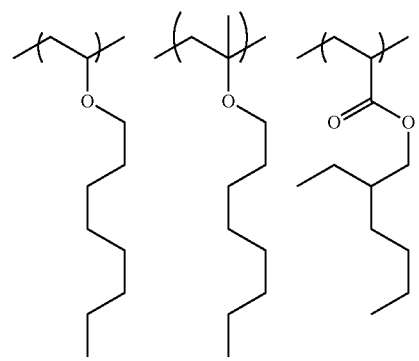

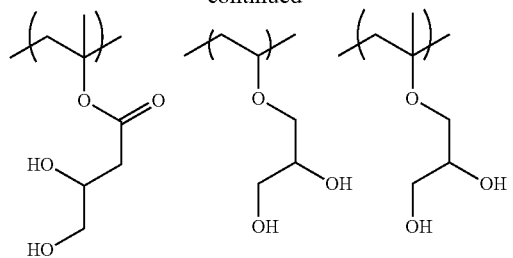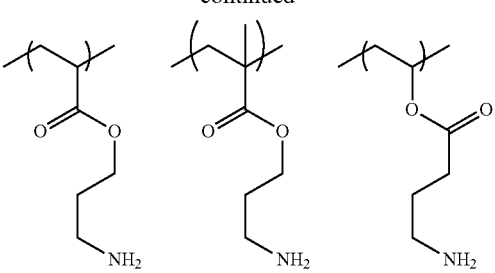

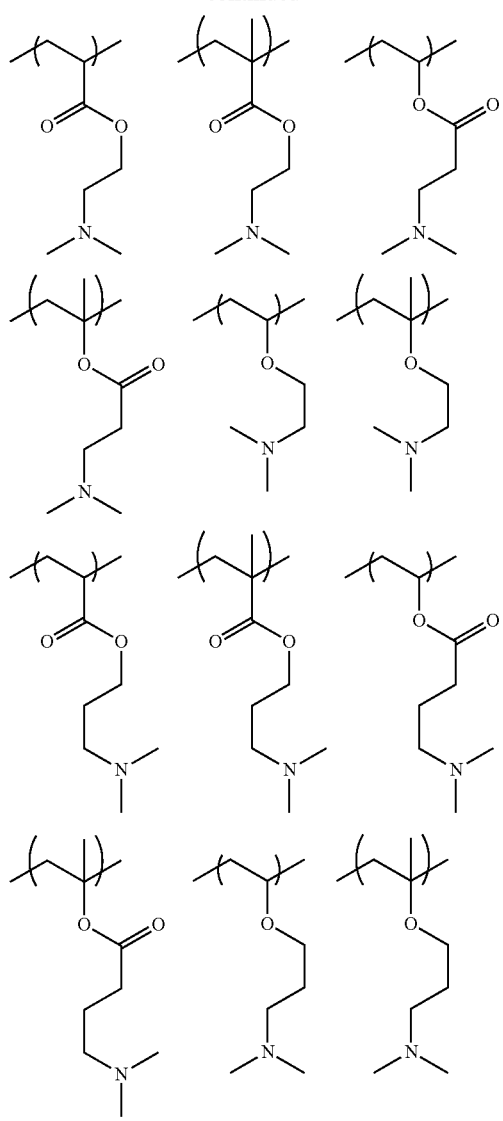
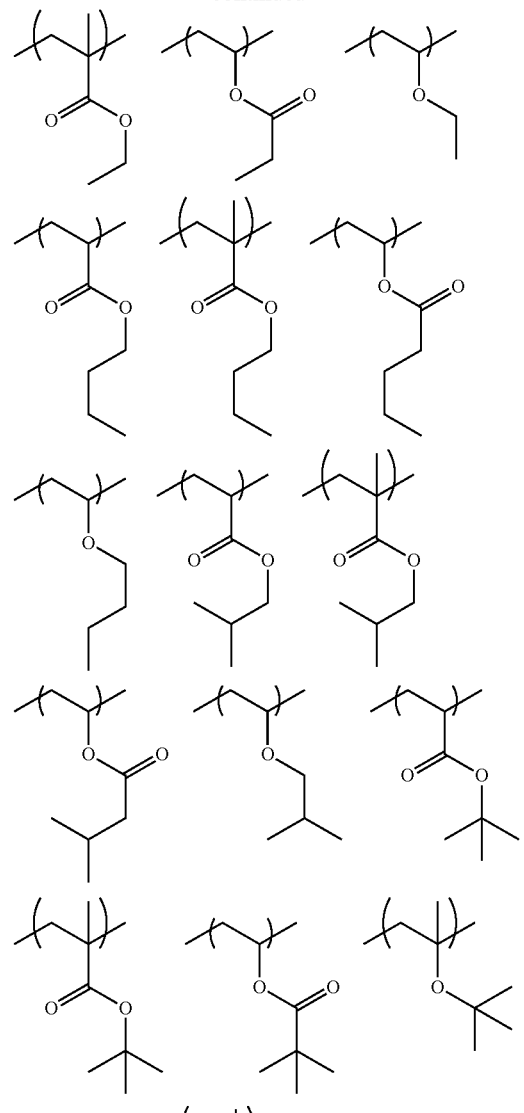
Combination of R, $L^1$, $L^4$, and $L^5$ in the formula (2) is preferably as follows.
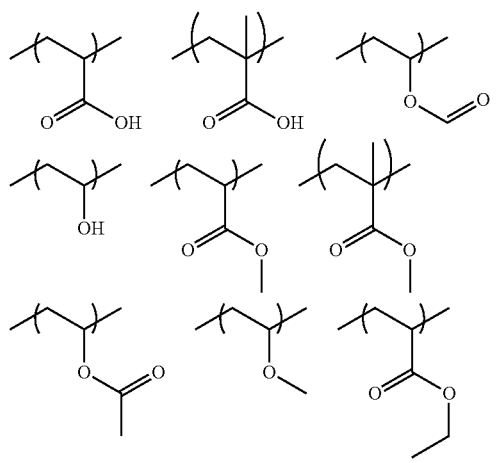
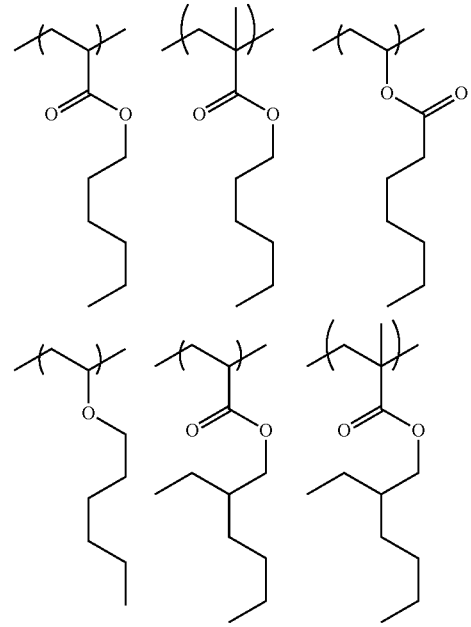

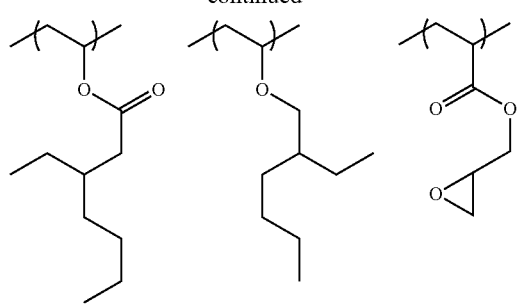
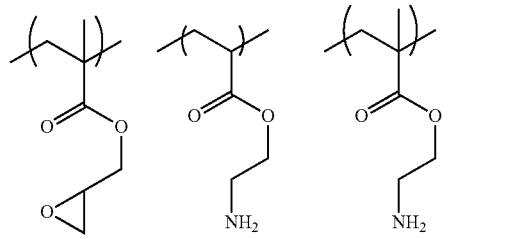
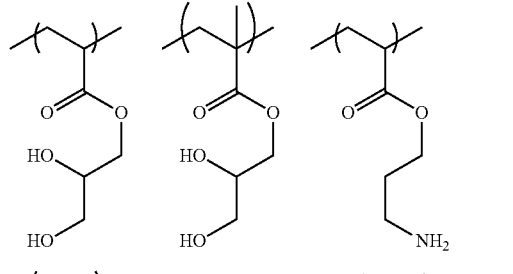
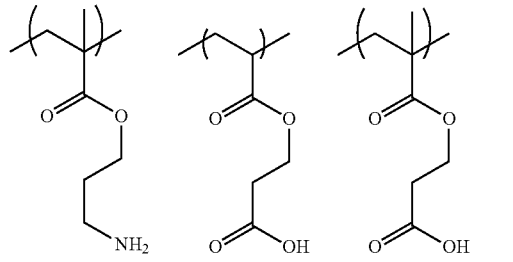
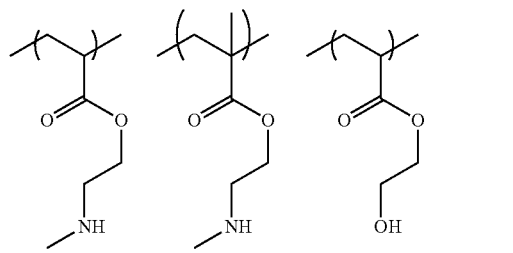

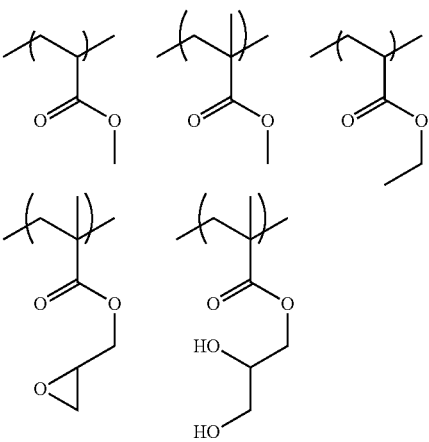

Combination of R, $L^1$, $L^4$, and $L^5$ in the formula (2) is more preferably as follows.

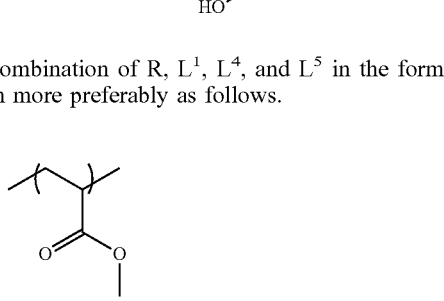

Combination of R, $L^1$, $L^4$, and $L^5$ in the formula (2) is even more preferably as follows.

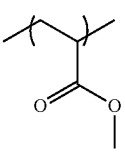

Examples of the constitutional unit represented by the formula (2) include a constitutional unit derived from propylene, a constitutional unit derived from butene, a constitutional unit derived from 1-pentene, a constitutional unit derived from 1-hexene, a constitutional unit derived from 1-heptene, a constitutional unit derived from 1-octene, a constitutional unit derived from acrylic acid, a constitutional unit derived from methacrylic acid, a constitutional unit derived from vinyl alcohol, a constitutional unit derived from methyl acrylate, a constitutional unit derived from ethyl acrylate, a constitutional unit derived from n-propyl acrylate, a constitutional unit derived from isopropyl acry-

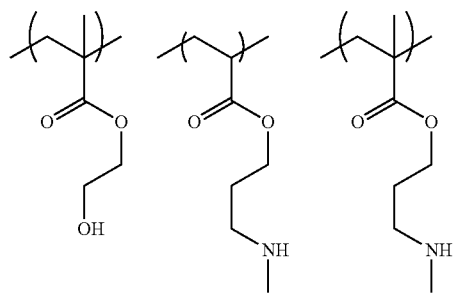

late, a constitutional unit derived from n-butyl acrylate, a constitutional unit derived from isobutyl acrylate, a constitutional unit derived from sec-butyl acrylate, a constitutional unit derived from tert-butyl acrylate, a constitutional unit derived from methyl methacrylate, a constitutional unit derived from ethyl methacrylate, a constitutional unit derived from n-propyl methacrylate, a constitutional unit derived from isopropyl methacrylate, a constitutional unit derived from n-butyl methacrylate, a constitutional unit derived from isobutyl methacrylate, a constitutional unit derived from sec-butyl methacrylate, a constitutional unit derived from tert-butyl methacrylate, a constitutional unit derived from vinyl formate, a constitutional unit derived from vinyl acetate, a constitutional unit derived from vinyl propionate, a constitutional unit derived from vinyl(n-butyrate), a constitutional unit derived from vinyl(isobutyrate), a constitutional unit derived from methyl vinyl ether, a constitutional unit derived from ethyl vinyl ether, a constitutional unit derived from n-propyl vinyl ether, a constitutional unit derived from isopropyl vinyl ether, a constitutional unit derived from n-butyl vinyl ether, a constitutional unit derived from isobutyl vinyl ether, a constitutional unit derived from sec-butyl vinyl ether, a constitutional unit derived from tert-butyl vinyl ether, a constitutional unit derived from glycidyl acrylate, a constitutional unit derived from glycidyl methacrylate, a constitutional unit derived from 2,3-dihydroxypropyl acrylate, a constitutional unit derived from 2,3-dihydroxypropyl methacrylate, a constitutional unit derived from 3-(dimethylamino)propyl acrylate, and a constitutional unit derived from 3-(dimethylamino)propyl methacrylate.

The constitutional unit represented by the formula (3) is a constitutional unit derived from maleic anhydride.

The polymer (1) may include two or more types of the constitutional unit (C), and, for example, may be a polymer including a constitutional unit derived from methyl acrylate, a constitutional unit derived from ethyl acrylate, and a constitutional unit derived from glycidyl methacrylate.

The polymer (1) is preferably a polymer including the constitutional unit (B) represented by the formula (1).

Examples of the polymer including the constitutional unit (B) represented by the formula (1) include:
a polymer (1) consisting of the constitutional unit (B);
a polymer (1) including the constitutional unit (B) and the constitutional unit (A);
a polymer (1) including the constitutional unit (B) and the constitutional unit (C); and
a polymer (1) including the constitutional unit (B), the constitutional unit (A), and the constitutional unit (C).

Examples of the polymer (1) consisting of the constitutional unit (B) include:
a polymer consisting of a constitutional unit (B) represented by the formula (1) in which R is a hydrogen atom, $L^1$, $L^2$, and $L^3$ are each a single bond, and $L^6$ is an alkyl group having 14 or more and 30 or less carbon atoms; and
a polymer consisting of a constitutional unit (B) represented by the formula (1) in which R is a hydrogen atom or a methyl group, $L^1$ is —CO—O—, $L^2$ and $L^3$ are each a single bond, and $L^6$ is an alkyl group having 14 or more and 30 or less carbon atoms.

Examples of the polymer (1) including the constitutional unit (B) and the constitutional unit (A) include:
a polymer including a constitutional unit (B) represented by the formula (1) in which R is a hydrogen atom, $L^1$, $L^2$, and $L^3$ are each a single bond, and $L^6$ is an alkyl group having 14 or more and 30 or less carbon atoms, and the constitutional unit (A), wherein the proportion of the number of the constitutional unit (A) and the constitutional unit (B) in total is 90% or more, with respect to 100% of the total number of all constitutional units included in the polymer, and
a polymer including a constitutional unit (B) in which R is a hydrogen atom or a methyl group, $L^1$ is —CO—O—, $L^2$ and $L^3$ are each a single bond, and $L^6$ is an alkyl group having 14 or more and 30 or less carbon atoms, and the constitutional unit (A), and optionally including the constitutional unit (C), wherein the proportion of the number of the constitutional unit (A) and the constitutional unit (B) in total is 90% or more, with respect to 100% of the total number of all constitutional units included in the polymer.

It is preferable for increase of $\Delta H$ that the polymer (1) be a polymer such that the proportion of the number of the constitutional unit (B) is more than 50% and 80% or less, with respect to 100% of the total number of the constitutional unit (B) and the constitutional unit (A) included in the polymer.

It is preferable for formability that the polymer (1) be a polymer such that the proportion of the number of the constitutional unit (B) is 10% or more and 50% or less, with respect to 100% of the total number of the constitutional unit (B) and the constitutional unit (A) included in the polymer.

Examples of the polymer (1) including the constitutional unit (B) and the constitutional unit (C) include:
a polymer including a constitutional unit (B) represented by the formula (1) in which R is a hydrogen atom or a methyl group, $L^1$ is —CO—O—, $L^2$ and $L^3$ are each a single bond, and $L^6$ is an alkyl group having 14 or more and 30 or less carbon atoms, and a constitutional unit (C) represented by the formula (2) in which R is a hydrogen atom or a methyl group, $L^1$ is —CO—O—, $L^4$ is a methylene group, and $L^5$ is a hydrogen atom. In this case, a polymer is preferred such that the proportion of the number of the constitutional unit (B) is 80% or more, with respect to 100% of the total number of the constitutional unit (B) and the constitutional unit (C) included in the polymer.

In the polymer (1), the proportion of the number of the constitutional unit (A) is usually 0% or more and 99% or less and the proportion of the number of the constitutional unit (B) and the constitutional unit (C) in total is usually 1% or more and 100% or less, with respect to 100% of the total number of the constitutional unit (A), the constitutional unit (B), and the constitutional unit (C); and the proportion of the number of the constitutional unit (B) is usually 1% or more and 100% or less and the proportion of the number of the constitutional unit (C) is usually 0% or more and 99% or less, with respect to 100% of the total number of the constitutional unit (B) and the constitutional unit (C).

For imparting good shape retention to a molded article comprising the resin composition according to the present invention, the proportion of the number of the constitutional unit (A) in the polymer (1) is preferably 70% or more and 99% or less, more preferably 80% or more and 97.5% or less, and even more preferably 85% or more and 92.5% or less, with respect to 100% of the total number of the constitutional unit (A), the constitutional unit (B), and the constitutional unit (C). For imparting good shape retention to a molded article comprising the resin composition according to the present invention, the proportion of the number of the constitutional unit (B) and the constitutional unit (C) in total in the polymer (1) is preferably 1% or more and 30% or less, more preferably 2.5% or more and 20% or less, and even more preferably 7.5% or more and 15% or less, with respect to 100% of the total number of the constitutional unit (A), the constitutional unit (B), and the constitutional unit (C).

The proportion of the number of the constitutional unit (B) in the polymer (1) is typically 1% or more and 100% or less, and preferably 60% or more and 100% or less, and more preferably 80% or more and 100% or less, with respect to 100% of the total number of the constitutional unit (B) and the constitutional unit (C), for imparting good heat storage performance to the resin composition containing the polymer (1). The proportion of the number of the constitutional unit (C) in the polymer (1) is typically 0% or more and 99% or less, and is preferably 0% or more and 40% or less, and more preferably 0% or more and 20% or less, with respect to 100% of the total number of the constitutional unit (B) and the constitutional unit (C), for imparting good heat storage performance to the resin composition containing the polymer (1).

Each of the proportion of the number of the constitutional unit (A), the proportion of the number of the constitutional unit (B), and the proportion of the number of the constitutional unit (C) can be determined from an integrated value for a signal attributed to the corresponding constitutional unit in a $^{13}C$ nuclear magnetic resonance spectrum (hereinafter, referred to as "$^{13}C$-NMR spectrum") or a $^{1}H$ nuclear magnetic resonance spectrum (hereinafter, referred to as "$^{1}H$-NMR spectrum") determined by using a well-known method.

If the polymer (1) is a polymer produced, as described later, by using a method of reacting a polymer including at least one constitutional unit (C) selected from the group consisting of the constitutional unit represented by the above formula (2) and the constitutional unit represented by the above formula (3), and optionally including the constitutional unit (A) derived from ethylene (hereinafter, referred to as "precursor polymer (1)") and at least one compound (α) described later, each of the proportion of the number of the constitutional unit (A), the proportion of the number of the constitutional unit (B), and the proportion of the number of the constitutional unit (C) can be determined, for example, in the following manner.

If the precursor polymer (1) includes the constitutional unit (A) derived from ethylene, the proportions of the number of the constitutional unit (A) and the constitutional unit (C) included in the precursor polymer (1) are first determined. In determining from a $^{13}C$-NMR spectrum, for example, the proportions of the number of dyads of the constitutional unit (A) and the constitutional unit (C) (AA, AC, CC) are determined from the spectrum, and substituted into the following formula to determine the proportions of the number of the constitutional unit (A) and the constitutional unit (C). Here, AA represents a constitutional unit (A)-constitutional unit (A) dyad, AC represents a constitutional unit (A)-constitutional unit (C) dyad, and CC represents a constitutional unit (C)-constitutional unit (C) dyad.

Proportion of the number of constitutional unit (A)=100−proportion of the number of constitutional unit (C)

Proportion of the number of constitutional unit (C)=100×(AC/2+CC)/(AA+AC+CC)

Because the constitutional unit (B) in the polymer (1) is formed through reaction between the constitutional unit (C) included in the precursor polymer (1) and the compound (α), the conversion rate of the constitutional unit (C) in the reaction is determined in the following manner.

An integrated value for a signal attributed to a specific carbon included in the side chain of the constitutional unit (C) in the precursor polymer (1) (hereinafter, referred to as "integrated value Y") and an integrated value for a signal attributed to a specific carbon included in the side chain of the constitutional unit (B) in the polymer (1) (hereinafter, referred to as "integrated value Z") are substituted into the following formula to determine the conversion rate.

Conversion rate=Z/(Y+Z)

The proportion of the number of the constitutional unit (A) included in the polymer (1) is assumed to be identical to the proportion of the number of the constitutional unit (A) included in the precursor polymer (1) because the constitutional unit (A) included in the precursor polymer (1) remains unchanged after the reaction between the precursor polymer (1) and the compound (α). The proportion of the number of the constitutional unit (B) included in the polymer (1) is determined as the product of the proportion of the number of the constitutional unit (C) included in the precursor polymer (1) and the conversion rate. The proportion of the number of the constitutional unit (C) included in the polymer (1) is determined as the difference between the proportion of the number of the constitutional unit (C) included in the precursor polymer (1) and the proportion of the number of the constitutional unit (B) included in the polymer (1).

The precursor polymer (1) can be, in an example, a polymer including at least one constitutional unit (C) selected from the group consisting of the constitutional unit represented by the above formula (2) and the constitutional unit represented by the above formula (3), provided that $L^1$ in the formula (2) is —CO—O—, —O—CO—, or —O—.

Examples of methods for producing the polymer (1) include: a method of reacting the precursor polymer (1) and at least one compound (hereinafter, referred to as "compound (α)") selected from the group consisting of alcohol including an alkyl group having 14 or more and 30 or less carbon atoms, amine including an alkyl group having 14 or more and 30 or less carbon atoms, alkyl halide including an alkyl group having 14 or more and 30 or less carbon atoms, carboxylic acid including an alkyl group having 14 or more and 30 or less carbon atoms, carboxamide including an alkyl group having 14 or more and 30 or less carbon atoms, carboxylic acid halide including an alkyl group having 14 or more and 30 or less carbon atoms, carbamic acid including an alkyl group having 14 or more and 30 or less carbon atoms, alkylurea including an alkyl group having 14 or more and 30 or less carbon atoms, and isocyanate including an alkyl group having 14 or more and 30 or less carbon atoms; a method of polymerizing a monomer to serve as a raw material of the constitutional unit (B); or a method of copolymerizing ethylene and a monomer to serve as a raw material of the constitutional unit (B). The alkyl group of the compound (α) may be, for example, a linear alkyl group or a branched alkyl group, though it is preferable that the alkyl group be a linear alkyl group.

The precursor polymer (1) is a raw material for production of the polymer (1), and the precursor polymer (1) does not include the constitutional unit (B) represented by the formula (1). The precursor polymer (1) may include a constitutional unit corresponding to none of the constitutional unit (A), the constitutional unit (B), and the constitutional unit (C).

The precursor polymer (1) is preferably a polymer in which the proportion of the number of the constitutional unit (A) is 0% or more and 99% or less and the proportion of the number of the constitutional unit (C) in total is 1% or more and 100% or less with respect to 100% of the total number of the constitutional unit (A) and the constitutional unit (C), and more preferably a polymer in which the proportion of the number of the constitutional unit (A) is 70% or more and 99% or less and the proportion of the number of the constitutional unit (C) in total is 1% or more and 30% or less with respect to 100& of the total number of the constitutional unit (A) and the constitutional unit (C).

Examples of methods for forming the constitutional unit (B) in the polymer (1) include: a method of reacting the constitutional unit (C) included in the precursor polymer (1) and the compound (α); a method of polymerizing a monomer to serve as a raw material of the constitutional unit (B); or a method of copolymerizing ethylene and a monomer to serve as a raw material of the constitutional unit (B). It is preferable that the alkyl group of the compound (α) be a linear alkyl group. A polymerization initiator such as an azo compound may be used in the methods of polymerizing a monomer. Examples of the azo compound include azobisisobutyronitrile.

Examples of the precursor polymer (1) include acrylic acid polymer, methacrylic acid polymer, vinyl alcohol polymer, methyl acrylate polymer, ethyl acrylate polymer, n-propyl acrylate polymer, n-butyl acrylate polymer, methyl methacrylate polymer, ethyl methacrylate polymer, n-propyl methacrylate polymer, n-butyl methacrylate polymer, vinyl formate polymer, vinyl acetate polymer, vinyl propionate polymer, vinyl(n-butyrate) polymer, methyl vinyl ether polymer, ethyl vinyl ether polymer, n-propyl vinyl ether polymer, n-butyl vinyl ether polymer, maleic anhydride polymer, glycidyl acrylate polymer, glycidyl methacrylate polymer, 3-(dimethylamino)propyl acrylate polymer, 3-(dimethylamino)propyl methacrylate polymer, ethylene-acrylic acid copolymer, ethylene-methacrylic acid copolymer, ethylene-vinyl alcohol copolymer, ethylene-methyl acrylate copolymer, ethylene-ethyl acrylate copolymer, ethylene-n-propyl acrylate copolymer, ethylene-n-butyl acrylate copolymer, ethylene-methyl methacrylate copolymer, ethylene-ethyl methacrylate copolymer, ethylene-n-propyl methacrylate copolymer, ethylene-n-butyl methacrylate copolymer, ethylene-vinyl formate copolymer, ethylene-vinyl acetate copolymer, ethylene-vinyl propionate copolymer, ethylene-vinyl(n-butyrate) copolymer, ethylene-methyl vinyl ether copolymer, ethylene-ethyl vinyl ether copolymer, ethylene-n-propyl vinyl ether copolymer, ethylene-n-butyl vinyl ether copolymer, ethylene-maleic anhydride copolymer, ethylene-glycidyl acrylate copolymer, ethylene-glycidyl methacrylate copolymer, ethylene-3-(dimethylamino) propyl acrylate copolymer, and ethylene-3-(dimethylamino) propyl methacrylate copolymer.

Examples of the alcohol including a linear alkyl group having 14 or more and 30 or less carbon atoms include n-tetradecyl alcohol, n-pentadecyl alcohol, n-hexadecyl alcohol, n-heptadecyl alcohol, n-octadecyl alcohol, n-nonadecyl alcohol, n-eicosyl alcohol, n-heneicosyl alcohol, n-docosyl alcohol, n-tricosyl alcohol, n-tetracosyl alcohol, n-pentacosyl alcohol, n-hexacosyl alcohol, n-heptacosyl alcohol, n-octacosyl alcohol, n-nonacosyl alcohol, and n-triacontyl alcohol.

Examples of the alcohol including a branched alkyl group having 14 or more and 30 or less carbon atoms include isotetradecyl alcohol, isopentadecyl alcohol, isohexadecyl alcohol, isoheptadecyl alcohol, isooctadecyl alcohol, isononadecyl alcohol, isoeicosyl alcohol, isoheneicosyl alcohol, isodocosyl alcohol, isotricosyl alcohol, isotetracosyl alcohol, isopentacosyl alcohol, isohexacosyl alcohol, isoheptacosyl alcohol, isooctacosyl alcohol, isononacosyl alcohol, and isotriacontyl alcohol.

Examples of the amine including a linear alkyl group having 14 or more and 30 or less carbon atoms include n-tetradecylamine, n-pentadecylamine, n-hexadecylamine, n-heptadecylamine, n-octadecylamine, n-nonadecylamine, n-eicosylamine, n-heneicosylamine, n-docosylamine, n-tricosylamine, n-tetracosylamine, n-pentacosylamine, n-hexacosylamine, n-heptacosylamine, n-octacosylamine, n-nonacosylamine, and n-triacontylamine.

Examples of the amine including a branched alkyl group having 14 or more and 30 or less carbon atoms include isotetradecylamine, isopentadecylamine, isohexadecylamine, isoheptadecylamine, isooctadecylamine, isononadecylamine, isoeicosylamine, isoheneicosylamine, isodocosylamine, isotricosylamine, isotetracosylamine, isopentacosylamine, isohexacosylamine, isoheptacosylamine, isooctacosylamine, isononacosylamine, and isotriacontylamine.

Examples of the alkyl halide including a linear alkyl group having 14 or more and 30 or less carbon atoms include n-tetradecyl iodide, n-pentadecyl iodide, n-hexadecyl iodide, n-heptadecyl iodide, n-octadecyl iodide, n-nonadecyl iodide, n-eicosyl iodide, n-heneicosyl iodide, n-docosyl iodide, n-tricosyl iodide, n-tetracosyl iodide, n-pentacosyl iodide, n-hexacosyl iodide, n-heptacosyl iodide, n-octacosyl iodide, n-nonacosyl iodide, and n-triacontyl iodide.

Examples of the alkyl halide including a branched alkyl group having 14 or more and 30 or less carbon atoms include isotetradecyl iodide, isopentadecyl iodide, isohexadecyl iodide, isoheptadecyl iodide, isooctadecyl iodide, isononadecyl iodide, isoeicosyl iodide, isoheneicosyl iodide, isodocosyl iodide, isotricosyl iodide, isotetracosyl iodide, isopentacosyl iodide, isohexacosyl iodide, isoheptacosyl iodide, isooctacosyl iodide, isononacosyl iodide, and isotriacontyl iodide.

Examples of the carboxylic acid including a linear alkyl group having 14 or more and 30 or less carbon atoms include n-tetradecanoic acid, n-pentadecanoic acid, n-hexadecanoic acid, n-heptadecanoic acid, n-octadecanoic acid, n-nonadecanoic acid, n-eicosanoic acid, n-heneicosanoic acid, n-docosanoic acid, n-tricosanoic acid, n-tetracosanoic acid, n-pentacosanoic acid, n-hexacosanoic acid, n-heptacosanoic acid, n-octacosanoic acid, n-nonacosanoic acid, and n-triacontanoic acid.

Examples of the carboxylic acid including a branched alkyl group having 14 or more and 30 or less carbon atoms include isotetradecanoic acid, isopentadecanoic acid, isohexadecanoic acid, isoheptadecanoic acid, isooctadecanoic acid, isononadecanoic acid, isoeicosanoic acid, isoheneicosanoic acid, isodocosanoic acid, isotricosanoic acid, isotetracosanoic acid, isopentacosanoic acid, isohexacosanoic acid, isoheptacosanoic acid, isooctacosanoic acid, isononacosanoic acid, and isotriacontanoic acid.

Examples of the carboxamide including a linear alkyl group having 14 or more and 30 or less carbon atoms include n-tetradecanamide, n-pentadecanamide, n-hexadecanamide, n-heptadecanamide, n-octadecanamide, n-nonadecanamide, n-eicosanamide, n-heneicosanamide, n-docosanamide, n-tricosanamide, n-tetracosanamide, n-pentacosanamide, n-hexacosanamide, n-heptacosanamide, n-octacosanamide, n-nonacosanamide, and n-triacontanamide.

Examples of the carboxamide including a branched alkyl group having 14 or more and 30 or less carbon atoms include isotetradecanamide, isopentadecanamide, isohexadecanamide, isoheptadecanamide, isooctadecanamide, isononadecanamide, isoeicosanamide, isoheneicosanamide, isodocosanamide, isotricosanamide, isotetracosanamide, isopentacosanamide, isohexacosanamide, isoheptacosanamide, isooctacosanamide, isononacosanamide, and isotriacontanamide.

Examples of the carboxylic acid halide including a linear alkyl group having 14 or more and 30 or less carbon atoms include n-tetradecanoic acid chloride, n-pentadecanoic acid chloride, n-hexadecanoic acid chloride, n-heptadecanoic acid chloride, n-octadecanoic acid chloride, n-nonadecanoic acid chloride, n-eicosanoic acid chloride, n-heneicosanoic acid chloride, n-docosanoic acid chloride, n-tricosanoic acid chloride, n-tetracosanoic acid chloride, n-pentacosanoic acid chloride, n-hexacosanoic acid chloride, n-heptacosanoic acid chloride, n-octacosanoic acid chloride, n-nonacosanoic acid chloride, and n-triacontanoic acid chloride.

Examples of the carboxylic acid halide including a branched alkyl group having 14 or more and 30 or less carbon atoms include isotetradecanoic acid chloride, isopentadecanoic acid chloride, isohexadecanoic acid chloride, isoheptadecanoic acid chloride, isooctadecanoic acid chloride, isononadecanoic acid chloride, isoeicosanoic acid chloride, isoheneicosanoic acid chloride, isodocosanoic acid chloride, isotricosanoic acid chloride, isotetracosanoic acid chloride, isopentacosanoic acid chloride, isohexacosanoic acid chloride, isoheptacosanoic acid chloride, isooctacosanoic acid chloride, isononacosanoic acid chloride, and isotriacontanoic acid chloride.

Examples of the carbamic acid including a linear alkyl group having 14 or more and 30 or less carbon atoms include n-tetradecylcarbamic acid, n-pentadecylcarbamic acid, n-hexadecylcarbamic acid, n-heptadecylcarbamic acid, n-octadecylcarbamic acid, n-nonadecylcarbamic acid, n-eicosylcarbamic acid, n-heneicosylcarbamic acid, n-docosylcarbamic acid, n-tricosylcarbamic acid, n-tetracosylcarbamic acid, n-pentacosylcarbamic acid, n-hexacosylcarbamic acid, n-heptacosylcarbamic acid, n-octacosylcarbamic acid, n-nonacosylcarbamic acid, and n-triacontylcarbamic acid.

Examples of the carbamic acid including a branched alkyl group having 14 or more and 30 or less carbon atoms include isotetradecylcarbamic acid, isopentadecylcarbamic acid, isohexadecylcarbamic acid, isoheptadecylcarbamic acid, isooctadecylcarbamic acid, isononadecylcarbamic acid, isoeicosylcarbamic acid, isoheneicosylcarbamic acid, isodocosylcarbamic acid, isotricosylcarbamic acid, isotetracosylcarbamic acid, isopentacosylcarbamic acid, isohexacosylcarbamic acid, isobeptacosylcarbamic acid, isooctacosylcarbamic acid, isononacosylcarbamic acid, and isotriacontylcarbamic acid.

Examples of the alkylurea including a linear alkyl group having 14 or more and 30 or less carbon atoms include n-tetradecylurea, n-pentadecylurea, n-hexadecylurea, n-heptadecylurea, n-octadecylurea, n-nonadecylurea, n-eicosylurea, n-heneicosylurea, n-docosylurea, n-tricosylurea, n-tetracosylurea, n-pentacosylurea, n-hexacosylurea, n-heptacosylurea, n-octacosylurea, n-nonacosylurea, and n-triacontylurea.

Examples of the alkylurea including a branched alkyl group having 14 or more and 30 or less carbon atoms include isotetradecylurea, isopentadecylurea, isohexadecylurea, isoheptadecylurea, isooctadecylurea, isononadecylurea, isoeicosylurea, isoheneicosylurea, isodocosylurea, isotricosylurea, isotetracosylurea, isopentacosylurea, isohexacosylurea, isoheptacosylurea, isooctacosylurea, isononacosylurea, and isotriacontylurea.

Examples of the isocyanate including a linear alkyl group having 14 or more and 30 or less carbon atoms include n-tetradecyl isocyanate, n-pentadecyl isocyanate, n-hexadecyl isocyanate, n-heptadecyl isocyanate, n-octadecyl isocyanate, n-nonadecyl isocyanate, n-eicosyl isocyanate, n-heneicosyl isocyanate, n-docosyl isocyanate, n-tricosyl isocyanate, n-tetracosyl isocyanate, n-pentacosyl isocyanate, n-hexacosyl isocyanate, n-heptacosyl isocyanate, n-octacosyl isocyanate, n-nonacosyl isocyanate, and n-triacontyl isocyanate.

Examples of the isocyanate including a branched alkyl group having 14 or more and 30 or less carbon atoms include isotetradecyl isocyanate, isopentadecyl isocyanate, isohexadecyl isocyanate, isoheptadecyl isocyanate, isooctadecyl isocyanate, isononadecyl isocyanate, isoeicosyl isocyanate, isoheneicosyl isocyanate, isodocosyl isocyanate, isotricosyl isocyanate, isotetracosyl isocyanate, isopentacosyl isocyanate, isohexacosyl isocyanate, isoheptacosyl isocyanate, isooctacosyl isocyanate, isononacosyl isocyanate, and isotriacontyl isocyanate.

If the precursor polymer (1) includes the constitutional unit (A) derived from ethylene, the product of reactivity ratios, r1r2, where r1 represents the reactivity ratio of ethylene to be used as a raw material in production of the precursor polymer (1), and r2 represents the reactivity ratio of a monomer to form the constitutional unit (C), is preferably 0.5 or higher and 5.0 or lower, and more preferably 0.5 or higher and 3.0 or lower, for imparting good shape retention to the resin composition (for example, heat storage material) containing the precursor polymer (1).

The reactivity ratio of ethylene, r1, is a value defined as the formula r1=k11/k12 in copolymerizing ethylene and a monomer to form the constitutional unit (C), where k11 represents the reaction rate of ethylene to bond to a polymer including the constitutional unit (A) at an end, and k12 represents the reaction rate of the monomer to form the constitutional unit (C) to bond to the polymer including the constitutional unit (A) at an end. The reactivity ratio, r1, is an index indicative of which of ethylene and a monomer to form the constitutional unit (C) a polymer including the constitutional unit (A) at an end is more reactive with in copolymerizing ethylene and a monomer to form the constitutional unit (C). Higher r1 indicates that the polymer including the constitutional unit (A) at an end is more reactive with ethylene, and a chain of the constitutional unit (A) is likely to be generated.

The reactivity ratio of a monomer to form the constitutional unit (C), r2, is a value defined as r2=k22/k21 in copolymerizing ethylene and a monomer to form the constitutional unit (C), where k21 represents the reaction rate of ethylene to bond to a polymer including the constitutional unit (C) at an end, and k22 represents the reaction rate of the monomer to form the constitutional unit (C) to bond to the polymer including the constitutional unit (C) at an end. The reactivity ratio, r2, is an index indicative of which of ethylene and a monomer to form the constitutional unit (C) a polymer including the constitutional unit (C) at an end is more reactive with in copolymerizing ethylene and a monomer to form the constitutional unit (C). Higher r2 indicates that the polymer including the constitutional unit (C) at an end is more reactive with the monomer to form the constitutional unit (C), and a chain of the constitutional unit (C) is likely to be generated.

The product of the reactivity ratios, r1r2, is calculated by using a method described in the literature "Kakugo, M.; Naito, Y.; Mizunuma, K.; Miyatake, T. Macromolecules, 1982, 15, 1150". In the present invention, the product of the reactivity ratios, r1r2, is obtained by substituting the proportions of the number of dyads of the constitutional unit (A) and the constitutional unit (C), namely, AA, AC, and CC, calculated from a $^{13}$C nuclear magnetic resonance spectrum for the precursor polymer (1) into the following formula.

$$r1r2=AA[CC/(AC/2)^2]$$

The product of the reactivity ratios, r1r2, is an index indicative of the monomer chain distribution of a copolymer. The monomer chain distribution of a copolymer has higher randomness as the r1r2 is closer to 1, and the monomer chain distribution of a copolymer has a higher degree of alternating copolymerization character as the r1r2 is closer to 0, and the monomer chain distribution of a copolymer has a higher degree of block copolymerization character as the r1r2 is larger beyond 1.

The melt flow rate (MFR) of the precursor polymer (1) as measured in accordance with JIS K7210 at a temperature of 190° C. with a load of 21 N is preferably 0.1 g/10 min or higher and 500 g/10 min or lower.

Examples of methods for producing the precursor polymer (1) include a coordination polymerization method, a cationic polymerization method, an anionic polymerization method, and a radical polymerization method, and a radical polymerization method is preferred, and a radical polymerization method under high pressure is more preferred.

The reaction temperature for reacting the precursor polymer (1) and the at least one compound (α) is typically 40° C. or higher and 250° C. or lower. This reaction may be performed in the presence of a solvent, and examples of the solvent include hexane, heptane, octane, nonane, decane, toluene, and xylene. If any byproduct is generated in this reaction, the reaction may be performed while the byproduct is distilled off under reduced pressure to promote the reaction, or performed while the byproduct is azeotroped with the solvent, the volatilized byproduct and the solvent are cooled, the distillate containing the byproduct and the solvent is separated into a byproduct layer and a solvent layer, and only the recovered solvent is returned as a reflux solution into the reaction system.

The reaction between the precursor polymer (1) and the at least one compound (α) may be performed while the precursor polymer (1) and the compound (α) are melt-kneaded together. If any byproduct is generated in reacting the precursor polymer (1) and the compound (α) with melt-kneading, the reaction may be performed while the byproduct is distilled off under reduced pressure to promote the reaction. Examples of the melt-kneading apparatus for the melt-kneading include apparatuses including a single-screw extruder, a twin-screw extruder, and a Banbury mixer. The temperature of the melt-kneading apparatus is preferably 100° C. or higher and 250° C. or lower.

In reacting the precursor polymer (1) and the at least one compound (α), a catalyst may be added to promote the reaction. Examples of the catalyst include alkali metal salts and group 4 metal complexes. Examples of alkali metal salts include alkali metal hydroxides such as lithium hydroxide, sodium hydroxide, and potassium hydroxide; and alkali metal alkoxides such as lithium methoxide and sodium methoxide. Examples of group 4 metal complexes include tetra(isopropyl) orthotitanate, tetra(n-butyl) orthotitanate, and tetraoctadecyl orthotitanate. It is preferable that the loading of the catalyst be 0.01 parts by weight or more and 50 parts by weight or less with respect to 100 parts by weight of the total amount of the precursor polymer (1) and the at least one compound (α) to be used for the reaction, and the loading is more preferably 0.01 parts by weight or more and 5 parts by weight or less.

The polymer (1) preferably includes the constitutional unit (A) derived from ethylene for imparting good shape retention to the molded article according to the present invention and good formability to the resin composition containing the polymer (1) at temperatures equal to or higher than the melting peak temperature of the polymer (1). More preferably, the constitutional unit (A) derived from ethylene is forming a branched structure in the polymer for imparting good blow moldability and good foam moldability to the resin composition containing the polymer (1), and the branched structure is preferably a long chain branched structure to a degree allowing polymer chains in the branched structure to tangle together.

The ratio defined for the polymer (1) as the following formula (I), A, is preferably 0.95 or lower, more preferably 0.90 or lower, and even more preferably 0.80 or lower:

$$A=\alpha_1/\alpha_0 \quad (I)$$

In the formula (I), $\alpha_1$ represents a value obtained by using a method including: measuring the absolute molecular weight and intrinsic viscosity of a polymer through gel permeation chromatography with an apparatus including a light scattering detector and a viscosity detector, plotting measurements in a manner such that logarithms of the absolute molecular weight are plotted on an abscissa and logarithms of the intrinsic viscosity are plotted on an ordinate; and performing least squares approximation for the logarithms of the absolute molecular weight and the logarithms of the intrinsic viscosity by using a formula (I-I) within the range of the logarithm of the weight-average molecular weight of the polymer or more and the logarithm of the z-average molecular weight of the polymer or less along the abscissa to derive the slope of the line representing the formula (I-I) as $\alpha_1$:

$$\log[\eta_1]=\alpha_1 \log M_1+\log K_1 \quad \text{(I-I)}$$

wherein $[\eta_1]$ represents the intrinsic viscosity (unit: dl/g) of the polymer, $M_1$ represents the absolute molecular weight of the polymer, and $K_1$ represents a constant.

In the formula (I), $\alpha_0$ represents a value obtained by using a method including: measuring the absolute molecular weight and intrinsic viscosity of Polyethylene Standard Reference Material 1475a (produced by National Institute of Standards and Technology) through gel permeation chromatography with an apparatus including a light scattering detector and a viscosity detector, plotting measurements in a manner such that logarithms of the absolute molecular weight are plotted on an abscissa and logarithms of the intrinsic viscosity are plotted on an ordinate; and performing least squares approximation for the logarithms of the absolute molecular weight and the logarithms of the intrinsic viscosity by using a formula (I-II) within the range of the logarithm of the weight-average molecular weight of the Polyethylene Standard Reference Material 1475a or more and the logarithm of the z-average molecular weight of the Polyethylene Standard Reference Material 1475a or less along the abscissa to derive the slope of the line representing the formula (I-II) as $\alpha_0$:

$$\log[\eta_0]=\alpha_0 \log M_0+\log K_0 \quad \text{(I-II)}$$

wherein

[η₀] represents the intrinsic viscosity (unit: dl/g) of the Polyethylene Standard Reference Material 1475a, $M_0$ represents the absolute molecular weight of the Polyethylene Standard Reference Material 1475a, and $K_0$ represents a constant.

Here, in measurement of absolute molecular weight and intrinsic viscosity for the polymer and the Polyethylene Standard Reference Material 1475a by gel permeation chromatography, the mobile phase is ortho-dichlorobenzene and the measurement temperature is 155° C.

In determining absolute molecular weight from data acquired with the light scattering detector and determining intrinsic viscosity ([η]) with the viscosity detector, calculation is made by using the data processing software OmniSEC (version 4.7) from Malvern Instruments Limited with reference to the literature "Size Exclusion Chromatography, Springer (1999)".

The Polyethylene Standard Reference Material 1475a (produced by National Institute of Standards and Technology) is an unbranched high-density polyethylene. Each of the formula (I-I) and the formula (I-II), which is called "Mark-Hauwink-Sakurada equation", represents the correlation between the intrinsic viscosity and molecular weight of a polymer, and the smaller the $\alpha_1$, the larger the number of tangling polymer chains in a branched structure. Since no branched structure is formed in the Polyethylene Standard Reference Material 1475a, tangling of polymer chains in a branched structure is not generated. The smaller the A, which is the ratio of $\alpha_1$ to $\alpha_0$ of the Polyethylene Standard Reference Material 1475a, the larger the fraction of a long chain branched structure formed by the constitutional unit (A) in a polymer.

The weight-average molecular weight of the polymer (1) as measured through gel permeation chromatography with an apparatus including a light scattering detector is preferably 10000 to 1000000, more preferably 50000 to 750000, and even more preferably 100000 to 500000.

In measurement of the weight-average molecular weight of the polymer (1) through gel permeation chromatography, the mobile phase is ortho-dichlorobenzene, and the measurement temperature is 155° C.

For a more reduced load of extrusion in molding, the flow activation energy ($E_a$) of the polymer (1) is preferably 40 kJ/mol or higher, more preferably 50 kJ/mol or higher, and even more preferably 60 kJ/mol or higher. For imparting good appearance to a molded article to be obtained by extrusion, $E_a$ is preferably 100 kJ/mol or lower, more preferably 90 kJ/mol or lower, and even more preferably 80 kJ/mol or lower. The magnitude of $E_a$ primarily depends on the number of long chain branches in a polymer. A polymer including a larger number of long chain branches has higher $E_a$.

The flow activation energy ($E_a$) is determined in the following manner. First, three or more temperatures including 170° C. are selected from temperatures of 90° C., 110° C., 130° C., 150° C., and 170° C., and a melt complex viscosity-angular frequency curve is determined for a polymer at each of the temperatures T (unit: ° C.). The melt complex viscosity-angular frequency curve is a log-log curve with logarithms of melt complex viscosities (unit: Pa·sec) on the ordinate and logarithms of angular frequencies (unit: rad/sec) on the abscissa. Next, angular frequencies and melt complex viscosities in each of the melt complex viscosity-angular frequency curves determined at the temperatures other than 170° C. are multiplied by $a_T$ and $1/a_T$, respectively, so that each of the melt complex viscosity-angular frequency curves fits just to the melt complex viscosity-angular frequency curve at 170° C. $a_T$ is a value appropriately determined so that a melt complex viscosity-angular frequency curves determined at a temperature other than 170° C. fits just to the melt complex viscosity-angular frequency curve at 170° C.

The $a_T$ is a value commonly referred to as "shift factor" and varies depending on the temperature to determine a melt complex viscosity-angular frequency curve.

Subsequently, [ln($a_T$)] and [1/(T+273.16)] are determined for each temperature (T), and [ln($a_T$)] and [1/(T+273.16)] are subjected to least squares approximation by using the following formula (II) to determine the slope, m, of the line representing the formula (II). The m is substituted into the following formula (III) to determine $E_a$.

$$\ln(a_T) = m(1/(T+273.16)) + n \quad \text{(II)}$$

$$E_a = |0.008314 \times m| \quad \text{(III)}$$

$a_T$: shift factor
$E_a$: flow activation energy (unit: kJ/mol)
T: temperature (unit: ° C.)

Commercially available calculation software may be used for the calculation, and examples of the calculation software include Ochestrator produced by TA Instruments, Inc.

The above method is based on the following principle.

It is known that melt complex viscosity-angular frequency curves (log-log curves) determined at different temperatures fit just to one parent curve (referred to as "master curve") by translation of specific distances, and this is termed "temperature-time superposition principle". The distance of translation, termed "shift factor", is a value depending on temperature, and the temperature dependence of the shift factor is known to be represented by the above formulas (II) and (III), and the formulas (II) and (III) are each called "Arrhenius-type equation".

The correlation coefficient in least squares approximation of [ln($a_T$)] and [1/(T+273.16)] by using the above formula (II) is controlled to be 0.9 or higher.

The determination of melt complex viscosity-angular frequency curves is performed by using a viscoelastometer (e.g., ARES, produced by TA Instruments, Inc.) typically under conditions of geometry: parallel plates, plate diameter: 25 mm, plate interval: 1.2 to 2 mm, strain: 5%, angular frequency: 0.1 to 100 rad/sec. The determination is performed under nitrogen atmosphere. It is preferable to blend in advance a proper quantity (e.g., 1000 ppm by weight) of an antioxidant to a measurement sample.

The elongational viscosity nonlinear index, k, of the polymer (1), as an indicator of intensity of strain hardening, is preferably 0.85 or higher, more preferably 0.90 or higher, and even more preferably 0.95 or higher, for excellent formability such as reduced neck-in or reduced unevenness of thickness in a resulting film in T-die film processing, and less foam-breaking in foam molding. The strain hardening of a polymer is a phenomenon that the elongational viscosity of the polymer drastically increases when strain applied to the polymer exceeds a certain amount of strain. It is preferable for ease of formation of the polymer (1) or a resin composition of the present invention containing the polymer (1) into a desired shape that the index, k, be 2.00 or lower, and the index is more preferably 1.50 or lower, even more preferably 1.40 or lower, furthermore preferably 1.30 or lower, and particularly preferably 1.20 or lower.

The elongational viscosity nonlinear index, k, is determined in the following manner.

Determined are viscosity, $\eta_E 1(t)$, at each elongation time, t, during uniaxially elongating a polymer at a temperature of 110° C. and a strain rate of 1 sec$^{-1}$, and viscosity, $\eta_E 0.1(t)$, at each elongation time, t, during uniaxially elongating the polymer at a temperature of 110° C. and a strain rate of 0.1 sec$^{-1}$. The $\eta_E 1(t)$ and the $\eta_E 0.1(t)$ at the same, arbitrary elongation time, t, are substituted into the following formula to determine $\alpha(t)$.

$$\alpha(t) = \eta_E 1(t)/\eta_E 0.1(t)$$

Logarithms of $\alpha(t)$ (ln($\alpha(t)$)) are plotted against elongation time, t, and ln($\alpha(t)$) and t within the range of t from 2.0 seconds to 2.5 seconds are subjected to least squares approximation by using the following formula. The slope of the line representing the following formula is k.

$$\ln(\alpha(t)) = kt$$

Employed is k for the case that the correlation function, r2, used in least squares approximation based on the above formula is 0.9 or higher.

The measurement of viscosity in uniaxial elongation is performed by using a viscoelastometer (e.g., ARES, produced by TA Instruments, Inc.) under nitrogen atmosphere.

In measurement of elongational viscosity, polymers including a long chain branch have a tendency to undergo drastic increase of elongational viscosity beyond the linear regime in a high-strain region, what is called "strain hardening property". The logarithm of $\alpha(t)$ (ln($\alpha(t)$)) is known to increase in proportion to ln(l/l$_0$) for polymers having the strain hardening property (here, l$_0$ and l respectively represent the lengths of a sample at elongation times of 0 and t) [reference: Kiyohito Koyama, Osamu Ishizuka; Journal of Fiber Science and Technology, 37, T-258 (1981)]. For polymers having no strain hardening property, $\alpha(t)$ is 1 at any elongation time, and the slope, k, of a line obtained by plotting the logarithm of $\alpha(t)$ (ln($\alpha(t)$)) against elongation time is 0. For polymers having the strain hardening property, the slope, k, of the line plot is not 0, particularly in a high-strain region. In the present invention, k is defined as the slope of a line obtained by plotting the logarithm of the nonlinear parameter $\alpha(t)$ (ln($\alpha(t)$)) as a parameter indicative of the degree of the strain hardening property, against elongation time.

The polymer (1) may be forming a mixture with the compound ($\alpha$) left unreacted, or with a catalyst added to promote the reaction. It is preferable for preventing the polymer from adhering to a substrate of glass, metal, or another material that the content of the compound ($\alpha$) left unreacted in the mixture be less than 3 parts by weight with respect to 100 parts by weight of the polymer.

The polymer (1) may be a crosslinked polymer, or an uncrosslinked polymer.

In one mode, the polymer (1) is an uncrosslinked polymer (hereinafter, referred to as "polymer ($\alpha$)").

The polymer ($\alpha$) has a gel fraction, which is described later, of less than 20 wt %.

The polymer ($\alpha$) is a polymer in which the proportion of the number of the constitutional unit (A), the constitutional unit (B), and the constitutional unit (C) in total is preferably 90% or more, more preferably 95% or more, and even more preferably 100%, with respect to 100% of the total number of all constitutional units included in the polymer.

<Crosslinked Polymer>

In one mode, the polymer (1) is crosslinked. Specifically, at least a part of molecules of the polymer (1) are linked together via intermolecular covalent bonding. The situation that "the polymer (1) is crosslinked" refers to one or both of a situation that the polymer (1) is intermolecularly linked via covalent bonding and a situation that the polymer (1) and a polymer different from the polymer (1) (described later) are intermolecularly linked via covalent bonding.

Examples of methods for crosslinking the polymer (1) include a method of crosslinking through irradiation with ionizing radiation and a method of crosslinking with an organic peroxide.

In crosslinking through irradiating the polymer (1) with ionizing radiation, the polymer ($\alpha$) molded into a desired shape in advance is typically irradiated with ionizing radiation. Any known method can be used for molding, and extrusion, injection molding, and press molding are preferred. The molded article to be irradiated with ionizing radiation may be a molded article containing the polymer (1) as the only polymer component, or a molded article of the resin composition containing the polymer (1) and a polymer different from the polymer (1). In the latter case, examples of the polymer different from the polymer (1) include a polymer (2) described later. In the case that the molded article contains the polymer (1) and the polymer (2), it is preferable that the content of the polymer (1) be 30 wt % or more and 99 wt % or less, with respect to 100 wt % of the total amount of the polymer (1) and the polymer (2).

Examples of ionizing radiation include $\alpha$-rays, $\beta$-rays, $\gamma$-rays, electron beams, neutron beams, and X-rays, and $\gamma$-rays from cobalt-60 and electron beams are preferred. In the case that the molded article containing the polymer is in the form of a sheet, at least one surface of the molded article in the form of a sheet can be suitably irradiated with ionizing radiation.

Irradiation with ionizing radiation is performed by using an ionizing radiation irradiator, and the dose is typically 5 to 300 kGy, and preferably 10 to 150 kGy. The polymer (1) can attain a higher degree of crosslinking with a dose lower than those in typical cases.

In obtaining the polymer (1) crosslinked through irradiation with ionizing radiation, a higher degree of crosslinking is achieved for the polymer (1) if the molded article to be irradiated with ionizing radiation contains a crosslinking aid. The crosslinking aid is for the purpose of increasing the degree of crosslinking of the polymer (1) to improve the mechanical properties, and a compound including a plurality of double bonds in the molecule is preferably used. Examples of the crosslinking aid include N,N'-m-phenylene bismaleimide, toluylene bismaleimide, triallyl isocyanurate, triallyl cyanurate, p-quinone dioxime, nitrobenzene, diphenylguanidine, divinylbenzene, ethylene glycol dimethacrylate, polyethylene glycol dimethacrylate, trimethylolpropane trimethacrylate, trimethylolpropane triacrylate, and allyl methacrylate. More than one of these crosslinking aids may be used in combination.

It is preferable that the loading of the crosslinking aid be 0.01 to 4.0 parts by weight with respect to 100 parts by weight of the total weight of the polymer (1) and the polymer different from the polymer (1) contained in the molded article to be irradiated with ionizing radiation, and it is more preferable that the loading of the crosslinking aid be 0.05 to 2.0 parts by weight.

Examples of the method of crosslinking with an organic peroxide include a method of crosslinking of the polymer ($\alpha$) by subjecting a resin composition containing the polymer ($\alpha$) and an organic peroxide to a known molding method involving heating. Examples of the known molding method involving heating include extrusion, injection molding, and press molding. The resin composition containing the polymer ($\alpha$) and an organic peroxide may contain the polymer (1) as the only resin component, or contain the polymer (1) and a polymer different from the polymer (1).

In the case that the resin composition containing the polymer (α) and an organic peroxide contains a polymer different from the polymer (1), examples of the polymer different from the polymer (1) include a polymer (2) described later, and it is preferable that the content of the polymer (1) be 30 wt % or more and 99 wt % or less with respect to 100 wt % of the total amount of the polymer (1) and the polymer (2).

In crosslinking with an organic peroxide, an organic peroxide having a decomposition temperature equal to or higher than the fluidizing temperature of the resin component contained in the composition containing the polymer (α) and an organic peroxide is suitably used, and preferred examples of the organic peroxide include dicumyl peroxide, 2,5-dimethyl-2,5-di-tert-butylperoxyhexane, 2,5-dimethyl-2,5-di-tert-butylperoxyhexyne, α,α-di-tert-butylperoxyisopropylbenzene, and tert-butylperoxy-2-ethylhexyl carbonate.

The crosslinked polymer (1) may contain a known additive, as necessary. Examples of the additive include flame retardants, antioxidants, weatherproofing agents, lubricants, anti-blocking agents, antistatics, anti-fogging agents, anti-drip agents, pigments, and fillers. These additives can be added through kneading with the polymer (1) before crosslinking.

The gel fraction of the crosslinked polymer (1) is preferably 20 wt % or more, more preferably 40 wt % or more, even more preferably 60 wt % or more, and particularly preferably 70 wt % or more. The gel fraction is indicative of the degree of crosslinking of a crosslinked polymer, and a situation that the gel fraction of a polymer is high indicates that the polymer has a higher degree of crosslinked structure and a more robust network structure is formed. If the gel fraction of a polymer is high, the polymer has high shape retention, and is unlikely to deform.

The gel fraction is determined in the following manner. Approximately 500 mg of a polymer and an empty mesh basket fabricated from a metal mesh (mesh size: 400 mesh) are weighed. The mesh basket encapsulating the polymer and 50 mL of xylene (Grade of Guaranteed reagent produced by KANTO CHEMICAL CO., INC., or an equivalent product; mixture of o-, m-, and p-xylenes and ethylbenzene, total weight of o-, m-, and p-xylenes: 85 wt % or more) are introduced into a 100 mL test tube, and subjected to heating extraction at 110° C. for 6 hours. After the extraction, the mesh basket with an extraction residue is removed from the test tube, and dried under reduced pressure by using a vacuum dryer at 80° C. for 8 hours, and the mesh basket with an extraction residue after drying is weighed. The gel weight is calculated from the difference in weight between the mesh basket with an extraction residue after drying and the mesh basket when being empty. The gel fraction (wt %) is calculated on the basis of the following formula.

Gel fraction=(Gel weight/Weight of measurement sample)×100

<Low-Molecular-Weight Compound (3)>

The resin composition according to the present invention comprises a low-molecular-weight compound (3) having enthalpy of fusion (ΔH) of 30 J/g or more observed in a temperature range of 0° C. or higher and lower than 100° C. in differential scanning calorimetry and having a molecular weight of 2000 or lower. The low-molecular-weight compound (3) may be any compound including one or more constitutional units (repeating units) in the molecule as long as the molecular weight is 2000 or lower. The molecular weight of the low-molecular-weight compound (3) is preferably 150 or higher and 500 or lower, more preferably 150 or higher and 400 or lower, and even more preferably 150 or higher and 300 or lower. The low-molecular-weight compound (3) may be a "polymer" such as a dimer. The enthalpy of fusion (ΔH) is preferably 100 J/g or more, and more preferably 150 J/g or more.

The melting peak temperature of the low-molecular-weight compound (3) observed in differential scanning calorimetry is in the range of 0° C. or higher and lower than 100° C., more preferably in the range of 10° C. or higher and lower than 40° C., and even more preferably in the range of 10° C. or higher and lower than 30° C. The melting peak temperature of the low-molecular-weight compound (3) is a temperature at a melting peak top determined through analysis of a melting curve acquired in differential scanning calorimetry described later by using a method in accordance with JIS K7121-1987, and a temperature at which heat of fusion absorbed is maximized.

It is preferable that the difference between the melting peak temperature (maximum crystal transition temperature) of the low-molecular-weight compound (3) contained in the resin composition and the melting peak temperature of the polymer (1) contained in the resin composition be in the range of 15° C. or smaller, it is more preferable that the difference be in the range of 10° C. or smaller, and it is even more preferable that the difference be in the range of 5° C. or smaller.

The offset temperature (a point of intersection between a tangent at an inflection point in the melting end point side of the melting curve and a base line) in the melting curve is preferably 10° C. or higher and lower than 110° C., more preferably 20° C. or higher and lower than 50° C., and even more preferably 20° C. or higher and lower than 40° C. A substance with a larger difference between the offset temperature and the melting peak temperature in the melting curve is a substance which exhibits heat storage effect in a broader temperature range.

It is preferable that the low-molecular-weight compound (3) be a low-molecular-weight compound including an alkyl group having 14 or more and 30 or less carbon atoms. Examples of the alkyl group having 14 or more and 30 or less carbon atoms include linear alkyl groups having 14 or more and 30 or less carbon atoms and branched alkyl groups having 14 or more and 30 or less carbon atoms. The alkyl group having 14 or more and 30 or less carbon atoms is preferably a linear alkyl group having 14 or more and 30 or less carbon atoms, more preferably a linear alkyl group having 14 or more and 24 or less carbon atoms, and even more preferably a linear alkyl group having 16 or more and 22 or less carbon atoms.

Examples of the linear alkyl group having 14 or more and 30 or less carbon atoms include an n-tetradecyl group, an n-pentadecyl group, an n-hexadecyl group, an n-heptadecyl group, an n-octadecyl group, an n-nonadecyl group, an n-eicosyl group, an n-heneicosyl group, an n-docosyl group, an n-tricosyl group, an n-tetracosyl group, an n-pentacosyl group, an n-hexacosyl group, an n-heptacosyl group, an n-octacosyl group, an n-nonacosyl group, and an n-triacontyl group.

Examples of the branched alkyl group having 14 or more and 30 or less carbon atoms include an isotetradecyl group, an isopentadecyl group, an isohexadecyl group, an isoheptadecyl group, an isooctadecyl group, an isononadecyl group, an isoeicosyl group, an isoheneicosyl group, an isodocosyl group, an isotricosyl group, an isotetracosyl group, an isopentacosyl group, an isohexacosyl group, an isoheptacosyl group, an isooctacosyl group, an isononacosyl group, and an isotriacontyl group.

The low-molecular-weight compound (3) is at least one heat storage substance selected from the group consisting of hydrocarbon, fatty acid, fatty acid salt, fatty acid ester, aliphatic ether, aliphatic ketone, aliphatic alcohol, and aliphatic amide. Moreover, two or more may be selected from the listed compounds and mixed together for the low-molecular-weight compound (3).

Linear saturated hydrocarbon, linear unsaturated hydrocarbon, branched saturated hydrocarbon, or branched unsaturated hydrocarbon can be preferably used for the hydrocarbon, and, linear saturated hydrocarbon is particularly preferred. Examples of linear saturated hydrocarbon include n-tetradecane, n-pentadecane, n-hexadecane, n-heptadecane, n-octadecane, n-nonadecane, n-eicosane, n-heneicosane, n-docosane, n-tricosane, n-tetracosane, n-pentacosane, n-hexacosane, n-peptacosane, n-octacosane, n-nonacosane, and n-triacontane. Hydrocarbon includes paraffin compounds.

Linear saturated fatty acid, linear unsaturated fatty acid, branched saturated fatty acid, or branched unsaturated fatty acid can be preferably used for the fatty acid, and linear saturated fatty acid is particularly preferred. Examples of linear saturated fatty acid include n-tetradecanoic acid, n-hexadecanoic acid, n-octadecanoic acid, n-eicosanoic acid, n-heneicosanoic acid, n-docosanoic acid, n-tricosanoic acid, n-tetracosanoic acid, n-pentacosanoic acid, n-hexacosanoic acid, n-peptacosanoic acid, n-octacosanoic acid, n-nonacosanoic acid, and n-triacontanoic acid.

Examples of the fatty acid salt include sodium salts, potassium salts, and ammonium salts of the above fatty acids.

Linear saturated fatty acid ester, linear unsaturated fatty acid ester, branched saturated fatty acid ester, or branched unsaturated fatty acid ester can be preferably used for the fatty acid ester, and linear saturated fatty acid ester is particularly preferred. Examples of linear saturated fatty acid ester include n-tetradecyl methanoate, n-hexadecyl methanoate, n-octadecyl methanoate, n-eicosyl methanoate, n-docosyl methanoate, n-tetracosyl methanoate, n-hexacosyl methanoate, n-octacosyl methanoate, n-triacontyl methanoate, n-tetradecyl ethanoate, n-hexadecyl ethanoate, n-octadecyl ethanoate, n-eicosyl ethanoate, n-docosyl ethanoate, n-tetracosyl ethanoate, n-hexacosyl ethanoate, n-octacosyl ethanoate, n-triacontyl ethanoate, n-tetradecyl propanoate, n-hexadecyl propanoate, n-octadecyl propanoate, n-eicosyl propanoate, n-docosyl propanoate, n-tetracosyl propanoate, n-hexacosyl propanoate, n-octacosyl propanoate, n-triacontyl propanoate, n-tetradecyl butanoate, n-hexadecyl butanoate, n-octadecyl butanoate, n-eicosyl butanoate, n-docosyl butanoate, n-tetracosyl butanoate, n-hexacosyl butanoate, n-octacosyl butanoate, n-triacontyl butanoate, n-tetradecyl pentanoate, n-hexadecyl pentanoate, n-octadecyl pentanoate, n-eicosyl pentanoate, n-docosyl pentanoate, n-tetracosyl pentanoate, n-hexacosyl pentanoate, n-octacosyl pentanoate, n-triacontyl pentanoate, n-tetradecyl hexanoate, n-hexadecyl hexanoate, n-octadecyl hexanoate, n-eicosyl hexanoate, n-docosyl hexanoate, n-tetracosyl hexanoate, n-hexacosyl hexanoate, n-octacosyl hexanoate, n-triacontyl hexanoate, n-tetradecyl heptanoate, n-hexadecyl heptanoate, n-octadecyl heptanoate, n-eicosyl heptanoate, n-docosyl heptanoate, n-tetracosyl heptanoate, n-hexacosyl heptanoate, n-octacosyl heptanoate, n-triacontyl heptanoate, n-tetradecyl octanoate, n-hexadecyl octanoate, n-octadecyl octanoate, n-eicosyl octanoate, n-docosyl octanoate, n-tetracosyl octanoate, n-hexacosyl octanoate, n-octacosyl octanoate, n-triacontyl octanoate, n-tetradecyl nonanate, n-hexadecyl nonanate, n-octadecyl nonanate, n-eicosyl nonanate, n-docosyl nonanate, n-tetracosyl nonanate, n-hexacosyl nonanate, n-octacosyl nonanate, n-triacontyl nonanate, n-tetradecyl decanoate, n-hexadecyl decanoate, n-octadecyl decanoate, n-eicosyl decanoate, n-docosyl decanoate, n-tetracosyl decanoate, n-hexacosyl decanoate, n-octacosyl decanoate, n-triacontyl decanoate, n-tetradecyl dodecanoate, n-hexadecyl dodecanoate, n-octadecyl dodecanoate, n-eicosyl dodecanoate, n-docosyl dodecanoate, n-tetracosyl dodecanoate, n-hexacosyl dodecanoate, n-octacosyl dodecanoate, n-triacontyl dodecanoate, n-methyl tetradecanoate, n-ethyl tetradecanoate, n-propyl tetradecanoate, n-butyl tetradecanoate, n-pentyl tetradecanoate, n-hexyl tetradecanoate, n-heptyl tetradecanoate, n-octyl tetradecanoate, n-nonyl tetradecanoate, n-decyl tetradecanoate, n-dodecyl tetradecanoate, n-tetradecyl hexadecanoate, n-hexadecyl tetradecanoate, n-octadecyl tetradecanoate, n-eicosyl tetradecanoate, n-docosyl tetradecanoate, n-tetracosyl tetradecanoate, n-hexacosyl tetradecanoate, n-octacosyl tetradecanoate, n-triacontyl tetradecanoate, n-methyl hexadecanoate, n-ethyl hexadecanoate, n-propyl hexadecanoate, n-butyl hexadecanoate, n-pentyl hexadecanoate, n-hexyl hexadecanoate, n-heptyl hexadecanoate, n-octyl hexadecanoate, n-nonyl hexadecanoate, n-decyl hexadecanoate, n-dodecyl hexadecanoate, n-tetradecyl hexadecanoate, n-hexadecyl hexadecanoate, n-octadecyl hexadecanoate, n-eicosyl hexadecanoate, n-docosyl hexadecanoate, n-tetracosyl hexadecanoate, n-hexacosyl hexadecanoate, n-octacosyl hexadecanoate, n-triacontyl hexadecanoate, n-methyl octadecanoate, n-ethyl octadecanoate, n-propyl octadecanoate, n-butyl octadecanoate, n-pentyl octadecanoate, n-hexyl octadecanoate, n-heptyl octadecanoate, n-octyl octadecanoate, n-nonyl octadecanoate, n-decyl octadecanoate, n-dodecyl octadecanoate, n-tetradecyl octadecanoate, n-hexadecyl octadecanoate, n-octadecyl octadecanoate, n-eicosyl octadecanoate, n-docosyl octadecanoate, n-tetracosyl octadecanoate, n-hexacosyl octadecanoate, n-octacosyl octadecanoate, n-triacontyl octadecanoate, n-methyl eicosanoate, n-ethyl eicosanoate, n-propyl eicosanoate, n-butyl eicosanoate, n-pentyl eicosanoate, n-hexyl-eicosanoate, n-heptyl eicosanoate, n-octyl eicosanoate, n-nonyl eicosanoate, n-decyl eicosanoate, n-dodecyl eicosanoate, n-tetradecyl eicosanoate, n-hexadecyl eicosanoate, n-octadecyl eicosanoate, n-eicosyl eicosanoate, n-docosyl eicosanoate, n-tetracosyl eicosanoate, n-hexacosyl eicosanoate, n-octacosyl eicosanoate, n-triacontyl eicosanoate, n-methyl docosanoate, n-ethyl docosanoate, n-propyl docosanoate, n-butyl docosanoate, n-pentyl docosanoate, n-hexyl docosanoate, n-heptyl docosanoate, n-octyl docosanoate, n-nonyl docosanoate, n-decyl docosanoate, n-dodecyl docosanoate, n-tetradecyl docosanoate, n-hexadecyl docosanoate, n-octadecyl docosanoate, n-eicosyl docosanoate, n-docosyl docosanoate, n-tetracosyl docosanoate, n-hexacosyl docosanoate, n-octacosyl docosanoate, n-triacontyl docosanoate, n-methyl tetracosanoate, n-ethyl tetracosanoate, n-propyl tetracosanoate, n-butyl tetracosanoate, n-pentyl tetracosanoate, n-hexyl tetracosanoate, n-heptyl tetracosanoate, n-octyl tetracosanoate, n-nonyl tetracosanoate, n-decyl tetracosanoate, n-dodecyl tetracosanoate, n-tetradecyl tetracosanoate, n-hexadecyl tetracosanoate, n-octadecyl tetracosanoate, n-eicosyl tetracosanoate, n-docosyl tetracosanoate, n-tetracosyl tetracosanoate, n-hexacosyl tetracosanoate, n-octacosyl tetracosanoate, n-triacontyl tetracosanoate, n-methyl hexacosanoate, n-ethyl hexacosanoate, n-propyl hexacosanoate, n-butyl hexacosanoate, n-pentyl hexacosanoate, n-hexyl hexacosanoate, n-heptyl hexacosanoate, n-octyl hexacosanoate, n-nonyl hexacosanoate, n-decyl hexacosanoate, n-dodecyl hexacosanoate, n-tetradecyl hexacosanoate, n-hexadecyl hexacosanoate, n-octadecyl hexacosanoate, n-eicosyl hexacosanoate, n-docosyl hexacosanoate, n-tetracosyl hexacosanoate, n-hexacosyl hexacosanoate, n-octacosyl hexacosanoate, n-triacontyl hexacosanoate, n-methyl octacosanoate, n-ethyl octacosanoate, n-propyl octacosanoate, n-butyl octacosanoate, n-pentyl octacosanoate, n-hexyl octacosanoate, n-heptyl octacosanoate, n-octyl octacosanoate, n-nonyl octacosanoate, n-decyl octacosanoate, n-dodecyl octacosanoate, n-tetradecyl octacosanoate, n-hexadecyl octacosanoate, n-octadecyl octacosanoate, n-eicosyl octacosanoate, n-docosyl octacosanoate, n-tetracosyl octacosanoate, n-hexacosyl octacosanoate, n-octacosyl octacosanoate, n-triacontyl octacosanoate, n-methyl triacontanoate, n-ethyl triacontanoate, n-propyl triacontanoate, n-butyl triacontanoate, n-pentyl triacontanoate, n-hexyl triacontanoate, n-heptyl triacontanoate, n-octyl triacontanoate, n-nonyl triacontanoate, n-decyl triacontanoate, n-dodecyl triacontanoate, n-tetradecyl triacontanoate, n-hexadecyl triacontanoate, n-octadecyl triacontanoate, n-eicosyl triacontanoate, n-docosyl triacontanoate, n-tetracosyl triacontanoate, n-hexacosyl triacontanoate, n-octacosyl triacontanoate, and n-triacontyl triacontanoate.

Compounds in which a plurality of fatty acid esters is bonded together such as triacylglycerol are also applicable.

Linear saturated aliphatic ether, linear unsaturated aliphatic ether, branched saturated aliphatic ether, or branched unsaturated aliphatic ether can be preferably used for the aliphatic ether, and linear saturated aliphatic ether is particularly preferred. Examples of linear saturated aliphatic ether include n-tetradecyl methyl ether, n-tetradecyl ethyl ether, n-tetradecyl propyl ether, n-tetradecyl butyl ether, n-tetradecyl pentyl ether, n-tetradecyl hexyl ether, n-tetradecyl heptyl ether, n-tetradecyl octyl ether, n-tetradecyl nonyl ether, n-tetradecyl decyl ether, n-tetradecyl dodecyl ether, n-ditetradecyl ether, n-tetradecyl hexadecyl ether, n-tetradecyl octadecyl ether, n-tetradecyl eicosyl ether, n-tetradecyl docosyl ether, n-tetradecyl tetracosyl ether, n-tetradecyl hexacosyl ether, n-tetradecyl octacosyl ether, n-tetradecyl triacontyl ether, n-hexadecyl methyl ether, n-hexadecyl ethyl ether, n-hexadecyl propyl ether, n-hexadecyl butyl ether, n-hexadecyl pentyl ether, n-hexadecyl hexyl ether, n-hexadecyl heptyl ether, n-hexadecyl octyl ether, n-hexadecyl nonyl ether, n-hexadecyl decyl ether, n-hexadecyl dodecyl ether, n-dihexadecyl ether, n-hexadecyl octadecyl ether, n-hexadecyl eicosyl ether, n-hexadecyl docosyl ether, n-hexadecyl tetracosyl ether, n-hexadecyl hexacosyl ether, n-hexadecyl octacosyl ether, n-hexadecyl triacontyl ether, n-octadecyl methyl ether, n-octadecyl ethyl ether, n-octadecyl propyl ether, n-octadecyl butyl ether, n-octadecyl pentyl ether, n-octadecyl hexyl ether, n-octadecyl heptyl ether, n-octadecyl octyl ether, n-octadecyl nonyl ether, n-octadecyl decyl ether, n-octadecyl dodecyl ether, n-dioctadecyl ether, n-octadecyl eicosyl ether, n-octadecyl docosyl ether, n-octadecyl tetracosyl ether, n-octadecyl hexacosyl ether, n-octadecyl octacosyl ether, n-octadecyl triacontyl ether, n-eicosyl methyl ether, n-eicosyl ethyl ether, n-eicosyl propyl ether, n-eicosyl butyl ether, n-eicosyl pentyl ether, n-eicosyl hexyl ether, n-eicosyl heptyl ether, n-eicosyl octyl ether, n-eicosyl nonyl ether, n-eicosyl decyl ether, n-eicosyl dodecyl ether, n-dieicosyl ether, n-eicosyl docosyl ether, n-eicosyl tetracosyl ether, n-eicosyl hexacosyl ether, n-eicosyl octacosyl ether, n-eicosyl triacontyl ether, n-docosyl methyl ether, n-docosyl ethyl ether, n-docosyl propyl ether, n-docosyl butyl ether, n-docosyl pentyl ether, n-docosyl hexyl ether, n-docosyl heptyl ether, n-docosyl octyl ether, n-docosyl nonyl ether, n-docosyl decyl ether, n-docosyl dodecyl ether, n-didocosyl ether, n-docosyl tetracosyl ether, n-docosyl hexacosyl ether, n-docosyl octacosyl ether, n-docosyl triacontyl ether, n-tetracosyl methyl ether, n-tetracosyl ethyl ether, n-tetracosyl propyl ether, n-tetracosyl butyl ether, n-tetracosyl pentyl ether, n-tetracosyl hexyl ether, n-tetracosyl heptyl ether, n-tetracosyl octyl ether, n-tetracosyl nonyl ether, n-tetracosyl decyl ether, n-tetracosyl dodecyl ether, n-ditetracosyl ether, n-tetracosyl hexacosyl ether, n-tetracosyl octacosyl ether, n-tetracosyl triacontyl ether, n-hexacosyl methyl ether, n-hexacosyl ethyl ether, n-hexacosyl propyl ether, n-hexacosyl butyl ether, n-hexacosyl pentyl ether, n-hexacosyl hexyl ether, n-hexacosyl heptyl ether, n-hexacosyl octyl ether, n-hexacosyl nonyl ether, n-hexacosyl decyl ether, n-hexacosyl dodecyl ether, n-dihexacosyl ether, n-hexacosyl octacosyl ether, n-hexacosyl triacontyl ether, n-octacosyl methyl ether, n-octacosyl ethyl ether, n-octacosyl propyl ether, n-octacosyl butyl ether, n-octacosyl pentyl ether, n-octacosyl hexyl ether, n-octacosyl heptyl ether, n-octacosyl octyl ether, n-octacosyl nonyl ether, n-octacosyl decyl ether, n-octacosyl dodecyl ether, n-dioctacosyl ether, n-octacosyl triacontyl ether, n-triacontyl methyl ether, n-triacontyl ethyl ether, n-triacontyl propyl ether, n-triacontyl butyl ether, n-triacontyl pentyl ether, n-triacontyl hexyl ether, n-triacontyl heptyl ether, n-triacontyl octyl ether, n-triacontyl nonyl ether, n-triacontyl decyl ether, n-triacontyl dodecyl ether, and n-ditriacontyl ether.

Linear saturated aliphatic ketone, linear unsaturated aliphatic ketone, branched saturated aliphatic ketone, or branched unsaturated aliphatic ketone can be preferably used for the aliphatic ketone, and linear saturated aliphatic ketone is particularly preferred. Examples of linear saturated aliphatic ketone include n-tetradecyl methyl ketone, n-tetradecyl ethyl ketone, n-tetradecyl propyl ketone, n-tetradecyl butyl ketone, n-tetradecyl pentyl ketone, n-tetradecyl hexyl ketone, n-tetradecyl heptyl ketone, n-tetradecyl octyl ketone, n-tetradecyl nonyl ketone, n-tetradecyl decyl ketone, n-tetradecyl dodecyl ketone, n-ditetradecyl ketone, n-tetradecyl hexadecyl ketone, n-tetradecyl octadecyl ketone, n-tetradecyl eicosyl ketone, n-tetradecyl docosyl ketone, n-tetradecyl tetracosyl ketone, n-tetradecyl hexacosyl ketone, n-tetradecyl octacosyl ketone, n-tetradecyl triacontyl ketone, n-hexadecyl methyl ketone, n-hexadecyl ethyl ketone, n-hexadecyl propyl ketone, n-hexadecyl butyl ketone, n-hexadecyl pentyl ketone, n-hexadecyl hexyl ketone, n-hexadecyl heptyl ketone, n-hexadecyl octyl ketone, n-hexadecyl nonyl ketone, n-hexadecyl decyl ketone, n-hexadecyl dodecyl ketone, n-dihexadecyl ketone, n-hexadecyl octadecyl ketone, n-hexadecyl eicosyl ketone, n-hexadecyl docosyl ketone, n-hexadecyl tetracosyl ketone, n-hexadecyl hexacosyl ketone, n-hexadecyl octacosyl ketone, n-hexadecyl triacontyl ketone, n-octadecyl methyl ketone, n-octadecyl ethyl ketone, n-octadecyl propyl ketone, n-octadecyl butyl ketone, n-octadecyl pentyl ketone, n-octadecyl hexyl ketone, n-octadecyl heptyl ketone, n-octadecyl octyl ketone, n-octadecyl nonyl ketone, n-octadecyl decyl ketone, n-octadecyl dodecyl ketone, n-dioctadecyl ketone, n-octadecyl eicosyl ketone, n-octadecyl docosyl ketone, n-octadecyl tetracosyl ketone, n-octadecyl hexacosyl ketone, n-octadecyl octacosyl ketone, n-octadecyl triacontyl ketone, n-eicosyl methyl ketone, n-eicosyl ethyl ketone, n-eicosyl propyl ketone, n-eicosyl butyl ketone, n-eicosyl pentyl ketone, n-eicosyl hexyl ketone, n-eicosyl heptyl ketone, n-eicosyl octyl ketone, n-eicosyl nonyl ketone, n-eicosyl decyl ketone, n-eicosyl dodecyl ketone, n-dieicosyl ketone, n-eicosyl docosyl ketone, n-eicosyl tetracosyl ketone, n-eicosyl hexacosyl ketone, n-eicosyl octacosyl ketone, n-eicosyl triacontyl ketone, n-docosyl methyl ketone, n-docosyl ethyl ketone, n-docosyl propyl ketone, n-docosyl butyl ketone, n-docosyl pentyl ketone, n-docosyl hexyl ketone, n-docosyl heptyl ketone, n-docosyl octyl ketone, n-docosyl nonyl ketone, n-docosyl decyl ketone, n-docosyl dodecyl ketone, n-didocosyl ketone, n-docosyl tetracosyl ketone, n-docosyl hexacosyl ketone, n-docosyl octacosyl ketone, n-docosyl triacontyl ketone, n-tetracosyl methyl ketone, n-tetracosyl ethyl ketone, n-tetracosyl propyl ketone, n-tetracosyl butyl ketone, n-tetracosyl pentyl ketone, n-tetracosyl hexyl ketone, n-tetracosyl heptyl ketone, n-tetracosyl octyl ketone, n-tetracosyl nonyl ketone, n-tetracosyl decyl ketone, n-tetracosyl dodecyl ketone, n-ditetracosyl ketone, n-tetracosyl hexacosyl ketone, n-tetracosyl octacosyl ketone, n-tetracosyl triacontyl ketone, n-hexacosyl methyl ketone, n-hexacosyl ethyl ketone, n-hexacosyl propyl ketone, n-hexacosyl butyl ketone, n-hexacosyl pentyl ketone, n-hexacosyl hexyl ketone, n-hexacosyl heptyl ketone, n-hexacosyl octyl ketone, n-hexacosyl nonyl ketone, n-hexacosyl decyl ketone, n-hexacosyl dodecyl ketone, n-dihexacosyl ketone, n-hexacosyl octacosyl ketone, n-hexacosyl triacontyl ketone, n-octacosyl methyl ketone, n-octacosyl ethyl ketone, n-octacosyl propyl ketone, n-octacosyl butyl ketone, n-octacosyl pentyl ketone, n-octacosyl hexyl ketone, n-octacosyl heptyl ketone, n-octacosyl octyl ketone, n-octacosyl nonyl ketone, n-octacosyl decyl ketone, n-octacosyl dodecyl ketone, n-dioctacosyl ketone, n-octacosyl triacontyl ketone, n-triacontyl methyl ketone, n-triacontyl ethyl ketone, n-triacontyl propyl ketone, n-triacontyl butyl ketone, n-triacontyl pentyl ketone, n-triacontyl hexyl ketone, n-triacontyl heptyl ketone, n-triacontyl octyl ketone, n-triacontyl nonyl ketone, n-triacontyl decyl ketone, n-triacontyl dodecyl ketone, and n-ditriacontyl ketone.

Linear saturated aliphatic alcohol, linear unsaturated aliphatic alcohol, branched saturated aliphatic alcohol, or branched unsaturated aliphatic alcohol can be preferably used for the aliphatic alcohol, and linear saturated aliphatic alcohol is particularly preferred. Examples of linear saturated aliphatic alcohol include n-tetradecyl alcohol, n-pentadecyl alcohol, n-hexadecyl alcohol, n-heptadecyl alcohol, n-octadecyl alcohol, n-nonadecyl alcohol, n-eicosyl alcohol, n-heneicosyl alcohol, n-docosyl alcohol, n-tricosyl alcohol, n-tetracosyl alcohol, n-pentacosyl alcohol, n-hexacosyl alcohol, n-heptacosyl alcohol, n-octacosyl alcohol, n-nonacosyl alcohol, and n-triacontyl alcohol.

Linear saturated aliphatic amide, linear unsaturated aliphatic amide, branched saturated aliphatic amide, or branched unsaturated aliphatic amide can be preferably used for the aliphatic amide, and linear saturated aliphatic amide is particularly preferred. Examples of linear saturated aliphatic amide include n-tetradecylamine, n-pentadecylamine, n-hexadecylamine, n-heptadecylamine, n-octadecylamine, n-nonadecylamine, n-eicosylamine, n-heneicosylamine, n-docosylamine, n-tricosylamine, n-tetracosylamine, n-pentacosylamine, n-hexacosylamine, n-heptacosylamine, n-octacosylamine, n-nonacosylamine, and n-triacontylamine.

To more reliably prevent the low-molecular-weight compound (3) from bleeding, the low-molecular-weight compound (3) may be contained as a microcapsule encapsulating the low-molecular-weight compound (3) in the resin composition, or may be contained as a porous fine particle filled with the low-molecular-weight compound (3) in the resin composition.

The microcapsule containing the low-molecular-weight compound (3) is, in an embodiment, a microcapsule including the low-molecular-weight compound (3) therein and a coating film consisting of a resin as the outer shell. Examples of the material to form the coating film include thermoplastic resins and thermosetting resins. Specific examples of the resin as the material to form the coating film include melamine resin, acrylic resin, urethane resin, nylon resin, and olefinic resin. It is preferable that the material to form the coating film be a resin which is not broken in producing the resin composition containing a microcapsule containing the low-molecular-weight compound (3) and the polymer (1), or in producing a molded article comprising the resin composition. In an embodiment, the average primary particle diameter of the microcapsule (regarded as a primary particle) containing the low-molecular-weight compound (3) is preferably 10 to approximately 1000 µm, and more preferably 50 to 500 µm. In another embodiment, the microcapsule having an average primary particle diameter of 1 to 50 µm, more preferably of 2 to 10 µm, aggregates to form a secondary particle, and the average particle diameter of the secondary particle (average secondary particle diameter) is preferably 10 to approximately 1000 µm, and more preferably 50 to 500 µm. Examples of microcapsules containing paraffin, which is the low-molecular-weight compound (3), include Micronal 5001 X (produced by BASF SE) and Riken Resin PMCD-25SP (produced by MikiRiken Industrial Co., Ltd.).

The term "porous fine particle" as used herein refers to a fine particle consisting of inorganic substance or organic substance having pores penetrating from the surface to the inside. The porous fine particle may be a hollow fine particle having a void in the inside, or a fine particle having no void. Examples of porous fine particles consisting of inorganic substance include porous fine particles consisting of metal oxide such as silica and alumina, silicate such as calcium silicate and magnesium silicate, carbonate such as calcium carbonate and magnesium carbonate, or phosphate such as magnesium phosphate and apatite. Examples of porous fine particles consisting of organic substance include foams consisting of resin such as polyethylene and polyurethane, and expanded graphite. Porous fine particles consisting of inorganic substance are preferred for mechanical strength and chemical stability, and porous silica is more preferred because many fine particles of porous silica having homogeneous particle diameters are commercially available and readily accessible. The particle diameter of the porous fine particle is preferably 1 µm to 500 µm, and more preferably 5 µm to 300 µm.

In the case that the porous fine particle is a porous fine particle consisting of inorganic substance, the surface of the porous fine particle may be coated with a resin layer. Examples of the resin for the resin layer include reactive resins including melamine resin, acrylic resin, and urethane resin, and thermoplastic resins including nylon resin and polyolefin resin.

The porous fine particle filled with the low-molecular-weight compound (3) may be a porous fine particle such that a component to serve as a trapping substance for the low-molecular-weight compound (3) has been introduced into the porous fine particle and the low-molecular-weight compound (3) is trapped by the trapping substance. In the case that the low-molecular-weight compound (3) is paraffin and the porous fine particle is silica, for example, examples of the trapping substance include a trapping substance in which a reactive silyl group, which is a reactive group having affinity and reactivity for silica and being capable of bonding thereto, is bonding to substance having affinity for paraffin, for example, an oligomer or polymer such as polyisobutylene, polyoxypropylene, polyacrylate, polyether polyol, and polymethacrylate.

In one mode, the resin composition may further contain a polymer (2) different from the polymer (1) and having a melting peak temperature or glass transition temperature of 50° C. or higher and 180° C. or lower observed in differential scanning calorimetry, and, in this case, it is preferable that the content of the polymer (1) be 30 wt % or more and 99 wt % or less and the content of the polymer (2) be 1 wt % or more and 70 wt % or less with respect to 100 wt % of the total amount of the polymer (1) and the polymer (2), it is more preferable that the content of the polymer (1) be 40 wt % or more and 95 wt % or less and the content of the polymer (2) be 5 wt % or more and 60 wt % or less, it is even more preferable that the content of the polymer (1) be 50 wt % or more and 90 wt % or less and the content of the polymer (2) be 10 wt % or more and 50 wt % or less, and it is particularly preferable that the content of the polymer (1) be 60 wt % or more and 85 wt % or less and the content of the polymer (2) be 15 wt % or more and 40 wt % or less.

In one mode, it is preferable that the polymer (2) be a polymer different from polymers to be excluded as defined later and having a melting peak temperature or glass transition temperature of 50° C. or higher and 180° C. or lower observed in differential scanning calorimetry. In this case, it is preferable that the content of the polymer (1) be 30 wt % or more and 99 wt % or less and the content of the polymer (2) be 1 wt % or more and 70 wt % or less with respect to 100 wt % of the total amount of the polymer (1) and the polymer (2). Polymers to be excluded: polymers including the constitutional unit (B) represented by the following formula (1).

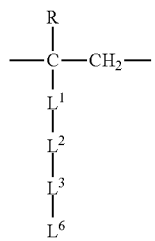

formula (1)

wherein
R represents a hydrogen atom or a methyl group;
$L^1$ represents a single bond, —CO—O—, —O—CO—, or —O—;
$L^2$ represents a single bond, —$CH_2$—, —$CH_2$—$CH_2$—, —$CH_2CH_2$—$CH_2$—, —$CH_2$—CH(OH)—$CH_2$—, or —$CH_2$—CH($CH_2$OH)—;
$L^3$ represents a single bond, —CO—O—, —O—CO—, —O—, —CO—NH—, —NH—CO—, —CO—NH—CO—, —NH—CO—NH—, —NH—, or —N($CH_3$)—;
$L^6$ represents an alkyl group having 14 or more and 30 or less carbon atoms; and the left side and right side of each of the horizontal chemical formulas of $L^1$, $L^2$, and $L^3$ correspond to the upper side of the formula (1) and the lower side of the formula (1), respectively.

The polymer (2) may consist of two or more polymers.

The melting peak temperature or glass transition temperature of the polymer (2) observed in differential scanning calorimetry (DSC) is in the range of 50° C. or higher and 180° C. or lower. The melting peak temperature of the polymer (2) is a temperature at a melting peak top determined through analysis of a melting curve acquired in differential scanning calorimetry described later by using a method in accordance with JIS K7121-1987, and a temperature at which heat of fusion absorbed is maximized.

The glass transition temperature of the polymer (2) is an intermediate glass transition temperature determined through analysis of a melting curve acquired in a method of differential scanning calorimetry described in the following by using a method in accordance with JIS K7121-1987.

[Differential Scanning Calorimetry]

In a differential scanning calorimeter under nitrogen atmosphere, an aluminum pan encapsulating approximately 5 mg of a sample therein is (1) retained at 200° C. for 5 minutes, and then (2) cooled from 200° C. to −50° C. at a rate of 5° C./min, and then (3) retained at −50° C. for 5 minutes, and then (4) warmed from −50° C. to 200° C. at a rate of 5° C./min. A differential scanning calorimetry curve acquired in the calorimetry of the process (4) is defined as a melting curve.

Examples of the polymer (2) having a melting peak temperature in the range of 50° C. or higher and 180° C. or lower include high-density polyethylene (HDPE), high-pressure low-density polyethylene (LDPE), ethylene-α-olefin copolymer, ethylene-vinyl acetate copolymer (EVA), and polypropylene (PP).

Examples of the polymer (2) having a glass transition temperature in the range of 50° C. or higher and 180° C. or lower include cyclic olefin polymer (COP), cyclic olefin copolymer (COC), polystyrene (PS), polyvinyl chloride (PVC), acrylonitrile-styrene copolymer (AS), acrylonitrile-butadiene-styrene copolymer (ABS), polymethyl methacrylate (PMMA), polyvinyl alcohol (PVA), polyethylene terephthalate (PET), polyacrylonitrile (PAN), polyamide 6 (PA6), polyamide 66 (PA66), polycarbonate (PC), polyphenylene sulfide (PPS), and polyether ether ketone (PEEK).

The ethylene-α-olefin copolymer as the polymer (2) is a copolymer including a constitutional unit derived from ethylene and a constitutional unit derived from α-olefin. Examples of the α-olefin include propylene, 1-butene, 1-pentene, 1-hexene, 1-heptene, 1-octene, 4-methyl-1-pentene, and 4-methyl-1-hexene, and the α-olefin may be one of these, or two or more thereof. The α-olefin is preferably an α-olefin having four to eight carbon atoms, and more preferably 1-butene, 1-hexene, or 1-octene.

The density of the high-density polyethylene, high-pressure low-density polyethylene, or ethylene-α-olefin copolymer is 860 kg/m³ or higher and 960 kg/m³ or lower.

Examples of the polypropylene as the polymer (2) include propylene homopolymer, propylene random copolymer described later, and propylene polymer material described later. The content of the constitutional unit derived from propylene in the polypropylene is more than 50 wt % and 100 wt % or less (assuming the total amount of the constitutional units constituting the polypropylene as 100 wt %). It is preferable that the melting peak temperature of the polypropylene be 100° C. or higher.

The propylene random copolymer is a random copolymer including a constitutional unit derived from propylene and at least one constitutional unit selected from the group consisting of a constitutional unit derived from ethylene and a constitutional unit derived from α-olefin. Examples of the propylene random copolymer include propylene-ethylene random copolymer, propylene-ethylene-α-olefin random copolymer, and propylene-α-olefin random copolymer. It is preferable that the α-olefin be an α-olefin having 4 to 10 carbon atoms, and examples of such α-olefin include linear α-olefin such as 1-butene, 1-pentene, 1-hexene, 1-octene, and 1-decene, and branched α-olefin such as 3-methyl-1- butene and 3-methyl-1-pentene. The α-olefin included in the propylene random copolymer may be one α-olefin or two or more α-olefins.

Examples of methods for producing the propylene homopolymer and propylene random copolymer include polymerization methods including a slurry polymerization method, solution polymerization method, bulk polymerization method, and gas phase polymerization method with a Ziegler-Natta catalyst or a complex catalyst such as a metallocene catalyst and a non-metallocene catalyst.

The propylene polymer material is a polymer material consisting of a propylene homopolymer component (I) and an ethylene copolymer component (II), wherein the ethylene copolymer component (II) includes: at least one constitutional unit selected from the group consisting of a constitutional unit derived from propylene and a constitutional unit derived from α-olefin having four or more carbon atoms; and a constitutional unit derived from ethylene.

Examples of the α-olefin having four or more carbon atoms in the ethylene copolymer component (II) include 1-butene, 1-pentene, 1-hexene, 1-heptene, 1-octene, 1-nonene, 1-decene, 1-undecene, 1-dodecene, 1-tridecene, 1-tetradecene, 1-pentadecene, 1-hexadecene, 1-heptadecene, 1-octadecene, 1-nonadecene, 1-eicosene, 3-methyl-1-butene, 3-methyl-1-pentene, 4-methyl-1-pentene, 2-ethyl-1-hexene, and 2,2,4-trimethyl-1-pentene. It is preferable that the α-olefin having four or more carbon atoms be an α-olefin having 4 or more and 20 or less carbon atoms, it is more preferable that the α-olefin having four or more carbon atoms be an α-olefin having 4 or more and 10 or less carbon atoms, and it is even more preferable that the α-olefin having four or more carbon atoms be 1-butene, 1-hexene, or 1-octene. The α-olefin having four or more carbon atoms included in the ethylene copolymer component (II) may be one α-olefin or two or more α-olefins.

Examples of the ethylene copolymer component (II) include propylene-ethylene copolymer, ethylene-1-butene copolymer, ethylene-1-hexene copolymer, ethylene-1-octene copolymer, propylene-ethylene-1-butene copolymer, propylene-ethylene-1-hexene copolymer, and propylene-ethylene-1-octene copolymer. The ethylene copolymer component (II) may be a random copolymer or a block copolymer.

The propylene polymer material can be produced through multistage polymerization with a polymerization catalyst. For example, the propylene polymer material can be produce in a manner such that the propylene homopolymer component (I) is produced in the former polymerization step, and the ethylene copolymer component (II) is produced in the latter polymerization step.

Examples of the polymerization catalyst for production of the propylene polymer material include the catalysts for production of the propylene homopolymer and the propylene random copolymer.

Examples of polymerization methods in the polymerization steps of production of the propylene polymer material include a bulk polymerization method, solution polymerization method, slurry polymerization method, and gas phase polymerization method. Examples of inert hydrocarbon solvent for a solution polymerization method and slurry polymerization method include propane, butane, isobutane, pentane, hexane, heptane, and octane. Two or more of these polymerization methods may be combined, and these polymerization methods may be in a batch mode or a continuous mode. It is preferable that the polymerization method in production of the propylene polymer material be continuous gas phase polymerization or bulk-gas phase polymerization in which bulk polymerization and gas phase polymerization are sequentially performed.

The polypropylene as the polymer (2) is preferably propylene homopolymer.

The resin composition according to the present invention is a resin composition comprising the polymer (1) and the low-molecular-weight compound (3), wherein the content of the low-molecular-weight compound (3) is 3 parts by weight or more and 1000 parts by weight or less with respect to 100 parts by weight of the total amount of polymer components contained in the resin composition except the low-molecular-weight compound (3) as a polymer.

It is preferable that the content of the polymer (1) contained in the resin composition be 40 wt % or more and 95 wt % or less with respect to 100 wt % of the total amount of polymer components contained in the resin composition, it is more preferable that the content of the polymer (1) contained in the resin composition be 50 wt % or more and 90 wt % or less with respect to 100 wt % of the total amount of polymer components contained in the resin composition, and it is even more preferable that the content of the polymer (1) contained in the resin composition be 60 wt % or more and 85 wt % or less with respect to 100 wt % of the total amount of polymer components contained in the resin composition.

It is preferable that the content of the polymer (1) contained in the resin composition be 20 wt % or more and 95 wt % or less with respect to 100 wt % of the total amount of the resin composition, it is more preferable that the content of the polymer (1) contained in the resin composition be 30 wt % or more and 90 wt % or less with respect to 100 wt % of the total amount of the resin composition, and it is even more preferable that the content of the polymer (1) contained in the resin composition be 40 wt % or more and 85 wt % or less with respect to 100 wt % of the total amount of the resin composition.

The "polymer components" in the resin composition do not include the low-molecular-weight compound (3) having polymer structure.

It is preferable for enthalpy of fusion and formability that the content of the low-molecular-weight compound (3) be 15 parts by weight or more with respect to 100 parts by weight of the total amount of polymer components contained in the resin composition, it is more preferable that the content of the low-molecular-weight compound (3) be 25 parts by weight or more, and it is even more preferably that the content of the low-molecular-weight compound (3) be 50 parts by weight or more. It is preferable for preventing the low-molecular-weight compound (3) from bleeding that the content of the low-molecular-weight compound (3) be 500 parts by weight or less with respect to 100 parts by weight of the total amount of polymer components contained in the resin composition, and it is more preferable that the content of the low-molecular-weight compound (3) be 200 parts by weight or less.

The polymer (1) may by two or more polymers, the low-molecular-weight compound (3) may be a mixture of two or more compounds, and the polymer (2) to be optionally contained may be two or more polymers.

For larger heat storage, the enthalpy of fusion (ΔH) of the resin composition observed in a temperature range of 0° C. or higher and lower than 60° C. in differential scanning calorimetry is preferably 50 J/g or more, more preferably 80 J/g or more, and even more preferably 100 J/g or more.

It is preferable for formability that the melt flow rate (MFR) of the resin composition according to the present invention as measured in accordance with JIS K7210 at a temperature of 230° C. with a load of 2.16 kgf be 1 g/10 min or higher, and it is more preferable that the MFR be 5 g/10 min or higher.

The melting peak temperature of the low-molecular-weight compound (3) observed in differential scanning calorimetry is in the range of 0° C. or higher and lower than 100° C., more preferably in the range of 10° C. or higher and lower than 40° C., and even more preferably in the range of 10° C. or higher and lower than 30° C. The melting peak temperature of the low-molecular-weight compound (3) is a temperature at a melting peak top determined through analysis of a melting curve acquired in differential scanning calorimetry described later by using a method in accordance with JIS K7121-1987, and a temperature at which heat of fusion absorbed is maximized.

It is preferable that the difference between the melting peak temperature (maximum crystal transition temperature) of the low-molecular-weight compound (3) contained in the resin composition and the melting peak temperature of the polymer (1) contained in the resin composition be in the range of 15° C. or smaller, it is more preferable that the difference be in the range of 10° C. or smaller, and it is even more preferable that the difference be in the range of 5° C. or smaller.

The offset temperature in the melting curve for the low-molecular-weight compound (3) contained in the resin composition is preferably 10° C. or higher and lower than 110° C., more preferably 20° C. or higher and lower than 50° C., and even more preferably 20° C. or higher and lower than 40° C. A substance with a larger difference between the offset temperature and the melting peak temperature in the melting curve is a substance which exhibits heat storage effect in a broader temperature range.

The melting peak temperature of the resin composition observed in differential scanning calorimetry is in the range of 10° C. or higher and lower than 60° C., more preferably in the range of 10° C. or higher and lower than 40° C., and even more preferably in the range of 10° C. or higher and lower than 30° C. The melting peak temperature of the resin composition is a temperature at a melting peak top determined through analysis of a melting curve acquired in differential scanning calorimetry described later by using a method in accordance with JIS K7121-1987, and a temperature at which heat of fusion absorbed is maximized.

The offset temperature in the melting curve for the resin composition is preferably 20° C. or higher and lower than 70° C., more preferably 20° C. or higher and lower than 50° C., and even more preferably 20° C. or higher and lower than 40° C. A composition with a larger difference between the offset temperature and the melting peak temperature in the melting curve is a composition which exhibits heat storage effect in a broader temperature range.

The gel fraction of the polymer (1) component contained in the resin composition according to the present invention is preferably 20 wt % or more, more preferably 40 wt % or more, even more preferably 60 wt % or more, and the most preferably 70 wt % or more. The gel fraction is based on the weight of the polymer (1) in the resin composition as 100 wt %.

The gel fraction is indicative of the degree of crosslinking of a crosslinked polymer, and a situation that the gel fraction of a resin composition is higher indicates that the resin composition has a higher degree of crosslinked structure and a more robust network structure is formed. If the gel fraction of a resin composition is higher, the resin composition has higher shape retention, and is less likely to deform.

The gel fraction is determined in the following manner. Approximately 500 mg (corresponding to the weight of a measurement sample) of the polymer (1) constituting the resin composition and an empty mesh basket fabricated from a metal mesh (mesh size: 400 mesh) are weighed. The mesh basket encapsulating the polymer and 50 mL of xylene (Grade of Guaranteed reagent produced by KANTO CHEMICAL CO., INC., or an equivalent product; mixture of o-, m-, and p-xylenes and ethylbenzene, total weight of o-, m-, and p-xylenes: 85 wt % or more) are introduced into a 100 mL test tube, and subjected to heating extraction at 110° C. for 6 hours. After the extraction, the mesh basket with an extraction residue is removed from the test tube, and dried under reduced pressure by using a vacuum dryer at 80° C. for 8 hours, and the mesh basket with an extraction residue after drying is weighed. The gel weight is calculated from the difference in weight between the mesh basket with an extraction residue after drying and the mesh basket when being empty. The gel fraction (wt %) is calculated on the basis of the following formula.

Gel fraction=(Gel weight/Weight of measurement sample)×100

The resin composition according to the present invention may contain an additive such as an inorganic filler, an organic filler, an antioxidant, a weatherproofing agent, a UV absorber, a thermal stabilizer, a light stabilizer, an antistatic, a crystal-nucleating agent, a pigment, an adsorbent, a metal chloride, hydrotalcite, an aluminate, a lubricant, and a silicone compound. The additive may be a porous fine particle having pores penetrating from the surface to the inside.

In the case that the resin composition according to the present invention contains an additive, the additive may be blended in advance in one or more raw materials to be used in production of a polymer to be contained in the resin composition (the polymer (1) or a polymer different therefrom (e.g., the polymer (2))), or blended after a polymer to be contained in the resin composition is produced. In the case that a polymer to be contained in the resin composition is produced and an additive is then blended, the additive can be blended while the polymer is melt-kneaded. For example, the additive can be blended in producing the resin composition with melt-kneading the polymer (1) and a polymer different therefrom (e.g., the polymer (2)) to be used as necessary. Alternatively, the additive can be blended while a polymer and the low-molecular-weight compound (3) are kneaded together.

It is preferable that the blend ratio of these additives be 0.001 parts by weight or more and 10 parts by weight or less with respect to 100 parts by weight of the resin composition of the present invention, it is more preferable that the blend ratio of the additive be 0.005 parts by weight or more and 5 parts by weight or less, and it is even more preferable that the blend ratio of the additive be 0.01 parts by weight or more and 1 part by weight or less.

Examples of inorganic fillers include talc, calcium carbonate, and calcined kaolin.

Examples of organic fillers include fibers, wood flours, and cellulose powders.

Examples of antioxidants include phenol-based antioxidants, sulfur-containing antioxidants, phosphorus-containing antioxidants, lactone antioxidants, and vitamin antioxidants.

Examples of UV absorbers include benzotriazole-based UV absorbers, tridiamine-based UV absorbers, anilide UV absorbers, and benzophenone-based UV absorbers.

Examples of light stabilizers include hindered amine light stabilizers and benzoate light stabilizers.

Examples of pigments include titanium dioxide and carbon black.

Examples of adsorbents include metal oxides such as zinc oxide and magnesium oxide.

Examples of metal chlorides include iron chloride and calcium chloride.

The resin composition according to the present invention and a molded article of the resin composition can be used as a heat storage material.

The heat storage material containing the resin composition according to the present invention is excellent in formability and shape retention, and thus the form is arbitrary, and examples thereof include the forms of a sphere, a cuboid (cube), a particle (bead), a cylinder (pellet), a powder, a bar (stick), a needle, a filament (fiber), a strand, a thread, a string, a code, a rope, a plate, a sheet, a membrane (film), a woven fabric, a nonwoven fabric, a box (capsule), and a foam, and any other three-dimensional form, and any form can be selected in accordance with the purpose of use.

The heat storage material in the form of a sphere, a cuboid (cube), a particle (bead), a cylinder (pellet), or a powder may be formed of a core-shell structure in which the resin composition according to the present invention is covered with a material different from the resin composition according to the present invention, or a core-shell structure in which a material different from the resin composition according to the present invention is covered with the resin composition according to the present invention. The material different from the resin composition according to the present invention is a polymer different from the resin composition according to the present invention, a metal, or an inorganic substance except metals.

The heat storage material in the form of a bar (stick), a needle, a filament (fiber), a strand, a thread, a string, a code, or a rope may be formed of a core-sheath structure in which the resin composition according to the present invention is covered with a material different from the resin composition according to the present invention, or a core-sheath structure in which a material different from the resin composition according to the present invention is covered with the resin composition according to the present invention.

The heat storage material in the form of a plate, a sheet, a membrane (film), a woven fabric, a nonwoven fabric, a box, or a capsule may be formed of a laminate structure in which both surfaces or one surface are/is covered with a material different from the resin composition according to the present invention, or a laminate structure in which both surfaces or one surface of a material different from the resin composition according to the present invention are/is covered with the resin composition according to the present invention.

The heat storage material in the form of a foam may form a core-shell structure, core-sheath structure, or laminate structure with the heat storage material having a form different from the form of a foam or a material different from the resin composition according to the present invention.

The heat storage material can be formed into any three-dimensional form, for example, by extrusion, injection molding, vacuum molding, blow molding, or rolling, and can be subjected to multilayer molding with a material different from the resin composition according to the present invention.

<Fiber Containing Resin Composition>

The fiber containing the resin composition according to the present invention can be obtained, for example, by adding the low-molecular-weight compound (3) to a fiber obtained by spinning the polymer (1), or by spinning a resin composition containing the polymer (1) and the low-molecular-weight compound (3) (hereinafter, occasionally referred to as "resin composition (A)").

The resin composition (A) may contain the polymer (1) as the only polymer component, or contain a polymer different from the polymer (1). In the case that the resin composition (A) contains a polymer different from the polymer (1), examples of the polymer include the polymer (2). In the case that the resin composition (A) contains the polymer (1) and the polymer (2), it is preferable that the content of the polymer (1) be 30 wt % or more and 99 wt % or less and the content of the polymer (2) be 1 wt % or more and 70 wt % or less, with respect to 100 wt % of the total amount of the polymer (1) and the polymer (2).

The fiber containing the resin composition according to the present invention can be obtained by adding the low-molecular-weight compound (3) to a fiber obtained by spinning a polymer component containing the polymer (1) and a polymer different from the polymer (1).

In the case that the resin composition (A) contains a polymer different from the polymer (1) and the polymer different from the polymer (1) is incompatible with the polymer (1), the phase consisting of the polymer (1) and the phase consisting of the polymer different from the polymer (1) form morphology of sea-island structure, cylinder structure, lamellar structure, co-continuous structure, etc.

The cross-sectional shape of the fiber containing the resin composition (A) may be a circular cross-section, an elliptic cross-section, an irregular cross-section such as a polygon or multilobal shape, or a hollow cross-section.

It is preferable for ease in fiber formation that the single yarn fineness of the fiber containing the resin composition (A) be 1 dtex or higher, and it is preferable for the flexibility of the fiber that the single yarn fineness of the fiber containing the resin composition (A) be 20 dtex or lower.

Examples of methods for producing the fiber containing the resin composition (A) include dry spinning, wet spinning, and melt spinning, and melt spinning is preferred. Common spinning uses chips containing a resin composition as a raw material, and consists of two steps, namely, a step of spinning and a step of drawing. Examples of spinning methods suitable for the production method for the fiber containing the resin composition (A) include: continuous polymerization/spinning, in which a resin composition is spun continuously after a step of producing a resin composition without forming chips from the resin composition; direct spinning/drawing (spin-drawing), in which a step of spinning and a step of drawing are performed in one step; high-speed spinning, in which a step of drawing is not needed; a POY-DTY method, in which partially-oriented yarn (POY) is obtained and draw textured yarn (DTY) is then obtained in a step of false-twisting; and spun-bonding. These methods are more rationalized methods than the common spinning.

The fiber containing the resin composition (A) can be a composite fiber. Composite fibers are fibers in which two or more fibers consisting of different components are bonded together in single yarn. Examples of the composite fiber include a core-sheath composite fiber, a laminated composite fiber, a splittable composite fiber, and a sea-island composite fiber.

It is preferable for ease in fiber formation that the single yarn fineness of the composite fiber containing the resin composition (A) be 1 dtex or higher, and it is preferable for the flexibility of the fiber that the single yarn fineness of the composite fiber containing the resin composition (A) be 20 dtex or lower, though the single yarn fineness is not limited thereto.

Examples of the structure of the core-sheath composite fiber include core-sheath structure in which the resin composition (A) is covered with a material different from the resin composition (A), and core-sheath structure in which a material different from the resin composition (A) is covered with the resin composition (A), and the structure of the core-sheath composite fiber is preferably core-sheath structure in which the resin composition (A) is covered with a material different from the resin composition (A). The material different from the resin composition (A) is preferably the polymer (2), more preferably polypropylene (PP), polyethylene terephthalate (PET), polytrimethylene terephthalate (PTT), polybutylene terephthalate (PBT), polyamide 6 (PA6), or polyamide 66 (PA66).

It is preferable that the composite fiber with core-sheath structure in which the resin composition (A) is covered with a material different from the resin composition (A) be a composite fiber with a core area fraction of 10% to 90% in a cross-section in the fiber radial direction. It is preferable for temperature control function that the core area fraction be 10% or higher, and it is preferable for fiber strength that the core area fraction be 90% or lower. In the case that the core contains polypropylene, it is preferable for dyeability of the entire of the fiber that the core area fraction be 20% to 50%.

The laminated composite fiber is generally crimped, for example, because of different shrinkage factors, and in the case that the composite fiber is crimped into a spiral, the resin composition (A) may be present in the inner side of the spiral, and the material different from the resin composition (A) may be present in the inner side of the spiral, and preferably the laminated composite fiber is such that the resin composition (A) is present in the inner side of the spiral. The material different from the resin composition (A) is preferably the polymer (2), and more preferably polypropylene (PP), polyethylene terephthalate (PET), polytrimethylene terephthalate (PTT), polybutylene terephthalate (PBT), polyamide 6 (PA6), or polyamide 66 (PA66).

The splittable composite fiber is split/opened through chemical treatment to provide an ultrafine fiber. In the case that the splittable composite fiber consists of a radial fiber at the center and a plurality of wedge-shaped fibers therearound, the resin composition (A) may constitute the radial fiber at the center, and the material different from the resin composition (A) may constitute the radial fiber at the center, and preferably the splittable composite fiber is such that the resin composition (A) constitutes the radial fiber at the center. The material different from the resin composition (A) is preferably the polymer (2), and more preferably polypropylene (PP), polyethylene terephthalate (PET), polytrimethylene terephthalate (PT), polybutylene terephthalate (PBT), polyamide 6 (PA6), or polyamide 66 (PA66).

The sea-island composite fiber is removed of the fiber of the sea part through chemical treatment to provide an ultrafine fiber consisting of a plurality of fibers of the island part. The resin composition (A) may constitute the fiber of the sea part, and the material different from the resin composition (A) may constitute the fiber of the sea part, and preferably the sea-island composite fiber is such that the resin composition (A) constitutes the fiber of the sea part. The material different from the resin composition (A) is preferably the polymer (2), and more preferably polypropylene (PP), polyethylene terephthalate (PET), polytrimethylene terephthalate (PTT), polybutylene terephthalate (PBT), polyamide 6 (PA6), or polyamide 66 (PA66).

Examples of the form of the fiber containing the resin composition (A) include a filament (multifilament, monofilament) and a short fiber (staple). A filament (multifilament, monofilament) may be directly used, or formed into false-twisted yarn through false-twisting, or formed into combined filament yarn through air-mingling. A short fiber (staple) may be directly used, or formed into spun yarn through spinning, or formed into blended yarn through mixed spinning. A filament and a short fiber may be combined into core-spun yarn, or formed into twisted yarn, twisted union yarn, or covered yarn through twisting.

The fiber containing the resin composition (A) may contain an additive such as an antioxidant, a pigment, a dye, an antibacterial agent, a deodorant, an antistatic agent, a flame retardant, an inert fine particle, a light-absorbing heat-generating material, a hygroscopic heat-generating material, and a far-infrared-emitting heat-generating material. The additive can be added during spinning or after spinning.

A light-absorbing heat-generating fiber containing the resin composition (A) and a light-absorbing heat-generating material is a fiber in which a light-absorbing heat-generating material such as zirconium carbide, which has high efficiency to absorb sunlight at specific wavelengths to convert it into thermal energy, is fixed in the inside or surface of the fiber. When the surface of a cloth consisting of the light-absorbing heat-generating fiber is irradiated with sunlight, the surface temperature of the cloth can be higher than that in the case of a cloth consisting of a fiber containing no light-absorbing heat-generating material.

A hygroscopic heat-generating fiber containing the resin composition (A) and a hygroscopic heat-generating material is a fiber which generates heat of adsorption on absorbing moisture and releases the moisture in a low-humidity environment, exerting an effect to control the temperature and humidity in the surrounding.

A far-infrared-emitting fiber containing the resin composition (A) and a far-infrared-emitting material is a fiber in which ceramic or the like having high far-infrared emissivity is fixed in the inside or surface of the fiber, exerting an effect to keep warm by virtue of far-infrared radiation.

The fabric or cloth consisting of the fiber containing the resin composition (A) may be any of woven fabrics, knitted fabrics, and nonwoven fabrics. Examples of the fabric construction include a plane weave, a twill weave, a sateen weave, and their variations, a dobby weave, and a Jacquard weave. Examples of the knitting construction include a weft knitted fabric, a warp knitted fabric, and their variations.

The weight, gauge, and so forth of the fabric or cloth consisting of the fiber containing the resin composition (A) are not limited.

The fabric or cloth consisting of the fiber containing the resin composition (A) may consist only of the fiber containing the resin composition (A), or be mix-woven or mix-knitted with an additional fiber for use. Examples of the additional fiber include: inorganic fibers such as carbon fibers, inorganic fibers, and metal fibers; purified fibers such as Lyocell; regenerated fibers such as rayon, cupra, and polynosic; semi-synthetic fibers such as acetates, triacetates, and promix; synthetic fibers such as acrylic, acrylic fibers, vinylon, vinylidene, polyvinyl chloride, polyethylene, polychlal, aramid, polybutylene terephthalate (PBT), polytrimethylene terephthalate (PTT), polyamide 66 (PA66), and urethane; natural fibers including plant fibers such as cotton, cellulosic fibers, *Cannabis* (flax, ramie, hemp, jute) and animal fibers such as wool, animal hair (e.g., Anogora, cashmere, mohair, alpaca, camel), and silk; and bird feathers such as down and feathers. It is preferable that the ratio of the fiber containing the resin composition (A) to be used is 20 wt % to 100 wt %, though the ratio is not limited thereto.

The nonwoven fabric consisting of the fiber containing the resin composition (A) may contain a heat-sealing binder fiber. It is preferable that the heat-sealing binder fiber be, for example, a core-sheath or laminated composite fiber consisting of the resin composition (A) and a material having a melting point different from that of the resin composition (A). The material having a melting point different from that of the resin composition (A) is preferably the polymer (2), and more preferably polypropylene (PP), polyethylene terephthalate (PET), polytrimethylene terephthalate (PTT), polybutylene terephthalate (PBT), polyamide 6 (PA6), or polyamide 66 (PA66).

In the case that the heat-sealing binder fiber is used, it is preferable that the content be 5 to 20 wt % to the entire of the fiber of the nonwoven fabric.

It is preferable for lightness, a soft texture, and fashionability of clothing that the weight and thickness of the nonwoven fabric consisting of the fiber containing the resin composition (A) be 100 g/m$^2$ or less and 5 mm or smaller, respectively, and it is more preferable that the weight be 60 g/m$^2$ or less.

A production method for the nonwoven fabric consisting of the fiber containing the resin composition (A) typically includes a step of forming a web and a step of bonding a web. Examples of the step of forming a web include a dry method, a wet method, spun-bonding, melt-blowing, and air-laying, and examples of the step of bonding a web include chemical bonding, thermobonding, needle-punching, and hydroentangling.

The fabric or cloth consisting of the fiber containing the resin composition (A) has temperature control function, which allows the fabric or cloth to have less weight and a smaller thickness, and thus provides a light, soft texture and does not deteriorate fashionability of clothing. In addition, the fabric or cloth consisting of the fiber containing the resin composition (A) contains a polymer-type latent heat storage material, and hence is superior in durability to fabrics or cloths consisting of a fiber containing a small molecule-type latent heat storage material encapsulated in a microcapsule.

<Foam Comprising Resin Composition>

The foam comprising the resin composition according to the present invention can be obtained by blowing a resin composition containing the polymer (1), the low-molecular-weight compound (3), and a blowing agent (hereinafter, occasionally referred to as "resin composition (B)").

Examples of the blowing agent include physical blowing agents and pyrolytic blowing agents. A plurality of blowing agents may be used in combination. The resin composition (B) may contain a polymer different from the polymer (1). In the case that the resin composition (B) contains a polymer different from the polymer (1), examples of the polymer include the polymer (2). In the case that the resin composition (B) contains the polymer (1) and the polymer (2), it is preferable that the content of the polymer (1) be 30 wt % or more and 99 wt % or less with respect to 100 wt % of the total amount of the polymer (1) and the polymer (2), and it is more preferable that the content of the polymer (2) be 1 wt % or more and 70 wt % or less.

Examples of physical blowing agents include air, oxygen, nitrogen, carbon dioxide, ethane, propane, n-butane, isobutane, n-pentane, n-hexane, isohexane, cyclohexane, heptane, ethylene, propylene, water, petroleum ether, methyl chloride, ethyl chloride, monochlorotrifluoromethane, dichlorodifluoromethane, and dichlorotetrafluoroethane, and preferred among them are carbon dioxide, nitrogen, n-butane, isobutane, n-pentane, and isopentane for economic efficiency and safety.

Examples of pyrolytic blowing agents include inorganic blowing agents such as sodium carbonate and organic blowing agents such as azodicarbonamide, N,N-dinitropentamethylenetetramine, p,p'-oxybisbenzenesulfonylbydrazide, and hydrazodicarbonamide, and preferred among them are azodicarbonamide, sodium hydrogen carbonate, and p,p'-oxybisbenzenesulfonylhydrazide for economic efficiency and safety, and a blowing agent containing azodicarbonamide or sodium hydrogen carbonate is more preferred because the blowing agent allows formation in a broad range of temperature and provides a foam with fine voids.

When a pyrolytic blowing agent is used, a pyrolytic blowing agent having a decomposition temperature of 120 to 240° C. is typically used. If a pyrolytic blowing agent having a decomposition temperature of higher than 200° C., it is preferable to use a blowing aid in combination to lower the decomposition temperature to 200° C. or lower. Examples of the blowing aid include metal oxides such as zinc oxide and lead oxide; metal carbonates such as zinc carbonate; metal chlorides such as zinc chloride; urea; metal soaps such as zinc stearate, lead stearate, dibasic lead stearate, zinc laurate, zinc 2-ethylhexonate, and dibasic lead phthalate; organotin compounds such as dibutyltin laurate and dibutyltin dimalate; and inorganic salts such as tribasic lead sulfate, dibasic lead phosphite, and basic lead sulfite.

A master batch composed of a pyrolytic blowing agent, a blowing aid, and a resin can be used as a pyrolytic blowing agent. It is preferable that the resin for the master batch be the resin composition according to the present invention or a polymer contained in the resin composition, though the type of the resin is not limited thereto. The total amount of the pyrolytic blowing agent and the blowing aid contained in the master batch is typically 5 to 90 wt % with respect to 100 wt % of the resin contained in the master batch.

It is preferable for obtaining a foam with finer voids that the resin composition (B) further contain a foam-nucleating agent. Examples of the foam-nucleating agent include talc, silica, mica, zeolite, calcium carbonate, calcium silicate, magnesium carbonate, aluminum hydroxide, barium sulfate, aluminosilicate, clay, quartz powder, and diatomaceous earth; organic polymer beads consisting of polymethyl methacrylate or polystyrene with a particle diameter of 100 μm or smaller; metal salts such as calcium stearate, magnesium stearate, zinc stearate, sodium benzoate, calcium benzoate, and aluminum benzoate; and metal oxides such as magnesium oxide and zinc oxide, and two or more of them may be combined together.

The amount of the blowing agent in the resin composition (B) is appropriately set in accordance with the type of the blowing agent for use and the expansion ratio of a foam to be produced, and typically 1 to 100 parts by weight with respect to 100 parts by weight of the weight of resin components contained in the resin composition (B).

The resin composition (B) may contain an additive, as necessary, such as a thermal stabilizer, a weatherproofing agent, a pigment, a filler, a lubricant, an antistatic, and a flame retardant.

It is preferable that the resin composition (B) be a resin composition obtained by melt-kneading the polymer (1), the low-molecular-weight compound (3), a blowing agent, and an additional component to be blended as necessary. Examples of methods for melt-kneading include a method of mixing the polymer (1), the low-molecular-weight compound (3), the blowing agent, and so forth together by using a kneading apparatus such as a tumbler blender and a Henschel mixer followed by additional melt-kneading by using a single-screw extruder, a multi-screw extruder, or the like, and a method of melt-kneading by using a kneading apparatus such as a kneader and a Banbury mixer.

A known method is used for production of a foam, and extrusion foam molding, injection foam molding, pressure foam molding, etc., are suitably used.

In the case that the foam of the present invention contains the crosslinked polymer (1), examples of methods for producing the foam include: a method including a step of producing a resin composition ($\alpha$) containing the crosslinked polymer (1) and a blowing agent by irradiating a resin composition containing the polymer ($\alpha$) and a blowing agent with ionizing radiation or by melt-kneading the crosslinked polymer (1) and a blowing agent, and a step of producing a foam by heating the resin composition ($\alpha$) (hereinafter, referred to as "method (A)"); and a method including a step of producing a resin composition ($\beta$) containing the crosslinked polymer (1) by pressurizing, with heating, a resin composition containing the polymer ($\alpha$), a blowing agent, and an organic peroxide or a resin composition containing the crosslinked polymer (1) and a blowing agent in a sealed mold, and a step of producing a foam from the resin composition ($\beta$) by opening the mold (hereinafter, referred to as "method (B)"). Raw materials of the resin composition ($\alpha$) or the resin composition ($\beta$) can include the polymer (2) and the low-molecular-weight compound (3).

<Method for Producing Foam: Production Method as Method (A)>

The method (A) will be specifically described in the following.

The method (A) includes a step of producing a resin composition ($\alpha$) containing the crosslinked polymer (1) and a blowing agent (hereinafter, referred to as "resin composition ($\alpha$) production step"), and a step of producing a foam by heating the resin composition ($\alpha$) (hereinafter, referred to as "foam production step"). Now, the steps will be described.

[Resin Composition ($\alpha$) Production Step]

In the case that a resin composition ($\alpha$) containing the crosslinked polymer (1) and a blowing agent is produced by irradiating a resin composition containing the polymer ($\alpha$) and a blowing agent with ionizing radiation in the resin composition ($\alpha$) production step, examples of the ionizing radiation for irradiation of the resin composition containing the polymer ($\alpha$) and a blowing agent include ionizing radiation used for production of the crosslinked polymer (1). Examples of the irradiation method and dose for the ionizing radiation include the method and dose described as the irradiation method and dose in production of the crosslinked polymer (1).

The resin composition containing the polymer ($\alpha$) and a blowing agent is irradiated with ionizing radiation typically after being formed into a desired shape at a temperature lower than the decomposition temperature of the blowing agent. Examples of sheet-forming methods include a sheet-forming method with a calendar roll, a sheet-forming method with a press forming machine, and a sheet-forming method by melt-extruding from a T-die or an annular die.

Melt-kneading of the crosslinked polymer (1) and a blowing agent is typically performed at a temperature lower than the decomposition temperature of the blowing agent.

[Foam Production Step]

A known production method for a resin foam can be applied as a production method for a foam by heating in the foam production step to produce a foam by heating the resin composition ($\alpha$), and methods allowing continuous heat blowing of the resin composition ($\alpha$) are preferred such as vertical hot air blowing, horizontal hot air blowing, and horizontal chemical blowing. The heating temperature is a temperature equal to or higher than the decomposition temperature of the blowing agent, and, in the case that the blowing agent is a pyrolytic blowing agent, the heating temperature is preferably a temperature higher than the decomposition temperature of the pyrolytic blowing agent by 5 to 50° C., more preferably a temperature higher than the decomposition temperature of the pyrolytic blowing agent by 10 to 40° C., and even more preferably a temperature higher than the decomposition temperature of the pyrolytic blowing agent by 15 to 30° C. The heating time can be appropriately selected in accordance with the type and amount of the blowing agent, and typically 3 to 5 minutes in heating in an oven.

<Method for Producing Foam: Production Method as Method (B)>

Next, the method (B) will be specifically described in the following.

The method (B) includes a step of producing a resin composition ($\beta$) containing the crosslinked polymer (1) by pressurizing, with heating, a resin composition containing the polymer (1), a blowing agent, and an organic peroxide or a resin composition containing the crosslinked polymer (1) and a foam in a sealed mold (hereinafter, referred to as "resin composition ($\beta$) production step"), and a step of producing a foam from the resin composition ($\beta$) by opening the mold (hereinafter, referred to as "foam production step"). Now, the steps will be described.

[Resin Composition ($\beta$) Production Step]

In the case that a resin composition ($\beta$) containing the crosslinked polymer (1) is produced by pressuring, with heating, a resin composition containing the polymer ($\alpha$), a blowing agent, and an organic peroxide in a sealed mold in the resin composition ($\beta$) production step, examples of the organic peroxide include the organic peroxides applicable to production of the crosslinked polymer of the present invention.

It is preferable that the resin composition to be pressurized with heating in a mold be a resin composition obtained by melt-kneading in advance a resin composition containing the polymer ($\alpha$), a blowing agent, and an organic peroxide or a resin composition containing the crosslinked polymer (1) and a foam at a temperature lower than the decomposition temperature of the blowing agent and lower than the 1-minute half-life temperature of the organic peroxide.

It is preferable that the temperature in heating the resin composition containing the polymer ($\alpha$), a blowing agent, and an organic peroxide be a temperature equal to or higher than the 1-minute half-life temperature of the organic peroxide and equal to or higher than the decomposition temperature of the blowing agent.

[Foam Production Step]

In the foam production step to produce a foam from the resin composition ($\beta$) with a mold opened, it is preferable that the mold be opened after cooling the mold to 40° C. or higher and 100° C. or lower. To increase the melt viscosity of the resin composition ($\beta$) and promote swelling in blowing, the temperature of the mold when being opened is preferably 40° C. or higher, and more preferably 50° C. or higher. To prevent outgassing in blowing, the temperature of the mold when being opened is preferably 90° C. or lower, and more preferably 80° C. or lower.

However, the temperature of the mold suitable for opening varies depending on the viscosity and melting point of the resin composition (β) and the size of a foam to be produced, and thus can be appropriately adjusted.

It is preferable for increasing the expansion ratio or strength of a foam containing the crosslinked polymer (1) that the resin composition containing the polymer (α) and a blowing agent further contain a crosslinking aid.

Examples of the crosslinking aid include the crosslinking aids used for production of the crosslinked polymer (1). It is preferable that the amount of the crosslinking aid contained in the resin composition containing the polymer (α), a blowing agent, and a crosslinking aid be 0.01 to 4.0 parts by weight with respect to 100 parts by weight of the weight of resin components contained in the resin composition, and it is more preferable that the amount of the crosslinking aid be 0.05 to 2.0 parts by weight.

The heat storage material containing the resin composition according to the present invention is excellent in heat storage performance, formability, shape retention, and moisture permeability, and hence can be suitably used as a product directly or indirectly requiring performance to keep warm/cold, or a member thereof.

Examples of products directly or indirectly requiring performance to keep warm/cold, or members thereof include building materials, furniture, interior goods, bedding, bathroom materials, vehicles, air conditioners, appliances, heat-insulating containers, clothes, daily necessities, agricultural materials, fermentation systems, thermoelectric conversion systems, and heat carrier media.

Examples of building materials include floor materials, wall materials, wallpapers, ceiling materials, roof materials, floor heating systems, tatamis (rush mats), doors, fusumas (paper sliding doors), amados (rain shutter doors), shojis (paper screen doors), windows, and window frames.

In use for a floor material, a wall material, a ceiling material, or a roof material, for example, a laminate including the heat storage material in the form of a plate, a sheet, or a foam, a thermal insulation material consisting of a material different from the resin composition according to the present invention, and an emission-insulating material consisting of a material different from the resin composition according to the present invention can be suitably used to more reliably keep indoor space temperature constant against the variation of exterior environment temperature.

Examples of the thermal insulation material include polystyrene foam, polyurethane foam, acrylic resin foam, phenolic resin foam, polyethylene resin foam, foamed rubber, glass wool, rock wool, foamed ceramics, vacuum thermal insulation materials, and composites thereof.

Examples of the emission-insulating layer include an aluminum sheet, an aluminum foil, an aluminum powder-containing coating material, a ceramic powder coating material, and a composite of them.

In use for a wall material, a ceiling material, or a roof material, for example, a laminate including the heat storage material in the form of a plate, a sheet, or a foam and a fireproof material consisting of a material different from the resin composition according to the present invention and being flame-retardant, quasi-incombustible, or incombustible can be suitably used to impart fireproof properties.

Examples of the fireproof material include concrete, gypsum, wood cement, calcium silicate, glass, metal, a foaming fireproof material, a flame-retardant material-containing material, and a composite of them.

In use for a member of a floor heating system, for example, a laminate including the heat storage material in the form of a plate, a sheet, or a foam, a thermal insulation material consisting of a material different from the resin composition according to the present invention, and a sensible heat storage material consisting of a material different from the resin composition according to the present invention can be suitably used to efficiently utilize heat generated from a heat-generating object such as a heating cable, a sheet heater, and a hot water pipe to retain room temperature.

Examples of the sensible heat storage layer include concrete, mortar, a concrete slab, and a composite of them.

In use for a member of a tatami, for example, a laminate including the heat storage material in the form of a plate, a sheet, or a foam, a thermal insulation material consisting of a material different from the resin composition according to the present invention, a tatami board consisting of a material different from the resin composition according to the present invention, and a tatami omote (tatami surface material) consisting of a material different from the resin composition according to the present invention can be suitably used to more reliably keep indoor space temperature constant against the variation of exterior environment temperature. In use for a tatami board material, a heat storage tatami board consisting of a mixture of the heat storage material and a wood fiber can be suitably used, and, in use for a tatami omote material, a heat storage tatami omote consisting of a heat storage fiber formed of a core-sheath structure of the heat storage material in the form of a filament (fiber) or a strand and a tatami omote material consisting of a material different from the resin composition according to the present invention can be suitably used.

In use for a member of a door, a member of a fusuma, or a member of an amado, for example, a laminate including the heat storage material in the form of a plate, a sheet, or a foam, a thermal insulation material consisting of a material different from the resin composition according to the present invention, and a surface material consisting of a material different from the resin composition according to the present invention can be suitably used to more reliably keep the temperature of a room partitioned by a door, a fusuma, or an amado constant.

In use for a member of a shoji, for example, a laminate including the heat storage material in the form of a foam or a nonwoven fabric, or a shoji paper sheet consisting of the heat storage material in the form of a foam or a nonwoven fabric and a material different from the resin composition according to the present invention can be suitably used to more reliably keep the temperature of a room partitioned by a shoji constant, and impart a certain degree of light transmittance.

In use for a member of a window, for example, a laminate consisting of the heat storage material in the form of a foam or a nonwoven fabric and glass, polycarbonate, or polymethyl methacrylate can be suitably used to more reliably keep indoor space temperature constant against the variation of exterior environment temperature, and impart a certain degree of light transmittance.

In use for a member of a window frame, for example, a laminate consisting of the heat storage material in the form of a plate, a sheet, or a foam and a metal window frame or a window frame made of a polymer different from the resin composition according to the present invention can be suitably used to more reliably keep indoor space temperature constant against the variation of exterior environment temperature and prevent dew condensation by lowering difference between room temperature and the temperature of a window frame.

Examples of furniture, interior goods, and bedding include partition boards, blinds, curtains, carpets, futons (bed quilts), and mattresses.

In use for a member of a partition board, for example, a laminate including the heat storage material in the form of a plate, a sheet, or a foam, a thermal insulation material consisting of a material different from the resin composition according to the present invention, and a surface material consisting of a material different from the resin composition according to the present invention can be suitably used to more reliably keep the temperature of a room partitioned by a partition board constant.

In use for a member of a blind, for example, a laminate including the heat storage material in the form of a plate or a sheet and an emission-insulating material consisting of a material different from the resin composition according to the present invention can be suitably used to more reliably keep indoor space temperature constant against the variation of exterior environment temperature and impart shading performance. In the case that the configuration of a slat of a blind consists of an emission-insulating surface and a heat storage surface as described above, the amount of solar heat flowing into a building can be controlled in accordance with the season and time of day in a manner such that the emission-insulating surface is positioned in the outer side for use in summer, and the heat storage surface is positioned in the outer side in the daytime and reversed to be positioned in the inner side in the nighttime for use in winter, and thus the power consumption of an air conditioner can be reduced.

In use for a curtain, a carpet, or a futon, for example, a heat storage woven fabric or heat storage nonwoven fabric consisting of a heat storage fiber formed of a core-sheath structure of the heat storage material in the form of a filament (fiber) or a strand and a fiber material consisting of a material different from the resin composition according to the present invention can be suitably used to impart an arbitrary handle and texture.

In use for a carpet, for example, a laminate including the heat storage material in the form of a plate, a sheet, or a foam and a woven fabric or nonwoven fabric consisting of a fiber consisting of a material different from the resin composition according to the present invention can be suitably used to impart an arbitrary handle and texture.

In using the laminate as a mattress, for example, the heat storage material in the form of a foam can be suitably used to impart softness.

Examples of bathroom materials include bathtub materials, bathtub lid materials, bathroom floor materials, bathroom wall materials, and bathroom ceiling materials.

In use for a bathtub material or a bathtub lid material, for example, a laminate including the heat storage material in the form of a plate, a sheet, or a foam, a thermal insulation material consisting of a material different from the resin composition according to the present invention, and a surface material consisting of a material different from the resin composition according to the present invention can be suitably used to more reliably keep water temperature in a bathtub constant against the variation of temperature in a bathroom.

In use for a bathroom floor material, a bathroom wall material, or a bathroom ceiling material, for example, a laminate including the heat storage material in the form of a plate, a sheet, or a foam, a thermal insulation material consisting of a material different from the resin composition according to the present invention, and an emission-insulating material consisting of a material different from the resin composition according to the present invention can be suitably used to more reliably keep bathroom temperature constant against the variation of exterior environment temperature.

Examples of members for vehicles include engine warming-up systems, gasoline evaporation loss-preventing devices (canisters), car air conditioners, interior materials, container materials for refrigerator vehicles, and container materials for heat-insulating vehicles.

Examples of members for air conditioners include heat storage materials for air-conditioning systems of framework heat storage type, materials for heat storage tanks in air-conditioning systems of water heat storage type, materials for heat storage tanks in air-conditioning systems of ice heat storage type, heating medium pipe materials or thermal insulation materials thereof, cooling medium pipe materials or thermal insulation materials thereof, and duct materials for heat-exchanging ventilation systems.

Examples of appliances include:

electronic devices such as televisions, Blu-ray recorders and/or players, DVD recorders and/or players, monitors, displays, projectors, rear-projection televisions, stereo components, boomboxes, digital cameras, digital video cameras, cellar phones, smartphones, laptop computers, desktop computers, tablet PCs, PDAs, printers, 3D printers, scanners, video game consoles, handheld game consoles, batteries for electronic devices, and transformers for electronic devices;

heating home appliances such as electric heaters, fan heaters, dehumidifiers, humidifiers, hot carpets, kotatsus (tables with a heater and a quilt), electric blankets, electric lap robes, electric foot warmers, heated toilet seats, warm water washing toilet seats, irons, trouser presses, futon dryers, clothes dryers, hair dryers, hair irons, heat massagers, heat therapy machines, dishwashers, dish dryers, and dry garbage disposals;

heating home appliance for food preparation such as IH cookers, electric griddles, microwave ovens, microwave and electric ovens, rice cookers, rice cake makers, bread machines, toasters, electric fermenters, hot water dispensers, electric kettles, and coffee makers;

home appliances for food preparation which generate frictional heat such as mixers and/or food processors, and rice polishers; and power-supplied heat-insulating warmers/coolers such as refrigerators/freezers, thermo-hygrostatic coolers, milk coolers, brown rice coolers, vegetable coolers, rice refrigerators, freezing/refrigerated showcases, prefabricated coolers, prefabricated refrigerated showcases, hot/cold catering vehicles, wine cellars, food vending machines, and heat-insulating cabinets for boxed lunches.

In use for a member of an electronic device, for example, the heat storage material in the form of a plate or a sheet can be suitably used to protect electronic parts constituting an electronic device from heat generated therefrom. Particularly in the case that a large amount of heat is locally generated such as cases with highly integrated electronic parts, for example, a laminate including the heat storage material in the form of a plate or a sheet and a high-thermal conductivity material consisting of a material different from the resin composition according to the present invention can be suitably used to allow the heat storage material in the form of a plate or a sheet to efficiently absorb heat generated from a heat-generating object.

Examples of the high-thermal conductivity material include carbon nanotubes, boron nitride nanotubes, graphite, copper, aluminum, boron nitride, aluminum nitride, aluminum oxide, magnesium oxide, and composites of them.

In use for a member of an electronic device to be used in contact with a human body, for example, a laminate consisting of the heat storage material in the form of a plate or a sheet and a housing material can be suitably used to inhibit heat generated from electronic parts constituting an electronic device from being conducted to a human body via a housing constituting the electronic device.

In use for a member of a heating home appliance, for example, the heat storage material in the form of a plate or a sheet can be suitably used to protect other parts constituting a heating home appliance from heat generated from a heating device constituting the heating home appliance. For example, a laminate including the heat storage material in the form of a plate, a sheet, or a foam and a thermal insulation material consisting of a material different from the resin composition according to the present invention can be suitably used to improve heat-insulating performance and reduce power consumption.

In use for a member of a heating home appliance for food preparation, for example, the heat storage material in the form of a plate or a sheet can be suitably used to protect other parts constituting a heating home appliance for food preparation from heat generated from a heating device constituting the heating home appliance for food preparation. For example, a laminate including the heat storage material in the form of a plate, a sheet, or a foam and a thermal insulation material consisting of a material different from the resin composition according to the present invention can be suitably used to improve heat-insulating performance and reduce power consumption.

In use for a member of a home appliance for food preparation which generates frictional heat, for example, a laminate including the heat storage material in the form of a plate or a sheet and a high-thermal conductivity material consisting of a material different from the resin composition according to the present invention can be suitably used to protect foods from frictional heat.

In use for a member of a power-supplied heat-insulating warmer/cooler, for example, a laminate including the heat storage material in the form of a plate, a sheet, or a foam, a thermal insulation material consisting of a material different from the resin composition according to the present invention, and an emission-insulating material consisting of a material different from the resin composition according to the present invention can be suitably used to more reliably keep inner temperature constant against the variation of exterior environment temperature.

Examples of heat-insulating warmer/cooler containers include heat-insulating warmer/cooler containers for transport and/or storage of specimens or organs, heat-insulating warmer/cooler containers for transport and/or storage of pharmaceuticals or chemicals, and heat-insulating warmer/cooler containers for transport and/or storage of foods.

In use for a member of a heat-insulating warmer/cooler container, for example, a laminate including the heat storage material in the form of a plate, a sheet, or a foam, a thermal insulation material consisting of a material different from the resin composition according to the present invention, and an emission-insulating material consisting of a material different from the resin composition according to the present invention can be suitably used to more reliably keep inner temperature constant against the variation of exterior environment temperature.

Examples of clothes include nightclothes, warm clothes, gloves, socks, sports wear, wet suits, dry suits, heat-resistant protective suits, and fire-resistant protective suits. In use for clothing, for example, a heat storage woven fabric or heat storage nonwoven fabric consisting of a heat storage fiber formed of a core-sheath structure of the heat storage material in the form of a filament (fiber) or a strand and a fiber material consisting of a material different from the resin composition according to the present invention can be suitably used to keep body temperature constant and impart an arbitrary texture.

In use for a wet suit or a dry suit, for example, a laminate including the heat storage material in the form of a plate or a sheet, the heat storage woven fabric or heat storage nonwoven fabric, and a thermal insulation material consisting of a material different from the resin composition according to the present invention can be suitably used to more reliably keep body temperature constant against cold water.

In use for a heat-resistant protective suit or a fire-resistant protective suit, for example, a laminate including the heat storage material in the form of a plate or a sheet, the heat storage woven fabric or heat storage nonwoven fabric, a thermal insulation material consisting of a material different from the resin composition according to the present invention, and an emission-insulating material consisting of a material different from the resin composition according to the present invention can be suitably used to more reliably keep body temperature constant against a heat-generating object or flame.

Examples of daily necessities include table wear, lunch boxes, water bottles, thermos bottles, body warmers, hot-water bottles, cold packs, and heat-insulating materials for heating with microwave ovens.

In use as a member of table wear or a lunch box, for example, the laminate may be used as a laminate including the heat storage material in the form of a plate, a sheet, or a foam, and a thermal insulation material consisting of a material different from the resin composition of the present invention to more reliably keep food temperature constant against exterior environment temperature.

Examples of fermentation systems to produce compost or biogas by fermenting organic wastes including business or household garbage, sludge, excreta from livestock, etc., and residues from stock raising and fisheries, or woods and grasses include biological garbage disposals, fermenters for compost production, and fermenters for biogas production. In use for the fermentation system, for example, a laminate including the heat storage material in the form of a plate, a sheet, or a foam and a thermal insulation material consisting of a material different from the resin composition according to the present invention can be suitably used to more reliably keep inner temperature at a temperature suitable for fermentation against the variation of exterior environment temperature.

Examples of agricultural materials include films for plastic greenhouses, agricultural heat-insulating sheets, hoses/pipes for irrigation, and agricultural electric heating mats for raising seedlings. In use for an agricultural material, for example, a laminate including the heat storage material in the form of a plate, a sheet, or a foam and a thermal insulation material consisting of a material different from the resin composition according to the present invention can be suitably used to more reliably keep temperature around agricultural crops at a temperature suitable for growth of agricultural crops against the variation of exterior environment temperature.

EXAMPLES

Hereinafter, the present invention will be described in more detail with reference to Examples and Comparative Examples.

[I] Proportions of the Number of Constitutional Unit (A) Derived from Ethylene, Constitutional Unit (B) Represented by Formula (1), and Constitutional Unit (C) Represented by Formula (2) Included in Polymer (1) (Unit: %)

Nuclear magnetic resonance spectra (hereinafter, abbreviated as "NMR spectra") were determined by using a nuclear magnetic resonance spectrometer (NMR) under the following measurement conditions.

<Carbon Nuclear Magnetic Resonance ($^{13}$C-NMR) Measurement Conditions>
Apparatus: AVANCE III 600HD produced by Bruker BioSpin GmbH
Measurement probe: 10 mm CryoProbe
Measurement solvent: mixed solvent of 1,2-dichlorobenzene/1,1,2,2-tetrachloroethane-$d_2$=85/15 (volume ratio)
Sample concentration: 100 mg/mL
Measurement temperature: 135° C.
Measurement method: proton decoupling method
Number of scans: 256
Pulse width: 45 degrees
Pulse repetition time: 4 seconds
Measurement reference: tetramethylsilane <Proportions of the Number of Constitutional Unit ($A_1$) Derived from Ethylene and Constitutional Unit ($C_1$) Derived from Methyl Acrylate Included in Ethylene-Methyl Acrylate Copolymer> (Unit: %)

Integrated values in the following ranges of $a_1$, $b_1$, $c_1$, $d_1$, and $e_1$ were determined from the $^{13}$C-NMR spectrum acquired for ethylene-methyl acrylate copolymer under the $^{13}$C-NMR measurement conditions, and the contents (proportions of the number) of three dyads (EE, EA, AA) were determined by using the following formulas, and the proportions of the number of the constitutional unit ($A_1$) derived from ethylene and the constitutional unit ($C_1$) derived from methyl acrylate were calculated from the contents. EE represents an ethylene-ethylene dyad, EA represents an ethylene-methyl acrylate dyad, and AA represents a methyl acrylate-methyl acrylate dyad.

$a_1$: 28.1-30.5 ppm
$b_1$: 31.9-32.6 ppm
$c_1$: 41.7 ppm
$d_1$: 43.1-44.2 ppm
$e_1$: 45.0-46.5 ppm $$EE = a_1/4 + b/2$$
$$EA = e_1$$
$$AA = c_1 + d_1$$

Proportion of the Number of Constitutional Unit ($A_1$)=100−Proportion of the Number of Constitutional Unit ($C_1$)

Proportion of the number of constitutional unit ($C_1$)
=100×(EA/2+AA)/(EE+EA+AA)

<Conversion Rate ($X_1$) of Constitutional Unit ($C_1$) Derived from Methyl Acrylate into Constitutional Unit ($B_2$) Represented by Formula (1)> (Unit: %)

In Examples in each of which ethylene-methyl acrylate copolymer and long-chain alkyl alcohol were reacted together to obtain a polymer consisting of the constitutional unit ($A_2$) derived from ethylene, the constitutional unit ($B_2$) represented by the formula (1), and the constitutional unit ($C_2$) derived from methyl acrylate, a $^{13}$C-NMR spectrum was determined for the polymer under the $^{13}$C-NMR measurement conditions and integrated values in the following ranges of $f_1$ and $g_1$ were determined therefrom. Subsequently, the conversion rate ($X_1$) of the constitutional unit ($C_1$) derived from methyl acrylate included in the ethylene-methyl acrylate copolymer into the constitutional unit ($B_2$) of the polymer (1) represented by formula (1) was calculated.

$f_1$: 50.6-51.1 ppm
$g_1$: 63.9-64.8 ppm

Conversion rate ($X_1$)=100×$g_1$/($f_1$+$g_1$)

<Proportions of the Number of Constitutional Unit ($A_2$) Derived from Ethylene, Constitutional Unit ($B_2$) Represented by Formula (1), and Constitutional Unit ($C_2$) Derived from Methyl Acrylate Included in Polymer (1)> (Unit: %)

The proportions of the number of the constitutional unit ($A_2$) derived from ethylene, the constitutional unit ($B_2$) represented by the formula (1), and the constitutional unit ($C_2$) derived from methyl acrylate included in the polymer (1) were calculated by using the following formulas.

Proportion of the number of constitutional unit ($A_2$) included in polymer (1)=proportion of the number of constitutional unit ($A_1$) included in ethylene-methyl acrylate copolymer Proportion of the number of constitutional unit ($B_2$) included in polymer (1)=(proportion of the number of constitutional unit ($C_1$) included in ethylene-methyl acrylate copolymer)×conversion rate ($X_1$)/100

Proportion of the number of constitutional unit ($C_2$) included in polymer (1)=(proportion of the number of constitutional unit ($C_1$) included in ethylene-methyl acrylate copolymer)−(proportion of the number of constitutional unit ($B_2$) included in polymer (1))

The thus-determined proportion of the number of the constitutional unit ($A_2$), proportion of the number of the constitutional unit ($B_2$), and proportion of the number of the constitutional unit ($C_2$) respectively correspond to the proportion of the number of the constitutional unit (A) derived from ethylene, proportion of the number of the constitutional unit (B) represented by the above formula (1), and proportion of the number of the constitutional unit (C) represented by the above formula (1) included in a polymer (unit: %).

<Proportions of the Number of Constitutional Unit ($A_3$) Derived from Ethylene and Constitutional Unit ($B_3$) Derived from α-Olefin Included in Ethylene-α-Olefin Copolymer> (Unit: %)

Integrated values in the following ranges of $a_3$, $b_3$, $c_3$, $d_3$, $d'_3$, $e_3$, $f_3$, $g_3$, $h_3$, $i_3$, and $j_3$ were determined from a $^{13}$C-NMR spectrum acquired for ethylene-α-olefin copolymer under the above $^{13}$C-NMR measurement conditions, and the contents (proportions of the number) of eight triads (EEE, EEL, LEE, LEL, ELE, ELL, LLE, LLL) were determined by using the following formulas, and the proportions of the number of the constitutional unit ($A_3$) derived from ethylene and the constitutional unit ($B_3$) derived from α-olefin were calculated from the contents. E and L in each triad represent ethylene and α-olefin, respectively.

$a_3$: 40.6-40.1 ppm
$b_3$: 38.5-38.0 ppm
$c_3$: 36.3-35.8 ppm
$d_3$: 35.8-34.3 ppm
$d'_3$: 34.0-33.7 ppm
$e_3$: 32.4-31.8 ppm
$f_3$: 31.4-29.1 ppm $g_3$: 27.8-26.5 ppm
$h_3$: 24.8-24.2 ppm
$i_3$: 23.0-22.5 ppm
$j_3$: 14.4-13.6 ppm $$EEE = f_3/2 - g_3/4 - (n_L - 7) \times (b_3 + c_3 + d'_3)/4$$

EEL+LEE=$g_3-e_3$
LEL=$h_3$
ELE=$b_3$
ELL+LLE=$c_3$ $$LLL = a_3 - c_3/2 \text{ (if } a_3 - c_3/2 < 0, \text{ then } LLL = d'_3)$$

The $n_L$ represents the average number of carbon atoms of α-olefin.

Proportion of the number of constitutional unit
($A_3$)=100×(EEE+EEL+LEE+LEL)/(EEE+EEL+LEE+LEL+ELE+ELL+LLE+LLL)

Proportion of the number of constitutional unit
($B_3$)=100−proportion of the number of constitutional unit ($A_3$)

[II] Content of Unreacted Compound Including Alkyl Group Having 14 or More and 30 or Less Carbon Atoms (Unit: Wt %)

A product obtained in "Production of polymer (1)" in each Example is a mixture of the polymer (1) and an unreacted compound including an alkyl group having 14 or more and 30 or less carbon atoms. The content of the unreacted compound including an alkyl group having 14 or more and 30 or less carbon atoms in the product was measured in the following manner using gas chromatography (GC). The content of the unreacted compound is a value with respect to 100 wt % of the total weight of the polymer (1) obtained and the unreacted compound.

[GC Measurement Conditions]
GC apparatus: Shimadzu GC2014
Column: DB-5MS (60 m, 0.25 mmφ, 1.0 μm)
Column temperature: a column retained at 40° C. was warmed to 300° C. at a rate of 10° C./min, and then retained at 300° C. for 40 minutes
Vaporizing chamber/detector temperature: 300° C./300° C. (FID)
Carrier gas: helium
Pressure: 220 kPa
Total flow rate: 17.0 mL/min
Column flow rate: 1.99 mL/min
Purge flow rate: 3.0 mL/min
Linear velocity: 31.8 cm/sec
Injection mode/sprit ratio: split injection/6:1
Amount of injection: 1 μL
Sample preparation method: 8 mg/mL (o-dichlorobenzene solution)

(1) Preparation of Calibration Curve
[Preparation of Solution]

Into a 9 mL vial, 5 mg of an authentic sample was weighed, and 100 mg of n-tridecane as an internal standard material was weighed therein, and 6 mL of o-dichlorobenzene as a solvent was further added and the sample was completely dissolved to afford a standard solution for preparation of a calibration curve. Two standard solutions were additionally prepared in the described manner except that the quantity of the authentic sample was changed to 25 mg or 50 mg.

[GC Measurement]

The standard solutions for preparation of a calibration curve were subjected to measurement under the GC measurement conditions described in the previous section to prepare a calibration curve in which the ordinate represented the GC area ratios between the authentic sample and the internal standard material and the abscissa represented the weight ratios between the authentic sample and the internal standard material, and the slope of the calibration curve, a, was determined.

(2) Measurement of Content of Measuring Object (Unreacted Compound Including Alkyl Group Having 14 or More and 30 or Less Carbon Atoms) in Sample (Product)

[Preparation of Solution]

Into a 9 mL vial, 50 mg of a sample and 100 mg of n-tridecane were weighed, and 6 mL of o-dichlorobenzene was further added and the sample was completely dissolved at 80° C. to afford a sample solution.

[GC Measurement]

The sample solution was subjected to measurement under the GC measurement conditions described in the previous section to determine the content of a measuring object in the sample, $P_S$, by using the following equation.

$P_S$: content of measuring object in sample (wt %)
$W_S$: weight of sample (mg)
$W_{IS}$: weight of internal standard material (IS) (mg)
$A_S$: peak area counts for measuring object
$A_{IS}$: peak area counts for internal standard material (IS)
a: slope of calibration curve for measuring object $$P_S = \frac{W_{IS} \times A_S}{W_S \times A_{IS} \times a} \times 100$$

[III] Method for Evaluating Physical Properties of Polymer (1) (1) Melting Peak Temperature, $T_m$ (Unit: ° C.), Enthalpy of Fusion Observed in Temperature Range of 10° C. or Higher and Lower than 60° C., ΔH (Unit: J/g)

In a differential scanning calorimeter (produced by TA Instruments, Inc., DSC Q100) under nitrogen atmosphere, an aluminum pan encapsulating approximately 5 mg of a sample therein was (1) retained at 150° C. for 5 minutes, and then (2) cooled from 150° C. to −50° C. at a rate of 5° C./min, and then (3) retained at −50° C. for 5 minutes, and then (4) warmed from −50° C. to 150° C. at a rate of 5° C./min. A differential scanning calorimetry curve acquired in the calorimetry of the process (4) was defined as a melting curve. The melting curve was analyzed by using a method in accordance with JIS K7121-1987 to determine the melting peak temperature, $T_m$.

A part in the temperature range of 10° C. or higher and lower than 60° C. in the melting curve was analyzed by using a method in accordance with JIS K7122-1987 to determine the enthalpy of fusion, ΔH (J/g).

(2) Ratio Defined as Formula (I), A (Unit: None)

Absolute molecular weight and intrinsic viscosity were measured for the polymer (1) and Polyethylene Standard Reference Material 1475a (produced by National Institute of Standards and Technology) through gel permeation chromatography (GPC) with an apparatus including a light scattering detector and a viscosity detector.

GPC apparatus: Tosoh HLC-8121 GPC/HT
Light scattering detector: Precision Detectors PD2040
Differential viscometer: Viscotek H502
GPC column: Tosoh GMHHR-H (S) HT×3
Concentration of sample solution: 2 mg/mL
Amount of injection: 0.3 mL
Measurement temperature: 155° C.
Dissolution conditions: 145° C. 2 hr Mobile phase: ortho-dichlorobenzene (with 0.5 mg/mL of BHT)
Flow rate in elution: 1 mL/min
Measurement time: approx. 1 hr

[GPC Apparatus]

An HLC-8121 GPC/HT from Tosoh Corporation was used as a GPC apparatus equipped with a differential refractometer (RI). A PD2040 from Precision Detectors, Inc., as a light scattering detector (LS), was connected to the GPC apparatus. The scattering angle used in detection of light scattering was 90° C. Further, an H502 from Viscotek Corp., as a viscosity detector (VISC), was connected to the GPC apparatus. The LS and the VISC were set in a column oven of the GPC apparatus, and the LS, the RI, and the VISC were connected together in the order presented. For calibration for the LS and the VISC and correction of delay volumes between detectors, the polystyrene standard reference material Polycal TDS-PS-N (weight-average molecular weight, Mw: 104349, polydispersity: 1.04) from Malvern Instruments Limited was used with a solution concentration of 1 mg/mL. Ortho-dichlorobenzene to which dibutylhydroxytoluene in a concentration of 0.5 mg/mL had been added as a stabilizer was used for the mobile phase and the solvent. The dissolution conditions for the sample were 145° C. and 2 hours. The flow rate was 1 mL/min. Three columns of Tosoh GMHHR-H (S) HT were connected together for use as a column. The temperatures of the column, the sample injection part, and the detectors were each 155° C. The concentration of the sample solution was 2 mg/mL. The amount of the sample solution to be injected (sample loop volume) was 0.3 mL. The refractive index increment for the NIST 1475a and the sample in ortho-dichlorobenzene (dn/dc) was −0.078 mL/g. The dn/dc for the polystyrene standard reference material was 0.079 mL/g. In determining absolute molecular weight and intrinsic viscosity ([1]) from data from the detectors, calculation was made by using the data processing software OmniSEC (version 4.7) from Malvern Instruments Limited with reference to the literature "Size Exclusion Chromatography, Springer (1999)". The refractive index increment is the change rate of the refractive index to concentration change.

$\alpha_1$ and $\alpha_0$ in the formula (I) were determined in the following manner and they were substituted into the formula (I) to determine A.

$$A = \alpha_1 / \alpha_0 \quad (I)$$

wherein $\alpha_1$ represents a value obtained by using a method including: plotting measurements in a manner such that logarithms of the absolute molecular weight of the polymer (1) were plotted on an abscissa and logarithms of the intrinsic viscosity of the polymer (1) were plotted on an ordinate; and performing least squares approximation for the logarithms of the absolute molecular weight and the logarithms of the intrinsic viscosity by using a formula (I-I) within a range of the logarithm of the weight-average molecular weight of the polymer (1) or more and the logarithm of the z-average molecular weight of the polymer (1) or less along the abscissa to derive the slope of the line representing the formula (I-I) as $\alpha_1$:

$$\log[\eta_1] = \alpha_1 \log M_1 + \log K_1 \quad (I\text{-}I)$$

wherein $[\eta_1]$ represents the intrinsic viscosity (unit: dl/g) of the polymer (1), $M_1$ represents the absolute molecular weight of the polymer (1), and $K_1$ represents a constant.

$\alpha_0$ represents a value obtained by using a method including: plotting measurements in a manner such that logarithms of the absolute molecular weight of the Polyethylene Standard Reference Material 1475a were plotted on an abscissa and logarithms of the intrinsic viscosity of the Polyethylene Standard Reference Material 1475a were plotted on an ordinate; and performing least squares approximation for the logarithms of the absolute molecular weight and the logarithms of the intrinsic viscosity by using a formula (I-II) within a range of the logarithm of the weight-average molecular weight of the Polyethylene Standard Reference Material 1475a or more and the logarithm of the z-average molecular weight of the Polyethylene Standard Reference Material 1475a or less along the abscissa to derive the slope of the line representing the formula (I-II) as $\alpha_0$:

$$\log[\eta_0] = \alpha_0 \log M_0 + \log K_0 \quad (I\text{-}II)$$

wherein $[\eta_0]$ represents the intrinsic viscosity (unit: dl/g) of the Polyethylene Standard Reference Material 1475a, $M_0$ represents the absolute molecular weight of the Polyethylene Standard Reference Material 1475a, and $K_0$ represents a constant.

[IV] Raw Materials

<Precursor Polymer Including Constitutional Unit (A) and Constitutional Unit (C)>

A-1: Ethylene-Methyl Acrylate Copolymer

Ethylene-methyl acrylate copolymer A-1 was produced as follows.

In an autoclave reactor, ethylene and methyl acrylate were copolymerized with tert-butyl peroxypivalate as a radical polymerization initiator at a reaction temperature of 195° C. under a reaction pressure of 160 MPa to afford ethylene-methyl acrylate copolymer A-1. The composition and MFR of the copolymer A-1 obtained were as follows. Proportion of the number of constitutional unit derived from ethylene: 87.1% (68.8 wt %), proportion of the number of constitutional unit derived from methyl acrylate: 12.9% (31.2 wt %), MFR (measured at 190° C., 21 N): 40.5 g/10 min.

<Compound Including Alkyl Group Having 14 or More and 30 or Less Carbon Atoms>

B-1: KALCOL 6098 (1-hexadecanol) [produced by Kao Corporation]

B-2: n-Octadecyl methacrylate [produced by Tokyo Chemical Industry Co., Ltd.]

<Catalyst>

C-1: Tetra(n-octadecyl) orthotitanate [produced by Matsumoto Fine Chemical Co. Ltd.]

<Polypropylene>

D-1: SUMITOMO NOBLEN D101 (propylene homopolymer) [produced by Sumitomo Chemical Company, Limited]

D-2: SUMITOMO NOBLEN Y501N (propylene homopolymer) [produced by Sumitomo Chemical Company, Limited]

D-3: SUMITOMO NOBLEN U501E1 (propylene homopolymer) [produced by Sumitomo Chemical Company, Limited]

<Organic Peroxide and Azo Compound>

E-1: Kayahexa AD-40C (mixture containing 2,5-dimethyl-2,5-di(tert-butylperoxy)hexane, calcium carbonate, and amorphous silicon dioxide) (1-minute half-life temperature: 180° C.) [produced by Kayaku Akzo Corporation]

E-2: YP-50S (mixture containing 2,5-dimethyl-2,5-di(tert-butylperoxy)hexyne-3, amorphous silicon dioxide, amorphous silica, and liquid paraffin) (1-minute half-life temperature: 180° C.)[produced by Kayaku Akzo Corporation]

E-3: Azobisisobutyronitrile (10-hour half-life temperature: 65° C.) [produced by Tokyo Chemical Industry Co., Ltd.]

<Crosslinking Aid>

F-1: Hi-Cross MS50 (mixture of trimethylolpropane trimethacrylate and amorphous silicon dioxide) [produced by Seiko Chemical Co., Ltd.]

<Antioxidant>

G-1: IRGANOX 1010 (pentaerythritol=tetrakis[3-(3',5'-di-tert-butyl-4'-hydroxyphenyl)propionate]) [produced by BASF SE]

<Processing Heat Stabilizer>

H-1: IRGAFOS 168 (tris(2,4-di-tert-butylphenyl)phosphite) [produced by BASF SE]

<Low-Molecular-Weight Compound (3)>

I-1: n-Octadecane (molecular weight: 254) [produced by Tokyo Chemical Industry Co., Ltd.]

I-2: Ethyl n-hexadecanoate (molecular weight: 284) [produced by Tokyo Chemical Industry Co., Ltd.]

I-3: KALCOL 4098 (n-tetradecanol (molecular weight: 214)) [produced by Kao Corporation]

I-4: Riken Resin PMCD-25SP (a microcapsule including n-hexadecane (molecular weight: 226), n-heptadecane (molecular weight: 240), and n-octadecane (molecular weight: 254) therein; and the outer shell of the microcapsule is composed of melamine resin) [MikiRiken Industrial Co., Ltd.]

I-5: Riken Resin LA-25-100 (containing silica as an inorganic component) [MikiRiken Industrial Co., Ltd.]

<Elastomer>

J-1: DYNARON 6200P (hydrogenated polybutadiene-ethylene butylene-hydrogenated polybutadiene block copolymer) [produced by JSR Corporation]

<Extruder>

Twin-Screw Extruder (1)
  Barrel diameter D=75 mm
  Screw effective length L/barrel diameter D=40
Twin-Screw Extruder (2)
  Barrel diameter D=15 mm
  Screw effective length L/barrel diameter D=45

Reference Example 1

(1) Production of Polymer Consisting of Constitutional Unit (A), Constitutional Unit (B), and Constitutional Unit (C) (Ethylene-n-Hexadecyl Acrylate-Methyl Acrylate Copolymer)

The inside of a reactor equipped with a stirrer was purged with nitrogen, and then A-1: 100 parts by weight, B-1: 73.6 parts by weight, and C-1: 0.8 parts by weight were added, and heated and stirred with the jacket temperature set at 140° C. under a reduced pressure of 1 kPa for 12 hours to afford a polymer (cf1) (ethylene-n-hexadecyl acrylate-methyl acrylate copolymer). Physical property values and evaluation results for the polymer (cf1) are shown in Table 1.

Reference Example 2

(1) Preparation of Crosslinked Resin Composition (Crosslinked Resin Composition Containing Ethylene-n-Hexadecyl Acrylate-Methyl Acrylate Copolymer and Polypropylene)

The polymer (cf1) obtained in Reference Example 1 (1): 80 parts by weight, D-1: 20 parts by weight, E-1: 1.0 part by weight, F-1: 1.0 part by weight, G-1: 0.1 parts by weight, and H-1: 0.1 parts by weight were extruded by using the twin-screw extruder (1) with a screw rotation frequency of 350 rpm, discharge rate of 200 kg/hr, first-half barrel temperature of 200° C., second-half barrel temperature of 220° C., and die temperature of 200° C. to prepare a crosslinked resin composition (cf2).

Reference Example 3

(1) Production of Polymer Consisting of Constitutional Unit (A) and Constitutional Unit (B) (Ethylene-α-Olefin Copolymer)

An autoclave having an inner volume of 5 L and equipped with a stirrer was dried under reduced pressure and the inside was then purged with nitrogen, into which 1.4 L of toluene solution containing 706 g of α-olefin C2024 (mixture of $C_{18}$, $C_{20}$, $C_{22}$, $C_{24}$, and $C_{26}$ olefins, produced by INEOS) was added, and then toluene was added thereto to a liquid volume of 3 L. The autoclave was warmed to 60° C., and ethylene was then added until the partial pressure reached 0.1 MPa to stabilize the inside of the system. Hexane solution of triisobutylaluminum (0.34 mol/L, 14.7 ml) was loaded therein. Subsequently, toluene solution of dimethylanilinium tetrakis(pentafluorophenyl)borate (1.0 mmol/13.4 mL) and toluene solution of diphenylmethylene (cyclopentadienyl)(fluorenyl)zirconium dichloride (0.2 mmol/L, 7.5 mL) were loaded therein to initiate polymerization, and ethylene gas was fed to keep the total pressure constant.

After the lapse of 3 hours, 2 ml of ethanol was added to terminate the polymerization. After the termination of the polymerization, the polymer-containing toluene solution was added into acetone to precipitate an ethylene-α-olefin copolymer (cf3), which was subjected to filtration, and the separated polymer (cf3) was further washed twice with acetone.

The resulting polymer (cf3) was vacuum-dried at 80° C. to afford 369 g of the polymer (cf3). Physical property values and evaluation results for the polymer (cf3) are shown in Table 1.

Reference Example 4

(1) Preparation of Crosslinked Resin Composition (Crosslinked Resin Composition Containing Ethylene-α-Olefin Copolymer and Polypropylene)

The polymer (cf3) obtained in Reference Example 3(1): 80 parts by weight, D-2: 20 parts by weight, E-2: 0.5 parts by weight, F-1: 0.75 parts by weight, and G-1: 0.1 parts by weight were extruded by using the twin-screw extruder (2) with a screw rotation frequency of 150 rpm, discharge rate of 1.8 kg/hr, first-half barrel temperature of 180° C., second-half barrel temperature of 220° C., and die temperature of 200° C. to prepare a crosslinked resin composition (cf4).

Reference Example 5

(1) Production of Polymer Consisting of Constitutional Unit (B) (n-Octadecyl Methacrylate Homopolymer)

A flask having an inner volume of 300 mL was dried under reduced pressure and the inside was then purged with nitrogen, into which B-2: 126.7 g was added, and heated and stirred with the inner temperature set at 50° C. to completely dissolve B-2. Subsequently, E-3: 307.3 mg was added thereto, and the resultant was heated and stirred with the inner temperature set at 80° C. for 80 minutes, and the product was washed with 1000 mL of ethanol and vacuum-dried at 120° C. to afford a polymer (cf5) (n-octadecyl methacrylate homopolymer). Physical property values and evaluation results for the polymer (cf5) are shown in Table 1.

Reference Example 6

(1) Preparation of Resin Composition (Resin Composition Containing n-Octadecyl Methacrylate Homopolymer and Polypropylene Homopolymer)

The resin composition (cf5) obtained in Reference Example 5(1): 80 parts by weight and D-3: 20 parts by weight were kneaded together by using a LABO PLASTO-MILL (produced by Toyo Seiki Seisaku-sho, Ltd., model: 65C150) under nitrogen atmosphere with a rotational frequency of 80 rpm and a chamber temperature of 200° C. for 5 minutes to prepare a resin composition (cf6).

TABLE 1

| Polymer | | Reference Example 1 | Reference Example | Reference Example 5 |
|---|---|---|---|---|
| Constitutional unit (A) | % | 87.1 | 84.6 | 0.0 |
| Constitutional unit (B) | % | 10.8 | 15.4 | 100.0 |
| Constitutional unit (C) | % | 2.1 | 0 | 0 |
| Content of unreacted compound including alkyl group having 14 or more and 30 or less carbon atoms | wt % | 0.7 | — | — |
| Melting peak temperature, $T_m$ | ° C. | 24 | 34 | 35 |
| Enthalpy of fusion, $\Delta H$ (10 to 60° C.) | J/g | 67 | 83 | 69 |
| Number-average molecular weight, Mn | g/mol | 37,000 | 214,000 | 209,000 |
| Weight-average molecular weight, Mw | g/mol | 216,000 | 387,000 | 2,154,000 |
| z-Average molecular weight, Mz | g/mol | 2,074,000 | 672,000 | 12,531,000 |
| Ratio defined by formula (I), A | | 0.62 | 0.94 | 0.58 |

[V] Method for Evaluating Physical Properties of Resin Composition (1) Measurement of Melt Viscosity, η (Unit: Pa·s), with Capillary Rheometer Measurement of melt viscosity, η (unit: Pa·s), was performed by using a capilograph (trade name "CAPILOGRAPH 1B", produced by Toyo Seiki Seisaku-sho Ltd.) under measurement conditions (1) or measurement conditions (2).

Measurement conditions (1): measurement of melt viscosity (Pa·s) at a shear rate of 121.6 (1/sec) with orifice length L/orifice diameter D=40 mm/1 mm, an inflow angle of 90°, and a measurement temperature of 80° C.

Measurement conditions (2): measurement of melt viscosity (Pa·s) at a shear rate of 121.6 (1/sec) with orifice length L/orifice diameter D=40 mm/1 mm, an inflow angle of 90°, and a measurement temperature of 160° C.

(2) Melting Peak Temperature, $T_m$ (Unit: ° C.), Offset Temperature, $T_a$ (Unit: ° C.), in Melting Curve, and Enthalpy of Fusion, $\Delta H$ (Unit: J/g), Observed in Temperature Range of 10° C. or Higher and Lower than 60° C.

In a differential scanning calorimeter (produced by TA Instruments, Inc., DSC Q100) under nitrogen atmosphere, an aluminum pan encapsulating approximately 5 mg of a sample therein (approximately 2 mg was encapsulated in a hermetic pan (sealed pan) for I-1, I-2, and I-3 because sample leakage during measurement was expected) was warmed and cooled under measurement conditions (1), measurement conditions (2), or measurement conditions (3).

Measurement conditions (1): (1) retaining at 150° C. for 5 minutes, and then (2) cooling from 150° C. to −80° C. at a rate of 5° C./min, and then (3) retaining at −80° C. for 10 minutes, and then (4) warming from −80° C. to around 150° C. at a rate of 5° C./min.

Measurement conditions (2): (1) retaining at 200° C. for 5 minutes, and then (2) cooling from 200° C. to −80° C. at a rate of 5° C./min, and then (3) retaining at −80° C. for 10 minutes, and then (4) warming from −80° C. to around 200° C. at a rate of 5° C./min.

Measurement conditions (3): (1) retaining at 150° C. for 5 minutes, and then (2) cooling from 150° C. to −50° C. at a rate of 5° C./min, and then (3) retaining at −50° C. for 5 minutes, and then (4) warming from −50° C. to around 150° C. at a rate of 5° C./min.

A differential scanning calorimetry curve acquired in the calorimetry of the process (4) under each of the measurement conditions (1), (2), and (3) was defined as a melting curve. The melting curves was analyzed in the temperature range of 10° C. or higher and lower than 60° C. by using a method in accordance with JIS K7121-1987 to determine the melting peak temperature, $T_m$ (unit: ° C.), the offset temperature (a point of intersection between a tangent at an inflection point in the melting end point side of the melting curve and a base line), $T_a$ (unit: ° C.), in the melting curve, and the difference between $T_a$ and $T_m$, $T_a$-$T_m$ (unit: ° C.). It can be said that a material with a larger difference between $T_a$ and $T_m$ is a material which exhibits heat storage effect in a broader temperature range. A part in the temperature range of 10° C. or higher and lower than 60° C. in the melting curve was analyzed by using a method in accordance with JIS K7122-1987 to determine the enthalpy of fusion, $\Delta H$ (unit: J/g).

A part in the temperature range of 10° C. or higher and lower than 60° C. in the melting curve was analyzed by using a method in accordance with JIS K7122-1987 to determine the enthalpy of fusion, $\Delta H$ (unit: J/g).

The physical properties were evaluated for raw materials used in Examples and Comparative Examples.

Polymer (cf1) in Reference Example 1

As described above, measurement of melt viscosity was performed for cf1 by using the capillary rheometer under the measurement conditions (1). In addition, measurement of melting peak temperature, $T_m$, difference between offset temperature, $T_a$, in a melting curve and melting peak temperature, $T_m$, $T_a$-$T_m$, and enthalpy of fusion, $\Delta H$, in the range of 10° C. or higher and lower than 60° C. during a melting process was performed for cf1 by using the differential scanning calorimeter under the measurement conditions (3). The results are shown in Table 2.

Crosslinked Resin Composition (cf2) in Reference Example 2

As described above, measurement of melt viscosity was performed for cf2 by using the capillary rheometer under the measurement conditions (2). In addition, measurement of melting peak temperature, $T_m$, difference between offset temperature, $T_a$, in a melting curve and melting peak temperature, $T_m$, $T_a-T_m$, and enthalpy of fusion, ΔH, in the range of 10° C. or higher and lower than 60° C. during a melting process was performed for cf2 by using the differential scanning calorimeter under the measurement conditions (2). The results are shown in Table 2.

Crosslinked Resin Composition (Cf4) in Reference Example 4

As described above, measurement of melt viscosity was performed for cf4 by using the capillary rheometer under the measurement conditions (2). In addition, measurement of melting peak temperature, $T_m$, difference between offset temperature, $T_a$, in a melting curve and melting peak temperature, $T_m$, $T_a-T_m$, and enthalpy of fusion, ΔH, in the range of 10° C. or higher and lower than 60° C. during a melting process was performed for cf4 by using the differential scanning calorimeter under the measurement conditions (2). The results are shown in Table 2.

Crosslinked Resin Composition (Cf6) in Reference Example 6

As described above, measurement of melt viscosity was performed for cf6 by using the capillary rheometer under the measurement conditions (2). In addition, measurement of melting peak temperature, $T_m$, difference between offset temperature, $T_a$, in a melting curve and melting peak temperature, $T_m$, $T_a-T_m$, and enthalpy of fusion, ΔH, in the range of 10° C. or higher and lower than 60° C. during a melting process was performed for cf6 by using the differential scanning calorimeter under the measurement conditions (2). The results are shown in Table 2.

[Elastomer (J-1)]

As described above, measurement of melt viscosity was performed for J-1 by using the capillary rheometer under the measurement conditions (2). In addition, measurement of melting peak temperature, $T_m$, difference between offset temperature, $T_a$, in a melting curve and melting peak temperature, $T_m$, $T_a-T_m$ and enthalpy of fusion, ΔH, in the range of 10° C. or higher and lower than 60° C. during a melting process was performed for cf2 by using the differential scanning calorimeter under the measurement conditions (2). The results are shown in Table 2.

[Low-Molecular-Weight Compound (I-1)]

As described above, measurement of melting peak temperature, $T_m$, difference between offset temperature, $T_T$, in a melting curve and melting peak temperature, $T_m$, $T_a-T_m$, and enthalpy of fusion, ΔH, in the range of 0° C. or higher and lower than 100° C. and enthalpy of fusion, ΔH, in the range of 10° C. or higher and lower than 60° C. during a melting process was performed for I-1 by using the differential scanning calorimeter under the measurement conditions (1). The enthalpy of fusion, ΔH, in the range of 0° C. or higher and lower than 100° C. was equal to the enthalpy of fusion, ΔH, in the range of 10° C. or higher and lower than 60° C. The results are shown in Table 3.

[Low-Molecular-Weight Compound (I-2)]

As described above, measurement of melting peak temperature, $T_m$, difference between offset temperature, $T_a$, in a melting curve and melting peak temperature, $T_m$, $T_a-T_m$, and enthalpy of fusion, ΔH, in the range of 0° C. or higher and lower than 100° C. and enthalpy of fusion, ΔH, in the range of 10° C. or higher and lower than 60° C. during a melting process was performed for I-2 by using the differential scanning calorimeter under the measurement conditions (1). The enthalpy of fusion, ΔH, in the range of 0° C. or higher and lower than 100° C. was equal to the enthalpy of fusion, ΔH, in the range of 10° C. or higher and lower than 60° C. The results are shown in Table 3.

[Low-Molecular-Weight Compound (I-3)]

As described above, measurement of melting peak temperature, $T_m$, difference between offset temperature, $T_a$, in a melting curve and melting peak temperature, $T_m$, $T_a-T_m$, and enthalpy of fusion, ΔH, in the range of 0° C. or higher and lower than 100° C. and enthalpy of fusion, ΔH, in the range of 10° C. or higher and lower than 60° C. during a melting process was performed for I-3 by using the differential scanning calorimeter under the measurement conditions (1). The enthalpy of fusion, ΔH, in the range of 0° C. or higher and lower than 100° C. was equal to the enthalpy of fusion, ΔH, in the range of 10° C. or higher and lower than 60° C. The results are shown in Table 3.

[Low-Molecular-Weight Compound (I-4)]

As described above, measurement of melting peak temperature, $T_m$, difference between offset temperature, $T_a$, in a melting curve and melting peak temperature, $T_m$, $T_a-T_m$, and enthalpy of fusion, ΔH, in the range of 0° C. or higher and lower than 100° C. and enthalpy of fusion, ΔH, in the range of 10° C. or higher and lower than 60° C. during a melting process was performed for I-4 by using the differential scanning calorimeter under the measurement conditions (1). The enthalpy of fusion, ΔH, in the range of 0° C. or higher and lower than 100° C. was equal to the enthalpy of fusion, ΔH, in the range of 10° C. or higher and lower than 60° C. The results are shown in Table 3.

[Low-Molecular-Weight Compound (I-5)]

As described above, measurement of melting peak temperature, $T_m$, difference between offset temperature, $T_a$, in a melting curve and melting peak temperature, $T_m$, $T_a-T_m$, and enthalpy of fusion, ΔH, in the range of 0° C. or higher and lower than 100° C. and enthalpy of fusion, ΔH, in the range of 10° C. or higher and lower than 60° C. during a melting process was performed for I-5 by using the differential scanning calorimeter under the measurement conditions (1). The enthalpy of fusion, ΔH, in the range of 0° C. or higher and lower than 100° C. was 74.2 J/g. The results are shown in Table 3.

TABLE 2

|  |  | Reference Example 1 | Reference Example 2 | Reference Example 4 | Reference Example 6 | J-1 |
|---|---|---|---|---|---|---|
| Melt viscosity, η | Pa · s | 252.1 | 653.8 | 865.7 | 14.0 | 1351 |
| Melting peak temperature, $T_m$ | ° C. | 24.2 | 23.2 | 33.9 | 35.6 | 96.2 |
| Offset temperature, $T_a$, in melting curve | ° C. | 47.7 | 47.9 | 38.0 | 37.2 | 102.9 |
| Difference between offset temperature, $T_a$, in melting curve and melting peak temperature, $T_m$, $T_a - T_m$ | ° C. | 23.5 | 24.7 | 4.1 | 1.6 | 6.7 |
| Enthalpy of fusion, ΔH (10 to 60° C.) | J/g | 67.0 | 50.3 | 60.8 | 56.0 | 3.8 |

TABLE 3

|  |  | I-1 | I-2 | I-3 | I-4 | I-5 |
|---|---|---|---|---|---|---|
| Melting peak temperature, $T_m$ | ° C. | 29.0 | 25.1 | 38.0 | 26.2 | 22.8 |
| Offset temperature, $T_a$, in melting curve | ° C. | 33.4 | 30.2 | 40.5 | 28.3 | 25.0 |
| Difference between offset temperature, $T_a$, in melting curve and melting peak temperature, $T_m$, $T_a - T_m$ | ° C. | 4.4 | 5.1 | 2.5 | 2.1 | 2.2 |
| Enthalpy of fusion, $\Delta H$ (10 to 60° C.) | J/g | 214.0 | 179.0 | 230.0 | 153.9 | 68.4 |

Resin Composition Containing n-Octadecane

Example 1

(1) Preparation of Resin Composition (ex1)

The crosslinked resin composition (cf1) obtained in Reference Example 1(1): 100 parts by weight and I-1: 100 parts by weight were kneaded together by using a LABO PLASTOMILL (produced by Toyo Seiki Seisaku-sho, Ltd., model: 65C150) under nitrogen atmosphere with a rotational frequency of 80 rpm and a chamber temperature of 70° C. for 5 minutes to afford a resin composition (ex1).

(2) Evaluation of Resin Composition (Ex1)

As described above, measurement of melt viscosity was performed for ex1 by using the capillary rheometer under the measurement conditions (1). In addition, measurement of melting peak temperature, $T_m$, difference between offset temperature, $T_a$, in a melting curve and melting peak temperature, $T_m$, $T_a - T_m$, and enthalpy of fusion, $\Delta H$, in the range of 10° C. or higher and lower than 60° C. during a melting process was performed for ex1 by using the differential scanning calorimeter under the measurement conditions (1). The results are shown in Table 4.

Example 2

(1) Preparation of Resin Composition (Ex2)

The crosslinked resin composition (cf2) obtained in Reference Example 2(1): 100 parts by weight and I-1: 100 parts by weight were kneaded together by using a LABO PLASTOMILL (produced by Toyo Seiki Seisaku-sho, Ltd., model: 65C150) under nitrogen atmosphere with a rotational frequency of 80 rpm and a chamber temperature of 180° C. for 5 minutes to afford a resin composition (ex2).

(2) Evaluation of Resin Composition (Ex2)

As described above, measurement of melt viscosity was performed for ex2 by using the capillary rheometer under the measurement conditions (2). In addition, measurement of melting peak temperature, $T_m$, difference between offset temperature, $T_a$, in a melting curve and melting peak temperature, $T_m$, $T_a - T_m$, and enthalpy of fusion, $\Delta H$, in the range of 10° C. or higher and lower than 60° C. during a melting process was performed for ex2 by using the differential scanning calorimeter under the measurement conditions (2). The results are shown in Table 4.

Example 3

(1) Preparation of Resin Composition (Ex3)

The crosslinked resin composition (cf4) obtained in Reference Example 4(1): 100 parts by weight and I-1: 100 parts by weight were kneaded together by using a LABO PLASTOMILL (produced by Toyo Seiki Seisaku-sho, Ltd., model: 65C150) under nitrogen atmosphere with a rotational frequency of 80 rpm and a chamber temperature of 180° C. for 5 minutes to afford a resin composition (ex3).

(2) Evaluation of Resin Composition (Ex3)

As described above, measurement of melt viscosity was performed for ex3 by using the capillary rheometer under the measurement conditions (2). In addition, measurement of melting peak temperature, $T_m$, difference between offset temperature, $T_a$, in a melting curve and melting peak temperature, $T_m$, $T_a - T_m$, and enthalpy of fusion, $\Delta H$, in the range of 10° C. or higher and lower than 60° C. during a melting process was performed for ex3 by using the differential scanning calorimeter under the measurement conditions (2). The results are shown in Table 4.

Comparative Example 1

(1) Preparation of Resin Composition (Ref1)

J-1: 100 parts by weight and I-1: 100 parts by weight were kneaded together by using a LABO PLASTOMILL (produced by Toyo Seiki Seisaku-sho, Ltd., model: 65C150) under nitrogen atmosphere with a rotational frequency of 80 rpm and a chamber temperature of 140° C. for 5 minutes to afford a resin composition (ref1).

(2) Evaluation of Resin Composition (Ref1)

As described above, measurement of melt viscosity was performed for ref1 by using the capillary rheometer under the measurement conditions (2). In addition, measurement of melting peak temperature, $T_m$, difference between offset temperature, $T_a$, in a melting curve and melting peak temperature, $T_m$, $T_a - T_m$, and enthalpy of fusion, $\Delta H$, in the range of 10° C. or higher and lower than 60° C. during a melting process was performed for ref1 by using the differential scanning calorimeter under the measurement conditions (1). The results are shown in Table 4.

TABLE 4

| Resin composition | | Example 1 | Example 2 | Example 3 | Comparative Example 1 |
|---|---|---|---|---|---|
| cf1 (Reference Example 1) | part by weight | 100 | — | — | — |
| cf2 (Reference Example 2) | part by weight | — | 100 | — | — |
| cf4 (Reference Example 4) | part by weight | — | — | 100 | — |
| cf6 (Reference Example 6) | part by weight | — | — | — | — |
| J-1 | part by weight | — | — | — | 100 |
| I-1 | part by weight | 100 | 100 | 100 | 100 |
| Melt viscosity, $\eta$ | Pa · s | 5.9 | 11.4 | 30.3 | 72.2 |
| Melting peak temperature, $T_m$ | ° C. | 24.0 | 24.0 | 30.2 | 25.1 |
| Offset temperature, $T_a$, in melting curve | ° C. | 36.0 | 34.5 | 34.1 | 28.1 |

TABLE 4-continued

| Resin composition | | Example 1 | Example 2 | Example 3 | Comparative Example 1 |
|---|---|---|---|---|---|
| Difference between offset temperature, $T_a$, in melting curve and melting peak temperature, $T_m$, $T_a - T_m$ | °C. | 12.0 | 10.5 | 3.9 | 3.0 |
| Enthalpy of fusion, $\Delta H$ (10 to 60° C.) | J/g | 109.2 | 89.5 | 109.1 | 86.1 |

Resin Composition Containing Ethyl n-Hexadecanoate

Example 4

(1) Preparation of Resin Composition (Ex4)

The crosslinked resin composition (cf2) obtained in Reference Example 2(1): 100 parts by weight and I-2: 100 parts by weight were kneaded together by using a LABO PLASTOMILL (produced by Toyo Seiki Seisaku-sho, Ltd., model: 65C150) under nitrogen atmosphere with a rotational frequency of 80 rpm and a chamber temperature of 180° C. for 5 minutes to afford a resin composition (ex4).

(2) Evaluation of Resin Composition (Ex4)

As described above, measurement of melt viscosity was performed for ex4 by using the capillary rheometer under the measurement conditions (2). In addition, measurement of melting peak temperature, $T_m$, difference between offset temperature, $T_a$, in a melting curve and melting peak temperature, $T_m$, $T_a$-$T_m$, and enthalpy of fusion, $\Delta H$, in the range of 10° C. or higher and lower than 60° C. during a melting process was performed for ex4 by using the differential scanning calorimeter under the measurement conditions (2). The results are shown in Table 5.

Comparative Example 2

(1) Preparation of Resin Composition (Ref2)

J-1: 100 parts by weight and I-2: 100 parts by weight were kneaded together by using a LABO PLASTOMILL (produced by Toyo Seiki Seisaku-sho, Ltd., model: 65C150) under nitrogen atmosphere with a rotational frequency of 80 rpm and a chamber temperature of 140° C. for 5 minutes to afford a resin composition (ref2).

(2) Evaluation of Resin Composition (Ref2)

As described above, measurement of melt viscosity was performed for ref2 by using the capillary rheometer under the measurement conditions (2). In addition, measurement of melting peak temperature, $T_m$, difference between offset temperature, $T_a$, in a melting curve and melting peak temperature, $T_m$, $T_a$-$T_m$, and enthalpy of fusion, $\Delta H$, in the range of 10° C. or higher and lower than 60° C. during a melting process was performed for ref2 by using the differential scanning calorimeter under the measurement conditions (1). The results are shown in Table 5.

TABLE 5

| Resin composition | | Example 4 | Comparative Example 2 |
|---|---|---|---|
| cf2 (Reference Example 2) | part by weight | 100 | — |
| J-1 | part by weight | — | 100 |
| I-2 | part by weight | 100 | 100 |
| Melt viscosity, η | Pa·s | 14.2 | 76.8 |
| Melting peak temperature, $T_m$ | °C. | 20.0 | 21.0 |
| Offset temperature, $T_a$, in melting curve | °C. | 34.2 | 23.7 |
| Difference between offset temperature, $T_a$, in melting curve and melting peak temperature, $T_m$, $T_a - T_m$ | °C. | 14.2 | 2.7 |
| Enthalpy of fusion, $\Delta H$ (10 to 60° C.) | J/g | 80.5 | 74.1 |

Resin composition containing n-tetradecanol

Example 5

(1) Preparation of Resin Composition (Ex5)

The crosslinked resin composition (cf2) obtained in Reference Example 2(1): 100 parts by weight and I-3: 100 parts by weight were kneaded together by using a LABO PLASTOMILL (produced by Toyo Seiki Seisaku-sho, Ltd., model: 65C150) under nitrogen atmosphere with a rotational frequency of 80 rpm and a chamber temperature of 180° C. for 5 minutes to afford a resin composition (ex5).

(2) Evaluation of Resin Composition (Ex5)

As described above, measurement of melt viscosity was performed for ex5 by using the capillary rheometer under the measurement conditions (2). In addition, measurement of melting peak temperature, $T_m$, difference between offset temperature, $T_a$, in a melting curve and melting peak temperature, $T_m$, $T_a$-$T_m$, and enthalpy of fusion, $\Delta H$, in the range of 10° C. or higher and lower than 60° C. during a melting process was performed for ex5 by using the differential scanning calorimeter under the measurement conditions (2). The results are shown in Table 6.

Example 6

(1) Preparation of Resin Composition (Ex6)

The crosslinked resin composition (cf4) obtained in Reference Example 4(1): 100 parts by weight and I-3: 100 parts by weight were kneaded together by using a LABO PLASTOMILL (produced by Toyo Seiki Seisaku-sho, Ltd., model: 65C150) under nitrogen atmosphere with a rotational frequency of 80 rpm and a chamber temperature of 180° C. for 5 minutes to afford a resin composition (ex6).

(2) Evaluation of Resin Composition (Ex6)

As described above, measurement of melt viscosity was performed for ex6 by using the capillary rheometer under the measurement conditions (2). In addition, measurement of melting peak temperature, $T_m$, difference between offset temperature, $T_a$, in a melting curve and melting peak temperature, $T_m$, $T_a$-$T_m$, and enthalpy of fusion, $\Delta H$, in the range of 10° C. or higher and lower than 60° C. during a melting process was performed for ex6 by using the differential scanning calorimeter under the measurement conditions (2). The results are shown in Table 6.

Example 7

(1) Preparation of Resin Composition (Ex7)

The crosslinked resin composition (cf6) obtained in Reference Example 6(1): 100 parts by weight and I-3: 100 parts by weight were kneaded together by using a LABO PLASTOMILL (produced by Toyo Seiki Seisaku-sho, Ltd., model: 65C150) under nitrogen atmosphere with a rotational frequency of 80 rpm and a chamber temperature of 180° C. for 5 minutes to afford a resin composition (ex7).

(2) Evaluation of Resin Composition (Ex7)

As described above, measurement of melt viscosity was performed for ex7 by using the capillary rheometer under the measurement conditions (2). In addition, measurement of melting peak temperature, $T_m$, difference between offset temperature, $T_a$, in a melting curve and melting peak temperature, $T_m$, $T_a$-$T_m$, and enthalpy of fusion, $\Delta H$, in the range of 10° C. or higher and lower than 60° C. during a melting process was performed for ex7 by using the differential scanning calorimeter under the measurement conditions (2). The results are shown in Table 6.

Comparative Example 3

(1) Preparation of Resin Composition (Ref3)

J-1: 100 parts by weight and I-3: 100 parts by weight were kneaded together by using a LABO PLASTOMILL (produced by Toyo Seiki Seisaku-sho, Ltd., model: 65C150) under nitrogen atmosphere with a rotational frequency of 80 rpm and a chamber temperature of 180° C. for 5 minutes to afford a resin composition (ref3).

(2) Evaluation of Resin Composition (Ref3)

As described above, measurement of melt viscosity was performed for ref3 by using the capillary rheometer under the measurement conditions (2). In addition, measurement of melting peak temperature, $T_m$, difference between offset temperature, $T_a$, in a melting curve and melting peak temperature, $T_m$, $T_a$-$T_m$, and enthalpy of fusion, $\Delta H$, in the range of 10° C. or higher and lower than 60° C. during a melting process was performed for ref3 by using the differential scanning calorimeter under the measurement conditions (1). The results are shown in Table 6.

Resin Composition Containing Riken Resin PMCD-25SP

Example 8

(1) Preparation of Resin Composition (Ex8)

The crosslinked resin composition (cf2) obtained in Reference Example 2(1): 100 parts by weight and I-4: 100 parts by weight were kneaded together by using a LABO PLASTOMILL (produced by Toyo Seiki Seisaku-sho, Ltd., model: 65C150) under nitrogen atmosphere with a rotational frequency of 80 rpm and a chamber temperature of 180° C. for 5 minutes to afford a resin composition (ex8).

(2) Evaluation of Resin Composition (Ex8)

As described above, measurement of melt viscosity was performed for ex8 by using the capillary rheometer under the measurement conditions (2). In addition, measurement of melting peak temperature, $T_m$, difference between offset temperature, $T_a$, in a melting curve and melting peak temperature, $T_m$, $T_a$-$T_m$, and enthalpy of fusion, $\Delta H$, in the range of 10° C. or higher and lower than 60° C. during a melting process was performed for ex8 by using the differential scanning calorimeter under the measurement conditions (2). The results are shown in Table 7.

Example 9

(1) Preparation of Resin Composition (Ex9)

The crosslinked resin composition (cf2) obtained in Reference Example 2(1): 100 parts by weight and I-4: 33 parts by weight were kneaded together by using a LABO PLASTOMILL (produced by Toyo Seiki Seisaku-sho, Ltd., model: 65C150) under nitrogen atmosphere with a rotational frequency of 80 rpm and a chamber temperature of 180° C. for 5 minutes to afford a resin composition (ex9).

(2) Evaluation of Resin Composition (Ex9)

As described above, measurement of melt viscosity was performed for ex9 by using the capillary rheometer under the measurement conditions (2). In addition, measurement of melting peak temperature, $T_m$, difference between offset temperature, $T_a$, in a melting curve and melting peak temperature, $T_m$, $T_a$-$T_m$, and enthalpy of fusion, $\Delta H$, in the

TABLE 6

| Resin composition | | Example 5 | Example 6 | Example 7 | Comparative Example 3 |
|---|---|---|---|---|---|
| cf2 (Reference Example 2) | part by weight | 100 | — | — | — |
| cf4 (Reference Example 4) | part by weight | — | 100 | — | — |
| cf6 (Reference Example 6) | part by weight | — | — | 100 | — |
| J-1 | part by weight | — | — | — | 100 |
| I-3 | part by weight | 100 | 100 | 100 | 100 |
| Melt viscosity, η | Pa · s | 12.1 | 30.0 | <5 | 75.2 |
| Melting peak temperature, $T_m$ | ° C. | 35.5 | 37.9 | 34.2 | 37.3 |
| Offset temperature, $T_a$, in melting curve | ° C. | 38.2 | 40.8 | 36.8 | 39.8 |
| Difference between offset temperature, $T_a$, in melting curve and melting peak temperature, $T_m$, $T_a$ - $T_m$ | ° C. | 2.7 | 2.9 | 2.6 | 2.1 |
| Enthalpy of fusion, ΔH (10 to 60° C.) | J/g | 131.1 | 124.3 | 118.7 | 88.0 | range of 10° C. or higher and lower than 60° C. during a melting process was performed for ex9 by using the differential scanning calorimeter under the measurement conditions (2). The results are shown in Table 7.

Example 10

(1) Preparation of Resin Composition (Ex10)

The crosslinked resin composition (cf2) obtained in Reference Example 2(1): 100 parts by weight and I-4: 18 parts by weight were kneaded together by using a LABO PLASTOMILL (produced by Toyo Seiki Seisaku-sho, Ltd., model: 65C150) under nitrogen atmosphere with a rotational frequency of 80 rpm and a chamber temperature of 180° C. for 5 minutes to afford a resin composition (ex10).

(2) Evaluation of Resin Composition (Ex10)

As described above, measurement of melt viscosity was performed for ex10 by using the capillary rheometer under the measurement conditions (2). In addition, measurement of melting peak temperature, $T_m$, difference between offset temperature, $T_a$, in a melting curve and melting peak temperature, $T_m$, $T_a$-$T_m$, and enthalpy of fusion, $\Delta H$, in the range of 10° C. or higher and lower than 60° C. during a melting process was performed for ex10 by using the differential scanning calorimeter under the measurement conditions (2). The results are shown in Table 7.

Example 11

(1) Preparation of Resin Composition (Ex11)

The crosslinked resin composition (cf4) obtained in Reference Example 4(1): 100 parts by weight and I-4: 100 parts by weight were kneaded together by using a LABO PLASTOMILL (produced by Toyo Seiki Seisaku-sho, Ltd., model: 65C150) under nitrogen atmosphere with a rotational frequency of 80 rpm and a chamber temperature of 180° C. for 5 minutes to afford a resin composition (ex11).

Example 12

(1) Preparation of Resin Composition (Ex12)

The crosslinked resin composition (cf4) obtained in Reference Example 4(1): 100 parts by weight and I-4: 33 parts by weight were kneaded together by using a LABO PLASTOMILL (produced by Toyo Seiki Seisaku-sho, Ltd., model: 65C150) under nitrogen atmosphere with a rotational frequency of 80 rpm and a chamber temperature of 180° C. for 5 minutes to afford a resin composition (ex12).

(2) Evaluation of Resin Composition (Ex12)

As described above, measurement of melt viscosity was performed for ex12 by using the capillary rheometer under the measurement conditions (2). In addition, measurement of melting peak temperature, $T_m$, difference between offset temperature, $T_a$ in a melting curve and melting peak temperature, $T_m$, $T_a$-$T_m$, and enthalpy of fusion, $\Delta H$, in the range of 10° C. or higher and lower than 60° C. during a melting process was performed for ex12 by using the differential scanning calorimeter under the measurement conditions (2). The results are shown in Table 7.

Comparative Example 4

(1) Preparation of Resin Composition (Ref4)

J-1: 100 parts by weight and I-4: 100 parts by weight were kneaded together by using a LABO PLASTOMILL (produced by Toyo Seiki Seisaku-sho, Ltd., model: 65C150) under nitrogen atmosphere with a rotational frequency of 80 rpm and a chamber temperature of 140° C. for 5 minutes to afford a resin composition (ref4).

(2) Evaluation of Resin Composition (Ref4)

As described above, measurement of melt viscosity was performed for ref4 by using the capillary rheometer under the measurement conditions (2). In addition, measurement of melting peak temperature, $T_m$, difference between offset temperature, $T_a$, in a melting curve and melting peak temperature, $T_m$, $T_a$-$T_m$, and enthalpy of fusion, $\Delta H$, in the range of 10° C. or higher and lower than 60° C. during a melting process was performed for ref4 by using the differential scanning calorimeter under the measurement conditions (2). The results are shown in Table 7.

TABLE 7

| Resin composition | | Example 8 | Example 9 | Example 10 | Example 11 | Example 12 | Comparative Example 4 |
|---|---|---|---|---|---|---|---|
| cf2 (Reference Example 2) | part by weight | 100 | 100 | 100 | — | — | — |
| cf4 (Reference Example 4) | part by weight | — | — | — | 100 | 100 | — |
| J-1 | part by weight | — | — | — | — | — | 100 |
| I-4 | part by weight | 100 | 33 | 18 | 100 | 33 | 100 |
| Melt viscosity, η | Pa · s | 83.4 | 253.3 | 348.2 | 149.4 | 327.1 | 533.2 |
| Melting peak temperature, $T_m$ | ° C. | 25.5 | 25.5 | 25.2 | 32.0 | 33.3 | 25.5 |
| Offset temperature, $T_a$, in melting curve | ° C. | 36.6 | 41.0 | 44.3 | 36.5 | 37.3 | 26.3 |
| Difference between offset temperature, $T_a$, in melting curve and melting peak temperature, $T_m$, $T_a$ − $T_m$ | ° C. | 11.1 | 15.5 | 19.1 | 4.5 | 4.0 | 0.8 |
| Enthalpy of fusion, ΔH (10 to 60° C.) | J/g | 86.7 | 65.4 | 57.3 | 95.0 | 77.2 | 58.2 |

(2) Evaluation of Resin Composition (Ex11)

As described above, measurement of melt viscosity was performed for ex11 by using the capillary rheometer under the measurement conditions (2). In addition, measurement of melting peak temperature, $T_m$, difference between offset temperature, $T_a$, in a melting curve and melting peak temperature, $T_m$, $T_a$-$T_m$, and enthalpy of fusion, $\Delta H$, in the range of 10° C. or higher and lower than 60° C. during a melting process was performed for ex11 by using the differential scanning calorimeter under the measurement conditions (2). The results are shown in Table 7.

Resin Composition Containing Riken Resin LA-25-100

Example 13

(1) Preparation of resin composition (ex13)

The crosslinked resin composition (cf2) obtained in Reference Example 2(1): 100 parts by weight and I-5: 100 parts by weight were kneaded together by using a LABO PLASTOMILL (produced by Toyo Seiki Seisaku-sho, Ltd., model: 65C150) under nitrogen atmosphere with a rotational frequency of 80 rpm and a chamber temperature of 180° C. for 5 minutes to afford a resin composition (ex13).

(2) Evaluation of Resin Composition (Ex13)

As described above, measurement of melt viscosity was performed for ex13 by using the capillary rheometer under the measurement conditions (2). In addition, measurement of melting peak temperature, $T_m$, difference between offset temperature, $T_a$, in a melting curve and melting peak temperature, $T_m$, $T_a$-$T_m$, and enthalpy of fusion, $\Delta H$, in the range of 10° C. or higher and lower than 60° C. during a melting process was performed for ex13 by using the differential scanning calorimeter under the measurement conditions (2). The results are shown in Table 8.

Comparative Example 5

(1) Preparation of Resin Composition (Ref5)

J-1: 100 parts by weight and I-5: 100 parts by weight were kneaded together by using a LABO PLASTOMILL (produced by Toyo Seiki Seisaku-sho, Ltd., model: 65C150) under nitrogen atmosphere with a rotational frequency of 80 rpm and a chamber temperature of 180° C. for 5 minutes to afford a resin composition (ref5).

(2) Evaluation of Resin Composition (Ref5)

As described above, measurement of melt viscosity was performed for ref5 by using the capillary rheometer under the measurement conditions (2). In addition, measurement of melting peak temperature, $T_m$, difference between offset temperature, $T_a$, in a melting curve and melting peak temperature, $T_m$, $T_a$-$T_m$, and enthalpy of fusion, $\Delta H$, in the range of 10° C. or higher and lower than 60° C. during a melting process was performed for ref5 by using the differential scanning calorimeter under the measurement conditions (1). The results are shown in Table 8.

TABLE 8

| Resin composition | | Example 13 | Comparative Example 5 |
|---|---|---|---|
| cf2 (Reference Example 2) | part by weight | 100 | — |
| J-1 | part by weight | — | 100 |
| I-5 | part by weight | 100 | 100 |
| Melt viscosity, η | Pa · s | 596.1 | 713.7 |
| Melting peak temperature, $T_m$ | ° C. | 21.4 | 18.6 |
| Offset temperature, $T_a$, in melting curve | ° C. | 36.2 | 22.6 |
| Difference between offset temperature, $T_a$, in melting curve and melting peak temperature, $T_m$, $T_a$ - $T_m$ | ° C. | 14.8 | 4.0 |
| Enthalpy of fusion, $\Delta H$ (10 to 60° C.) | J/g | 56.2 | 23.9 |

INDUSTRIAL APPLICABILITY

The resin composition according to the present invention has high heat storage, a broad temperature range allowing development of heat storage effect, and superior formability, and thus is suitable as a heat storage material.

The invention claimed is:

1. A resin composition comprising:
a polymer (1) whose enthalpy of fusion ($\Delta H$) observed within a temperature range of 10° C. or higher and lower than 60° C. in differential scanning calorimetry is 30 J/g or more; and
a low-molecular-weight compound (3) whose enthalpy of fusion ($\Delta H$) observed within a temperature range of 0° C. or higher and lower than 100° C. in differential scanning calorimetry is 30 J/g or more and whose molecular weight is 500 or lower, wherein
a difference between a melting peak temperature of the low-molecular-weight compound (3) and a melting peak temperature of the polymer (1) is 15° C. or less; and
a content of the low-molecular-weight compound (3) is 3 parts by weight or more and 1000 parts by weight or less, with respect to 100 parts by weight of the total amount of polymer components contained in the resin composition, wherein if the low-molecular-weight compound (3) is a polymer, the weight thereof is excluded from the weight of the total amount of polymer components contained in the resin composition;
wherein the polymer (1) is a polymer comprising a constitutional unit (B) represented by the following formula (1):

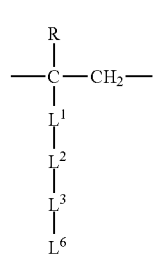

formula (1)

wherein
R represents a hydrogen atom or a methyl group;
$L^1$ represents —CO—O—, —O—CO—, or —O—;
$L^2$ represents a single bond, —CH$_2$—, —CH$_2$—CH$_2$—, —CH$_2$—CH$_2$—CH$_2$—, —CH$_2$—CH(OH)—CH$_2$—, or —CH$_2$—CH(CH$_2$OH)—;
$L^3$ represents a single bond, —CO—O—, —O—CO—, —O—, —CO—NH—, —NH—CO—, —CO—NH—CO—, —NH—CO—NH—, —NH—, or —N(CH$_3$)—,
$L^6$ represents an alkyl group having 14 or more and 30 or less carbons; and
a left side and a right side of each of the horizontal chemical formulas for describing chemical structures of $L^1$, $L^2$, and $L^3$ correspond to an upper side of the formula (1) and a lower side of the formula (1), respectively.

2. The resin composition according to claim 1, further comprising a polymer (2) whose melting peak temperature or glass transition temperature observed in differential scanning calorimetry is 50° C. or higher and 180° C. or lower, provided that the polymer (2) is different from the polymer (1), wherein
a content of the polymer (1) is 30 wt % or more and 99 wt % or less and a content of the polymer (2) is 1 wt % or more and 70 wt % or less, with respect to 100 wt % of the total amount of the polymer (1) and the polymer (2).

3. The resin composition according to claim 1, wherein the polymer (1) comprises a constitutional unit (A) derived from ethylene, the constitutional unit (B) represented by formula (1), and optionally at least one constitutional unit (C) selected from the group consisting of a constitutional unit represented by the following formula (2) and a constitutional unit represented by the following formula (3);
a proportion of the number of the constitutional unit (A) is 70% or more and 99% or less and a proportion of the number of the constitutional unit (B) and the constitutional unit (C) in total is 1% or more and 30% or less, with respect to 100% of the total number of the constitutional unit (A), the constitutional unit (B) and the constitutional unit (C); and a proportion of the number of the constitutional unit (B) is 1% or more and 100% or less and a proportion of the number of the constitutional unit (C) is 0% or more and 99% or less, with respect to 100% of the total number of the constitutional unit (B) and the constitutional unit (C):

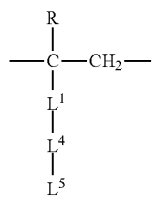

formula (2)

wherein

R represents a hydrogen atom or a methyl group;

$L^1$ represents a single bond, —CO—O—, —O—CO—, or —O—;

$L^4$ represents an alkylene group having one or more and eight or less carbon atoms;

$L^5$ represents a hydrogen atom, an epoxy group, —CH(OH)—CH$_2$OH, a carboxy group, a hydroxy group, an amino group, or an alkylamino group having one or more and four or less carbon atoms; and a left side and a right side of each of the horizontal chemical formulas for describing a chemical structure of $L^1$ correspond to an upper side of the formula (2) and a lower side of the formula (2), respectively,

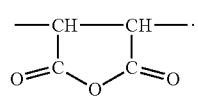

formula (3)

4. The resin composition according to claim 3, wherein the polymer (1) is a polymer comprising the constitutional unit (A) and the constitutional unit (B), and optionally comprising the constitutional unit (C), and a proportion of the number of the constitutional unit (A), the constitutional unit (B) and the constitutional unit (C) in total is 90% or more, with respect to 100% of the total number of all constitutional units contained in the polymer.

5. The resin composition according to claim 1, wherein a ratio defined for the polymer (1) as the following formula (I), A, is 0.95 or lower:

$$A = \alpha_1/\alpha_0 \quad (I)$$

wherein $\alpha_1$ represents a value obtained by using a method comprising: measuring an absolute molecular weight and an intrinsic viscosity of a polymer by using gel permeation chromatography with an apparatus equipped with a light scattering detector and a viscosity detector; plotting measurements in such a manner that logarithms of the absolute molecular weight are plotted on an abscissa and logarithms of the intrinsic viscosity are plotted on an ordinate; and performing least squares approximation for the logarithms of the absolute molecular weight and the logarithms of the intrinsic viscosity by using the formula (I-I) within a range of not less than a logarithm of a weight-average molecular weight of the polymer and not more than a logarithm of a z-average molecular weight of the polymer along the abscissa to derive a slope of a line representing the formula (I-I) as $\alpha_1$:

$$\log[\eta_1] = \alpha_1 \log M_1 + \log K_1 \quad (I\text{-}I)$$

wherein $[\eta_1]$ represents an intrinsic viscosity (unit: dl/g) of the polymer, $M_1$ represents an absolute molecular weight of the polymer, and $K_1$ represents a constant; and $\alpha_0$ represents a value obtained by using a method comprising: measuring an absolute molecular weight and an intrinsic viscosity of Polyethylene Standard Reference Material 1475a produced by National Institute of Standards and Technology by using gel permeation chromatography with an apparatus equipped with a light scattering detector and a viscosity detector; plotting measurements in such a manner that logarithms of the absolute molecular weight are plotted on an abscissa and logarithms of the intrinsic viscosity are plotted on an ordinate; and performing least squares approximation for the logarithms of the absolute molecular weight and the logarithms of the intrinsic viscosity by using the formula (I-II) within a range of not less than a logarithm of a weight-average molecular weight of the Polyethylene Standard Reference Material 1475a and not more than a logarithm of a z-average molecular weight of the Polyethylene Standard Reference Material 1475a along the abscissa to derive a slope of a line representing the formula (I-II) as $\alpha_0$:

$$\log[\eta_0] = \alpha_0 \log M_0 + \log K_0 \quad (I\text{-}II)$$

wherein $[\eta_0]$ represents an intrinsic viscosity (unit: dl/g) of the Polyethylene Standard Reference Material 1475a, $M_0$ represents an absolute molecular weight of the Polyethylene Standard Reference Material 1475a, and $K_0$ represents a constant, provided that in the measurement of the absolute molecular weight and the intrinsic viscosity of each of the polymer and the Polyethylene Standard Reference Material 1475a by using gel permeation chromatography analysis, a mobile phase is ortho-dichlorobenzene and the measurement temperature is 155° C.

6. The resin composition according to claim 1, wherein the polymer (1) is a crosslinked polymer.

7. The resin composition according to claim 6, wherein a gel fraction of the crosslinked polymer is 20 wt % or more.

8. The resin composition according to claim 1, wherein the low-molecular-weight compound (3) contains an alkyl group having 14 or more and 30 or less carbon atoms.

9. A molded article comprising the resin composition according to claim 1.

10. A foam comprising the resin composition according to claim 1.

11. The resin composition according to claim 1, wherein the low-molecular-weight compound (3) is not a polymer.

* * * * *